US012720821B2

(12) United States Patent
Wang et al.

(10) Patent No.: US 12,720,821 B2
(45) Date of Patent: Aug. 25, 2026

(54) SEMICONDUCTOR DEVICE AND MANUFACTURING METHOD THEREOF

(71) Applicant: Taiwan Semiconductor Manufacturing Company, Ltd., Hsinchu (TW)

(72) Inventors: Pei-Yu Wang, Hsinchu City (TW); Wang-Chun Huang, Kaohsiung City (TW); Cheng-Ting Chung, Hsinchu City (TW); Yi-Bo Liao, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 550 days.

(21) Appl. No.: 18/322,611

(22) Filed: May 24, 2023

(65) Prior Publication Data

US 2024/0395861 A1 Nov. 28, 2024

(51) Int. Cl.

| | |
|---|---|
| ***H10D 62/10*** | (2025.01) |
| ***H10D 30/01*** | (2025.01) |
| ***H10D 30/43*** | (2025.01) |
| ***H10D 30/67*** | (2025.01) |
| ***H10D 62/13*** | (2025.01) |
| ***H10D 64/01*** | (2025.01) |
| ***H10D 84/01*** | (2026.01) |
| ***H10D 84/03*** | (2025.01) |
| ***H10D 84/83*** | (2025.01) |

(52) U.S. Cl.

CPC ......... *H10D 62/121* (2025.01); *H10D 30/014* (2025.01); *H10D 30/43* (2025.01); *H10D 30/6735* (2025.01); *H10D 30/6757* (2025.01); *H10D 62/151* (2025.01); *H10D 64/017* (2025.01); *H10D 84/0135* (2025.01); *H10D 84/038* (2025.01); *H10D 84/83* (2025.01)

(58) Field of Classification Search

CPC .... H10D 62/121; H10D 30/014; H10D 30/43; H10D 30/6735; H10D 30/6757; H10D 62/151; H10D 64/017; H10D 84/0135; H10D 84/038; H10D 84/83

See application file for complete search history.

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |

(Continued)

*Primary Examiner* — Jeff W Natalini
*Assistant Examiner* — Rose Keagy
(74) *Attorney, Agent, or Firm* — JCIPRNET

(57) ABSTRACT

A semiconductor device and a manufacturing method thereof are provided. The semiconductor device includes channel layers, a mask structure, a gate structure and a source/drain pattern. The channel layers are stacked vertically apart along a first direction over a substrate. The mask structure is disposed over and apart from the channel layers along the first direction. The gate structure laterally extends along a second direction perpendicular to the first direction disposed, wherein the gate structure wraps around the channel layers and laterally surround the mask structure. The source/drain pattern is in contact with the channel layers.

20 Claims, 53 Drawing Sheets

(56) References Cited

U.S. PATENT DOCUMENTS

| | | | | |
|---|---|---|---|---|
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 2022/0302135 | A1* | 9/2022 | Liaw | H10D 62/121 |
| 2023/0061815 | A1* | 3/2023 | Kao | H10D 84/0158 |
| 2023/0066323 | A1* | 3/2023 | Huang | H10D 62/364 |
| 2023/0123987 | A1* | 4/2023 | Cheng | H10D 64/021 257/288 |

* cited by examiner

SEMICONDUCTOR DEVICE AND MANUFACTURING METHOD THEREOF

BACKGROUND

As the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET), including a fin FET (Fin FET) and a gate-all-around (GAA) FET. However, the final meta-gate height (MGH) control and MGH reduction has been very challenging when using conventional meta-gate etching-back (MGEB) process due to the etching process variations arising from various meta-gate layers and spacing loading.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
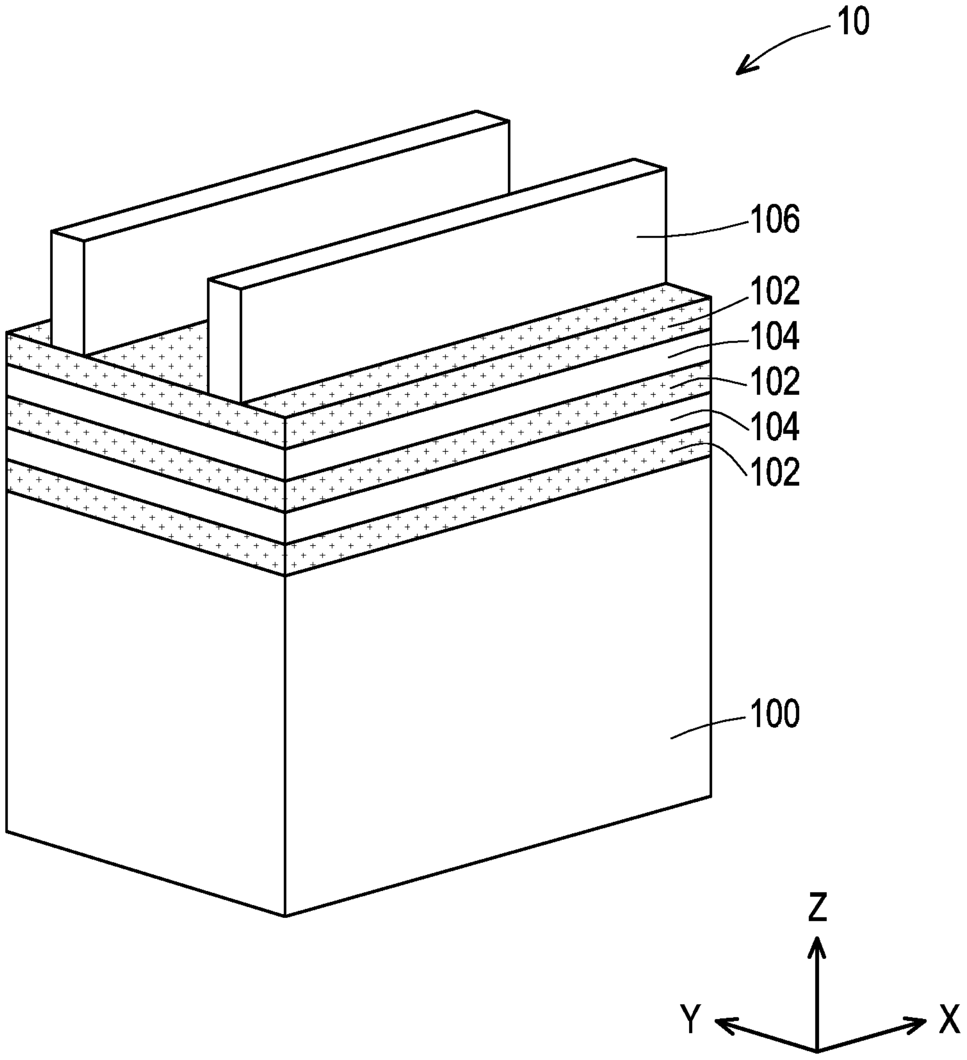
FIG. 1A through FIG. 1U are schematic perspective views of various stages in a manufacturing method of a semiconductor device in accordance with some embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for case of description to describe similar or different element(s) or feature(s) as illustrated in the figures, and may be used interchangeably depending on the order of the presence or the contexts of the description.

It should be appreciated that the following embodiment(s) of the present disclosure provides applicable concepts that can be embodied in a wide variety of specific contexts. The embodiments are intended to provide further explanations but are not used to limit the scope of the present disclosure. The specific embodiment(s) described herein is related to a structure containing one or more semiconductor devices, and is not intended to limit the scope of the present disclosure. Embodiments of the present disclosure describe the exemplary manufacturing process of the structure(s) formed with one or more semiconductor devices such as transistors and the integrated structures fabricated there-from. Certain embodiments of the present disclosure are related to the structures including semiconductor transistors and/or other elements. The substrates and/or wafers may include one or more types of integrated circuits or electronic components therein. The semiconductor device(s) may be formed on a bulk semiconductor substrate or a silicon/germanium-on-insulator substrate. In addition, source/drain region(s) may refer to a source or a drain, individually or collectively dependent upon the context.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figure 1B:
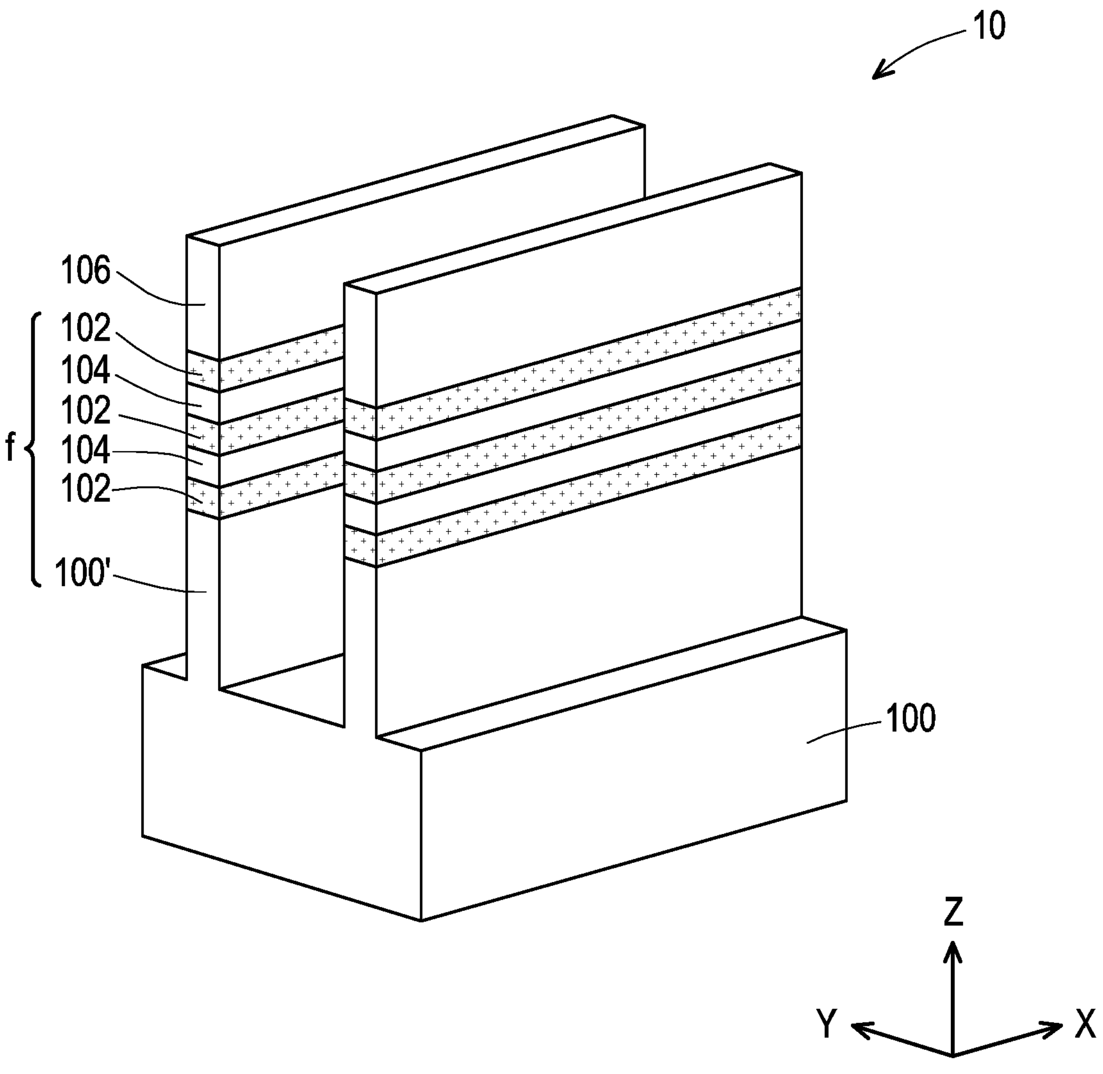
Figure 1C:
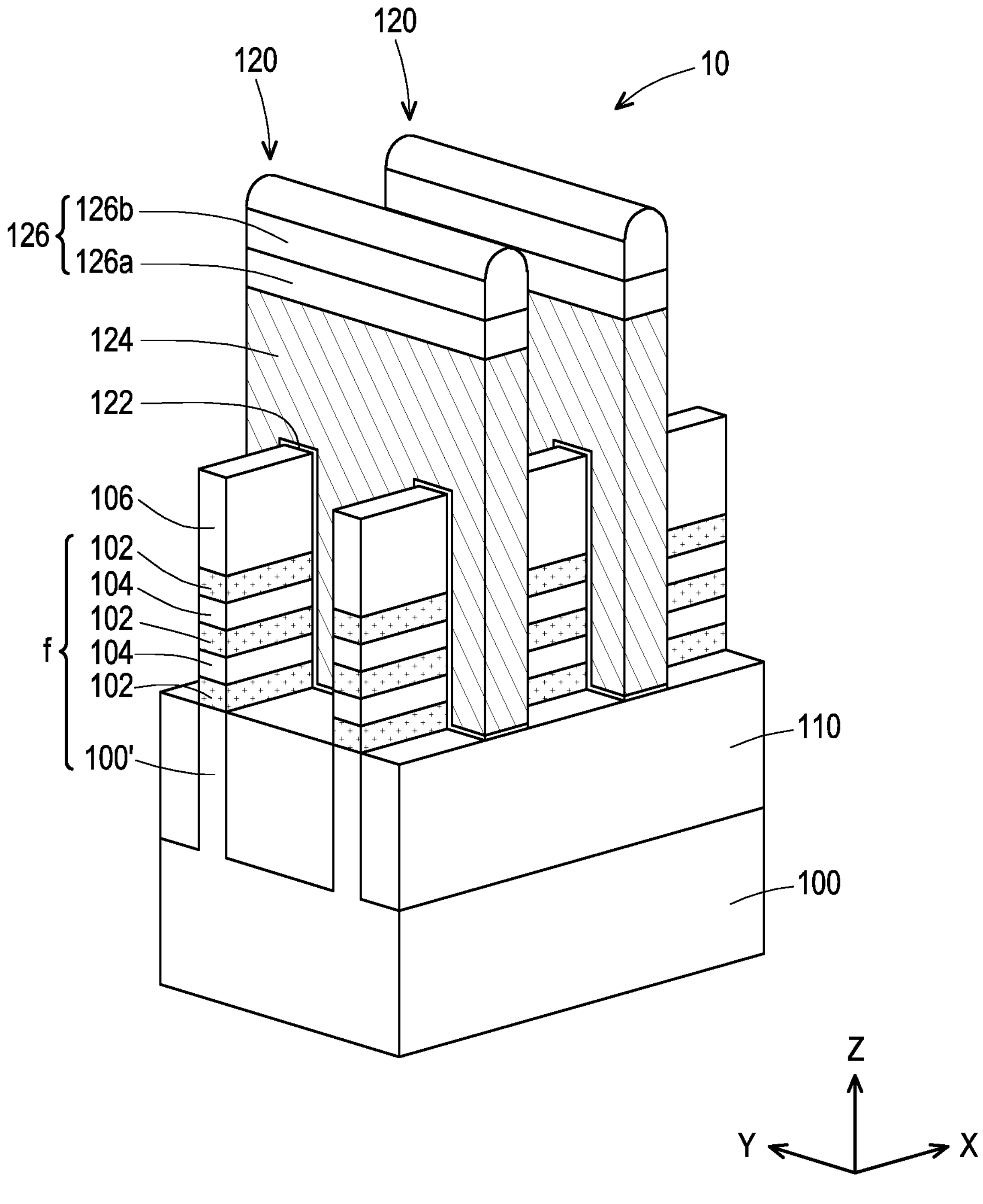
Figure 1D:
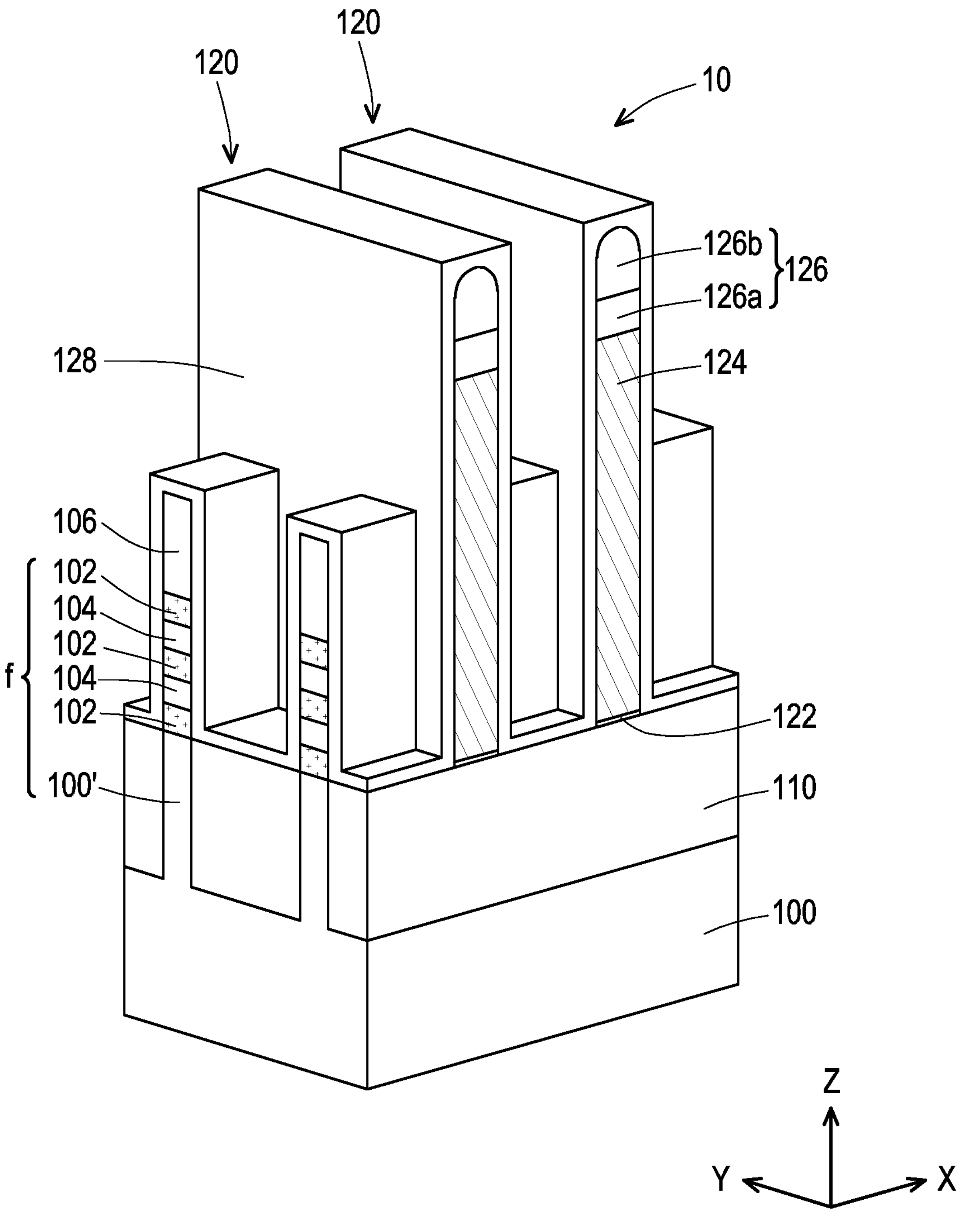
Figure 1E:
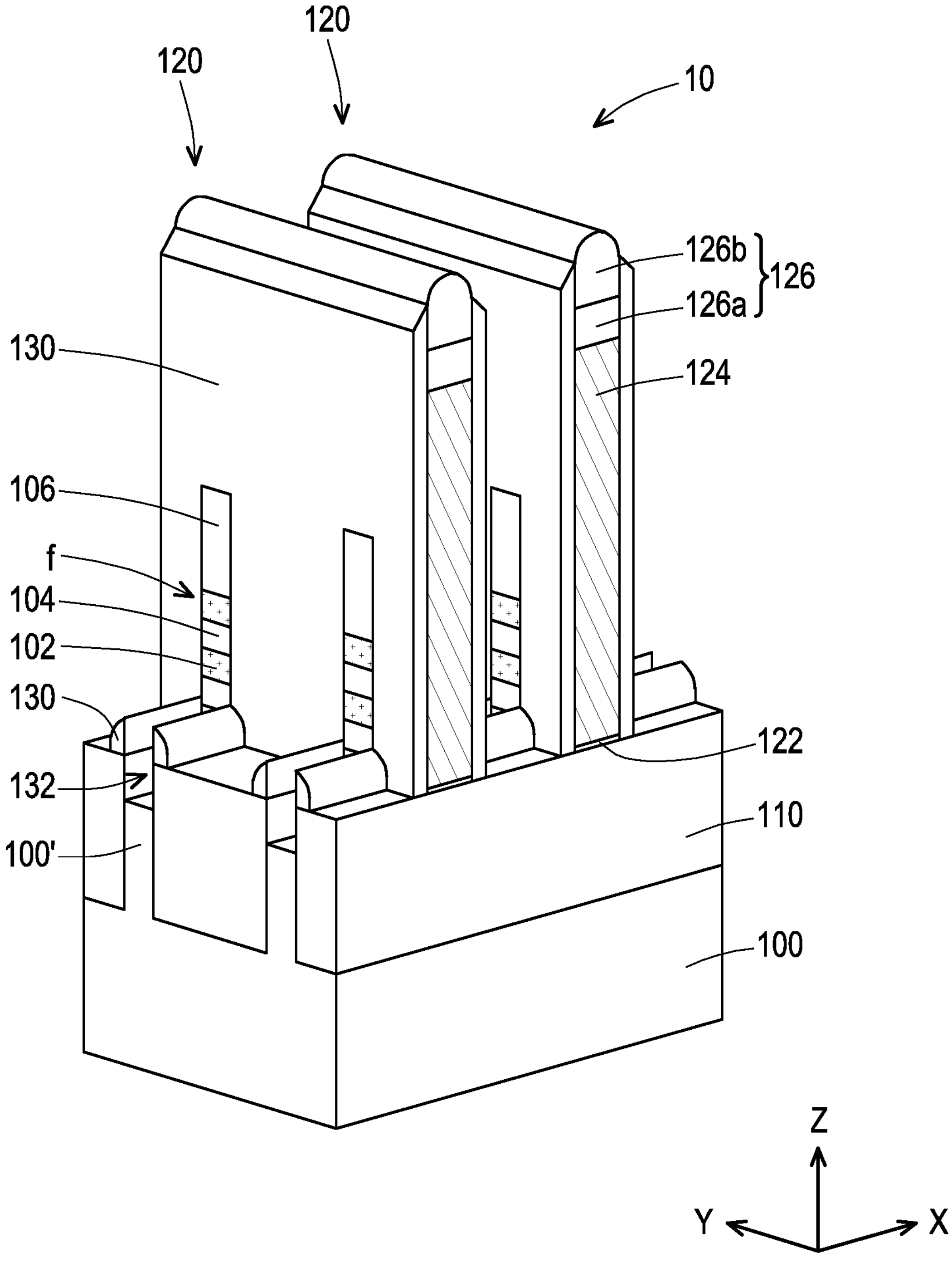
Figure 1F:
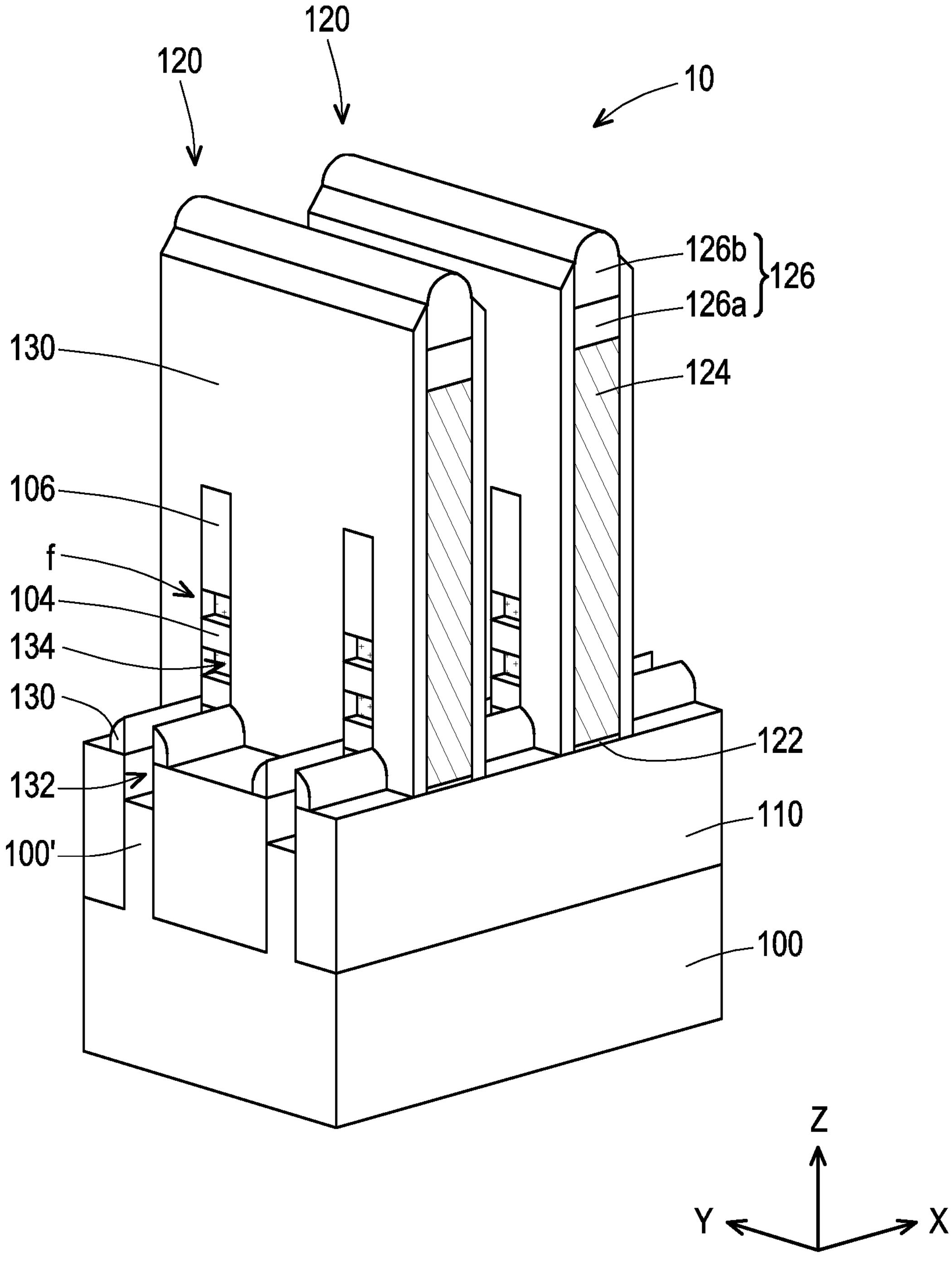
Figure 1G:
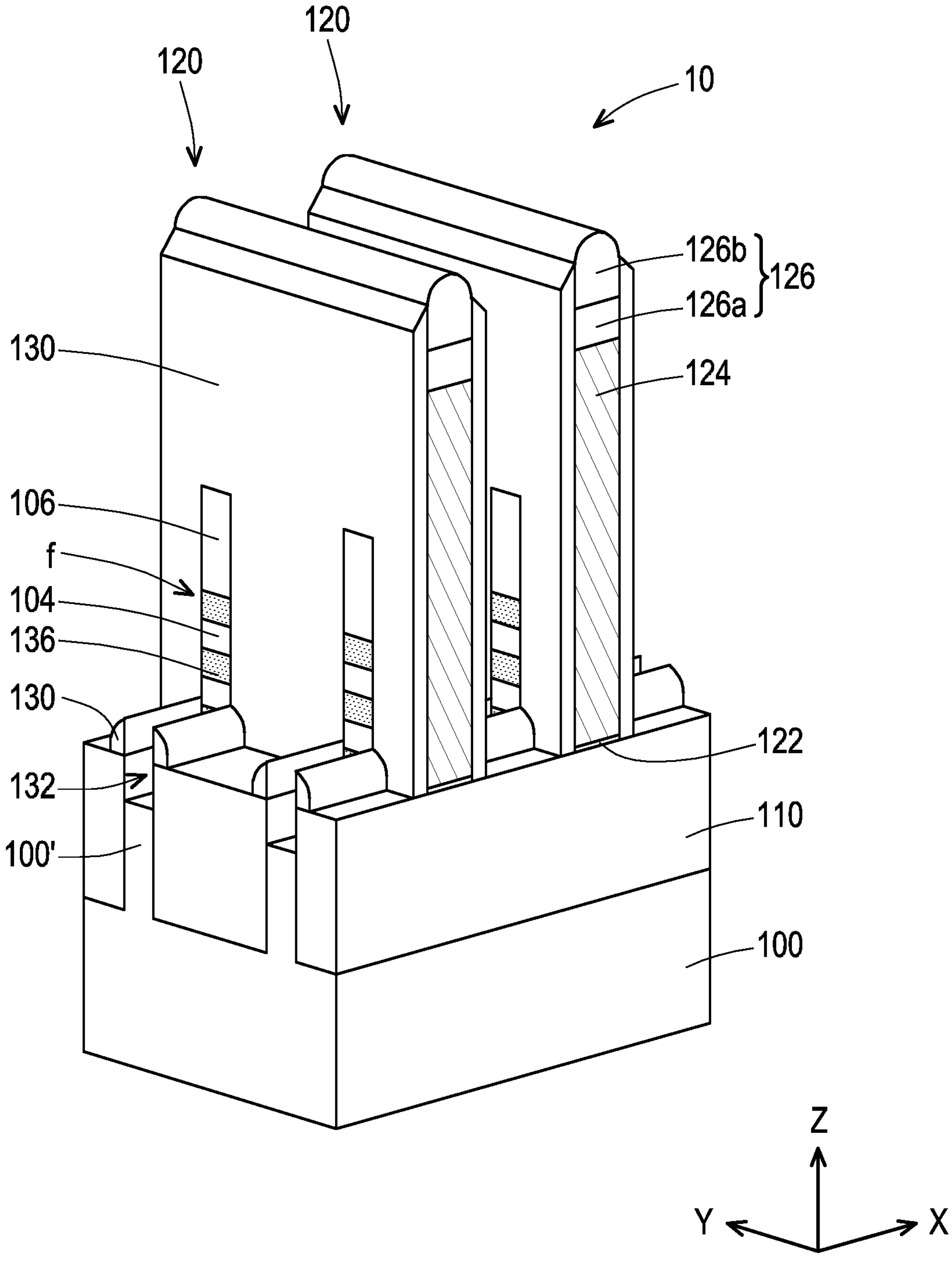
Figure 1H:
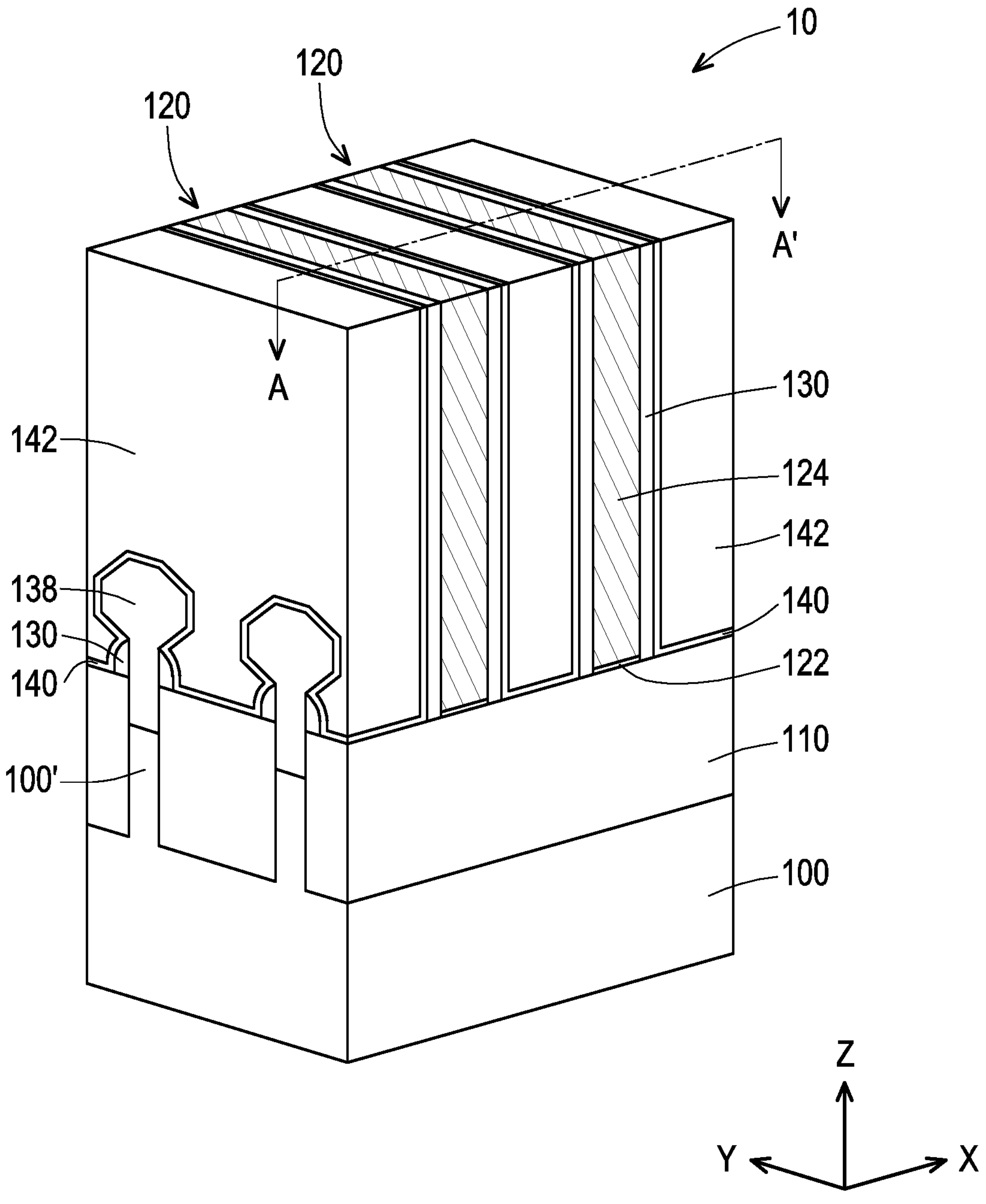
Figure 1I:
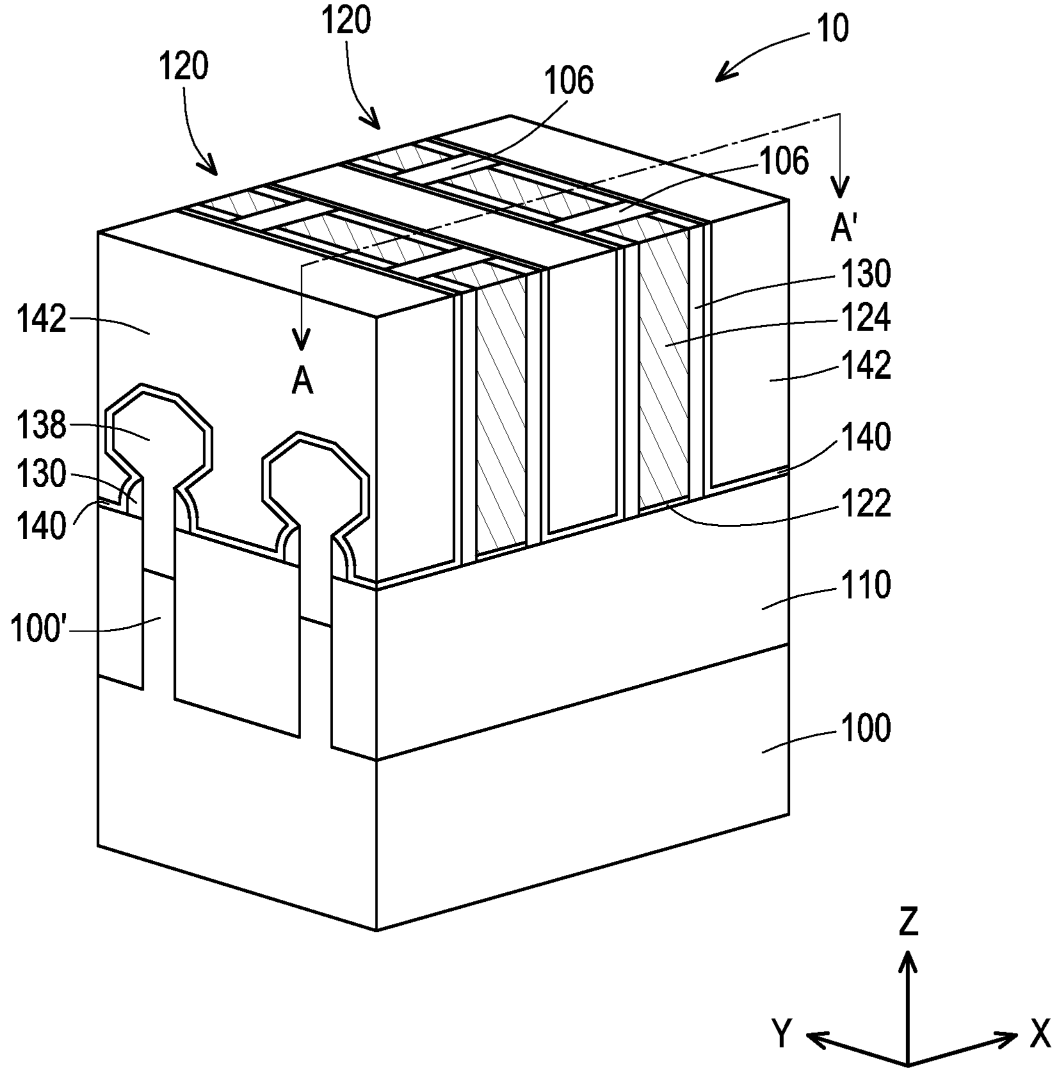
Figure 1J:
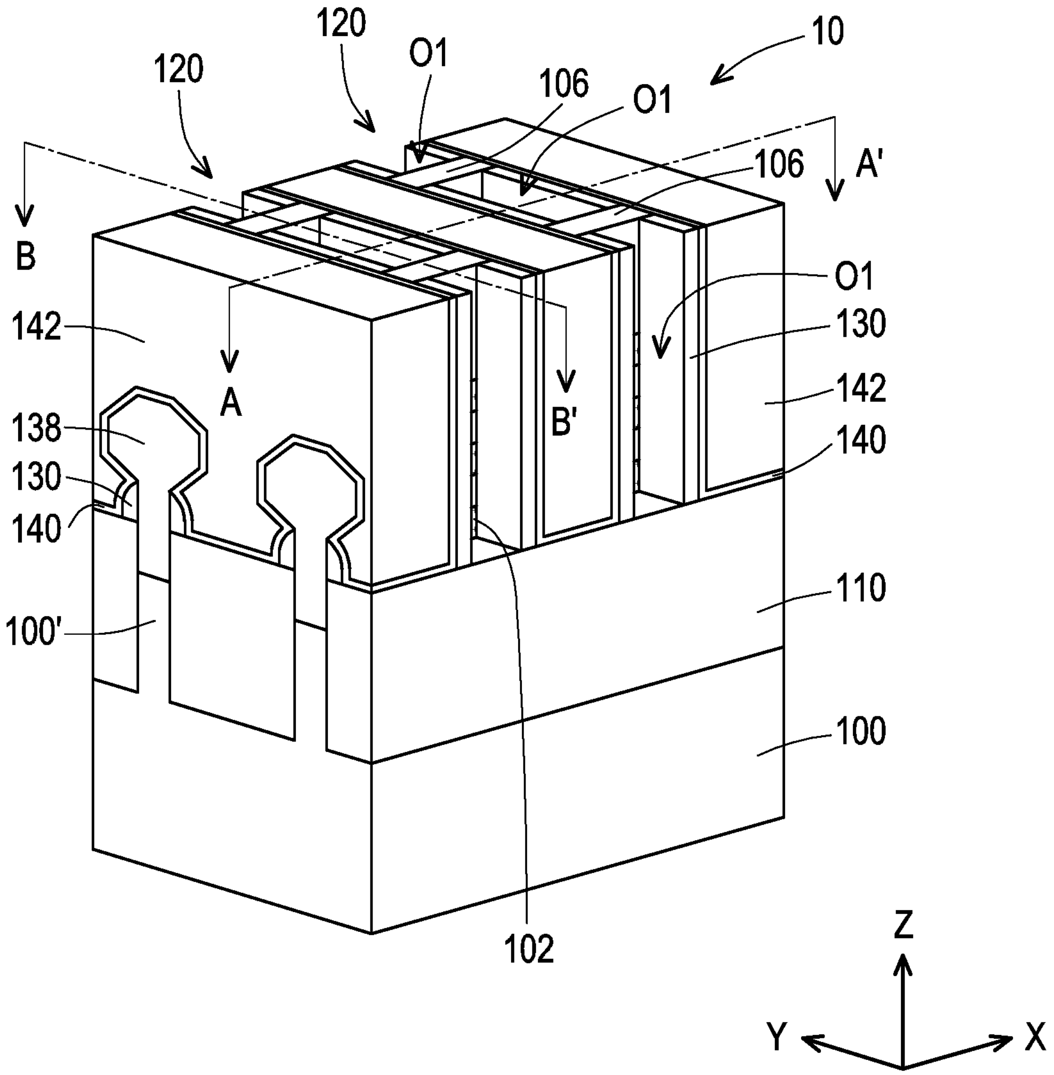
Figure 1K:
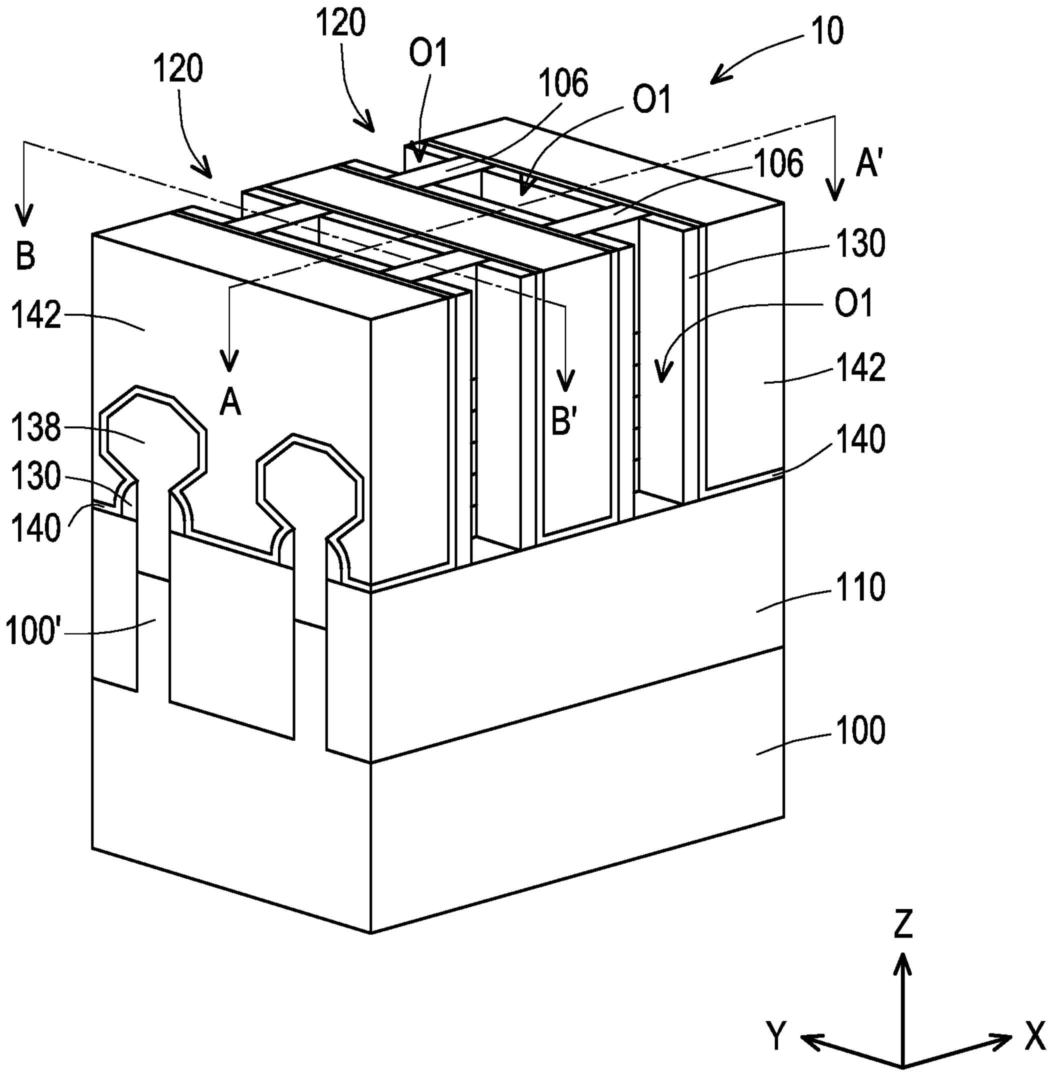
Figure 1L:
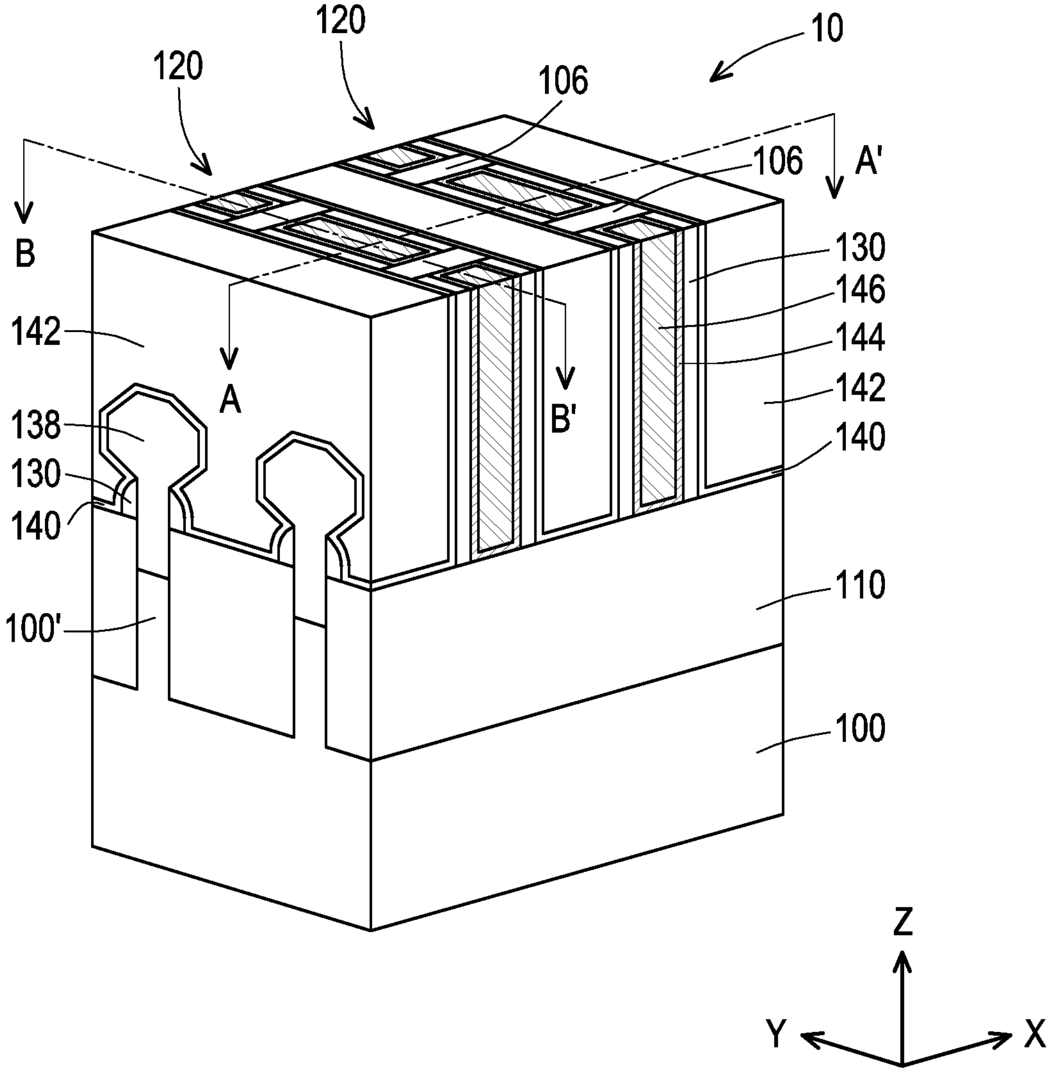
Figure 1M:
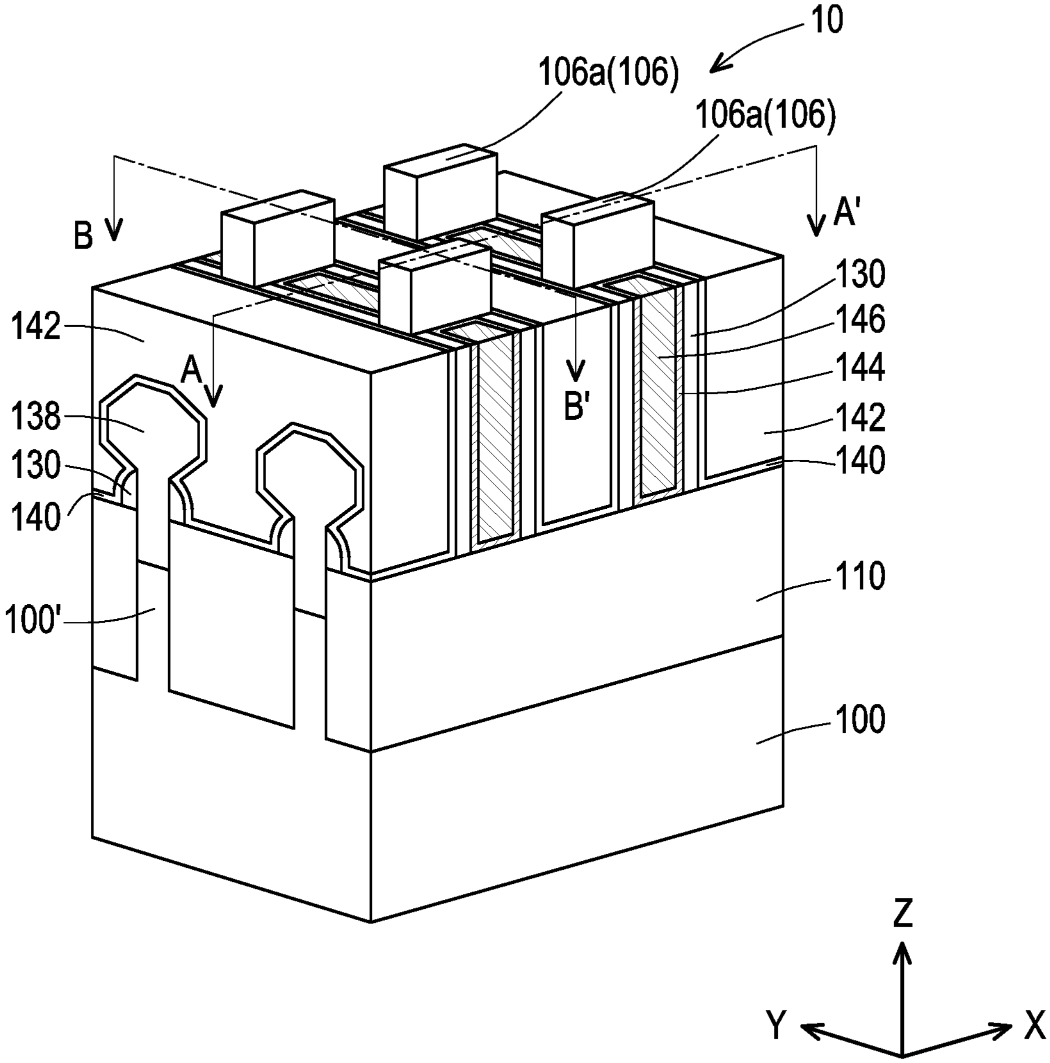
Figure 1N:
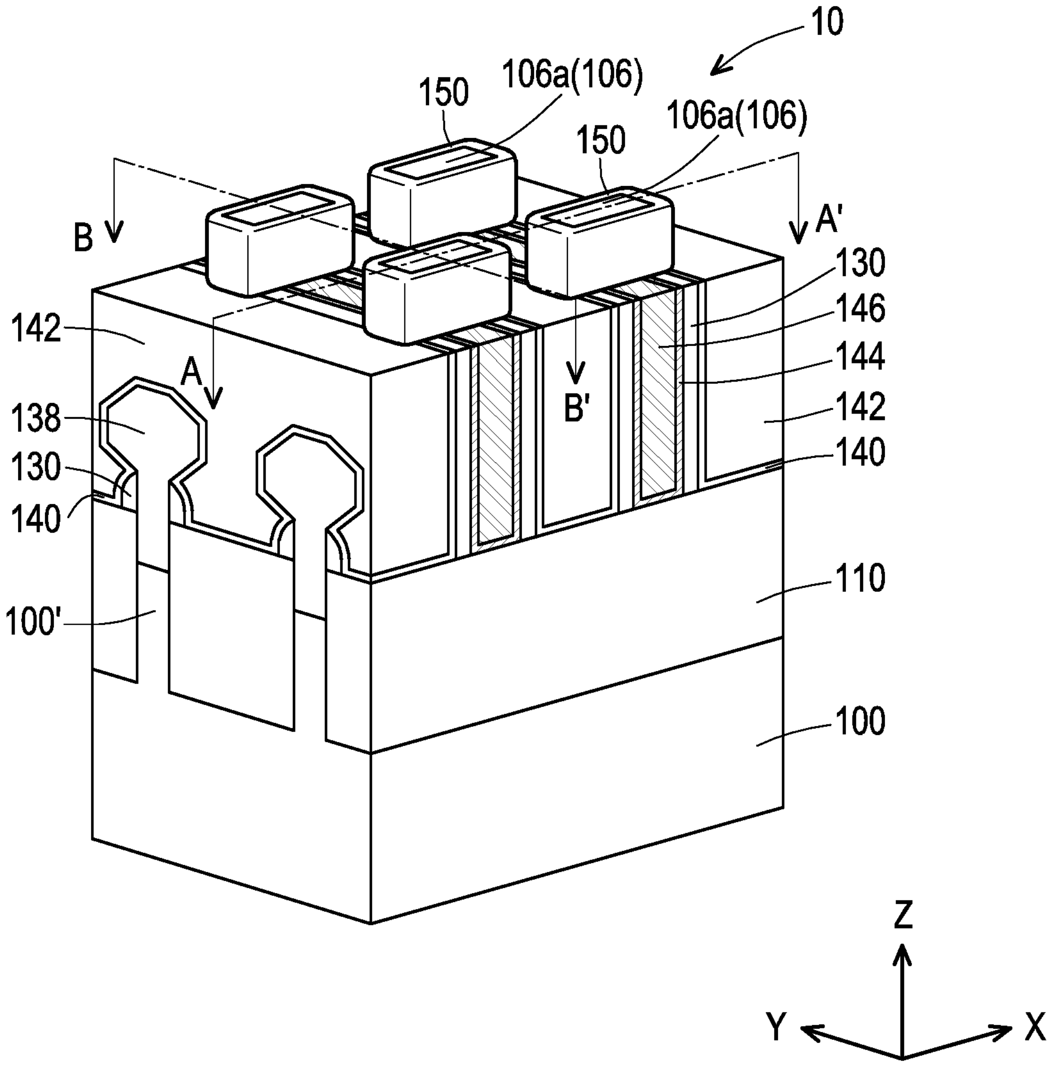
Figure 1O:
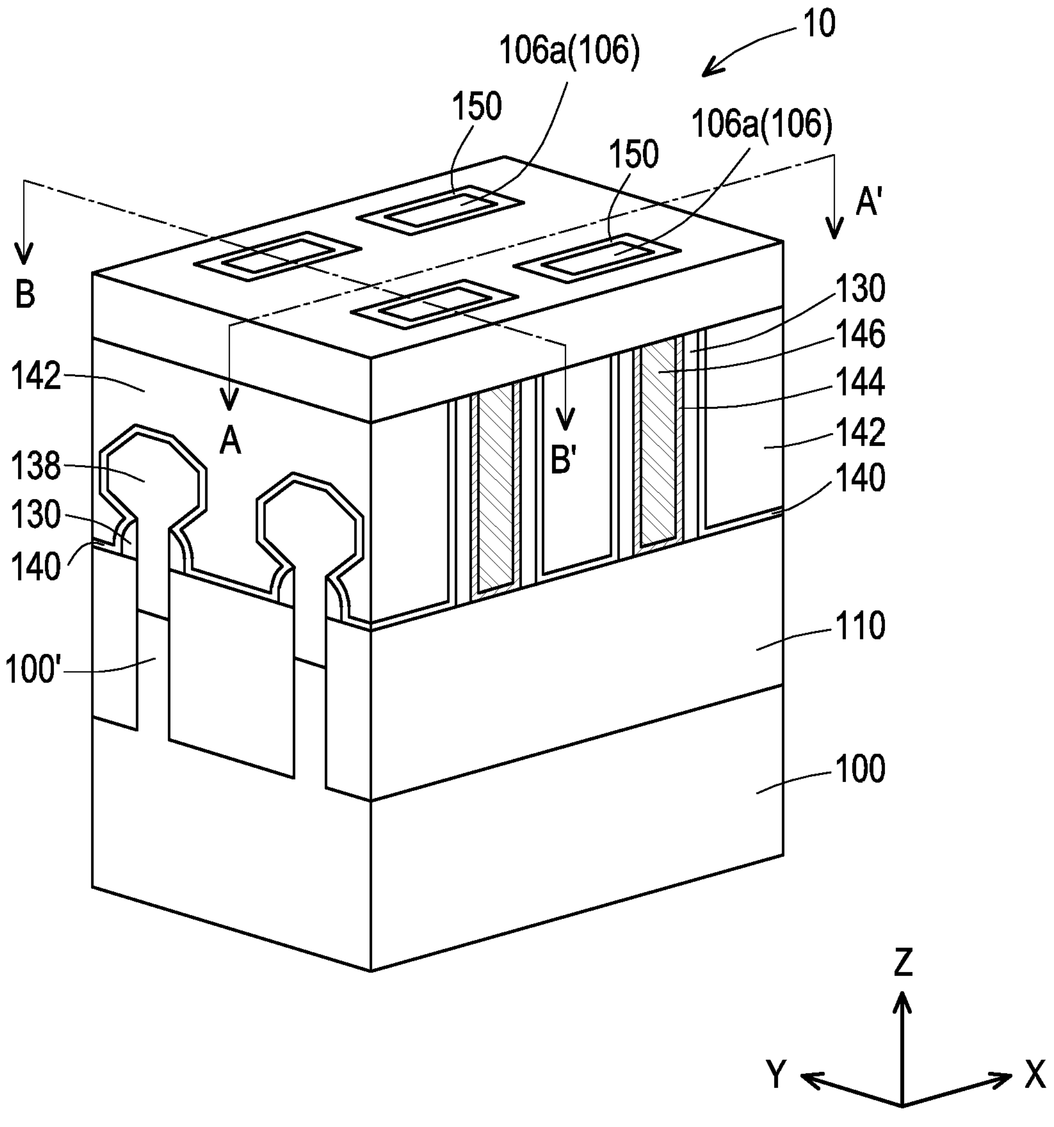
Figure 1P:
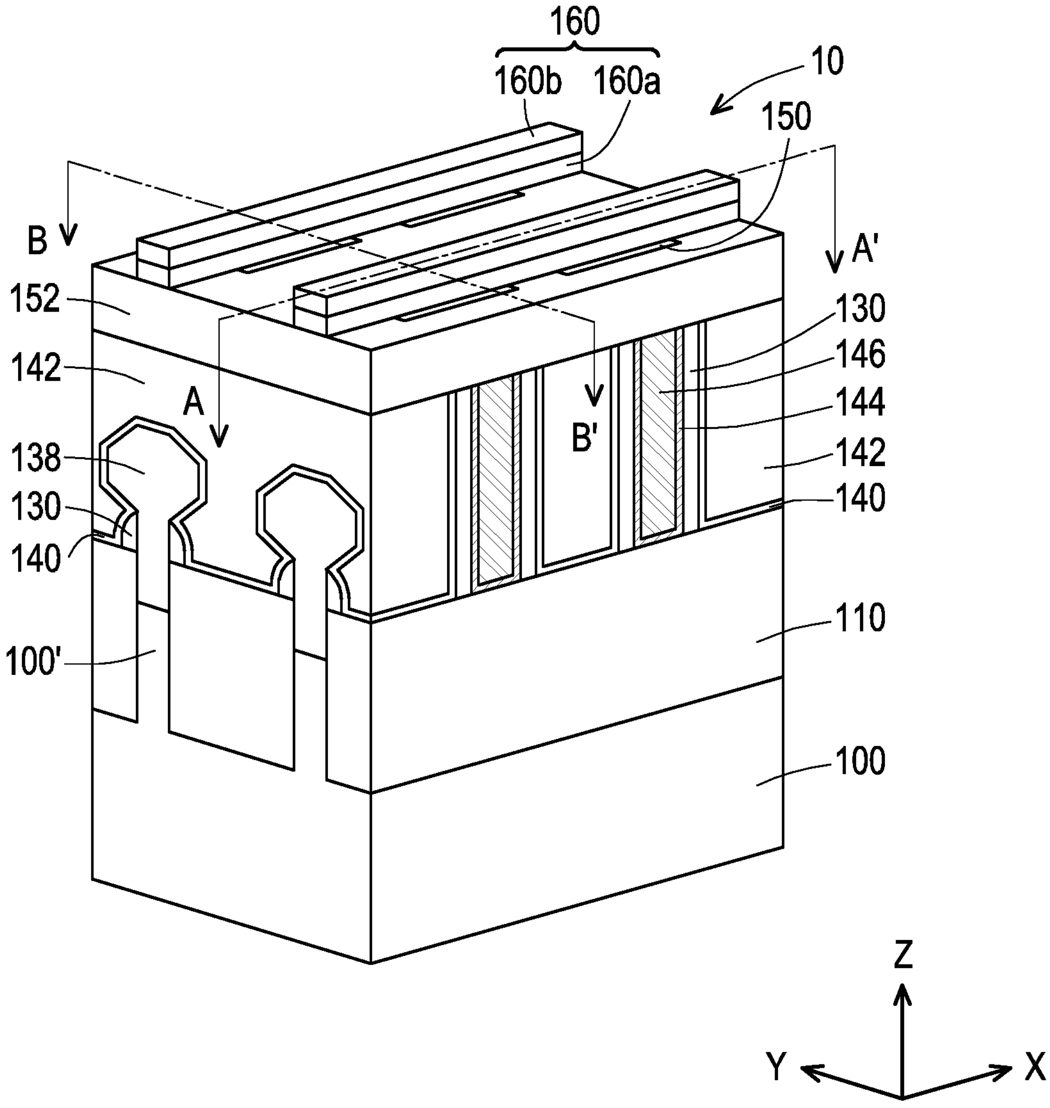
Figure 1Q:
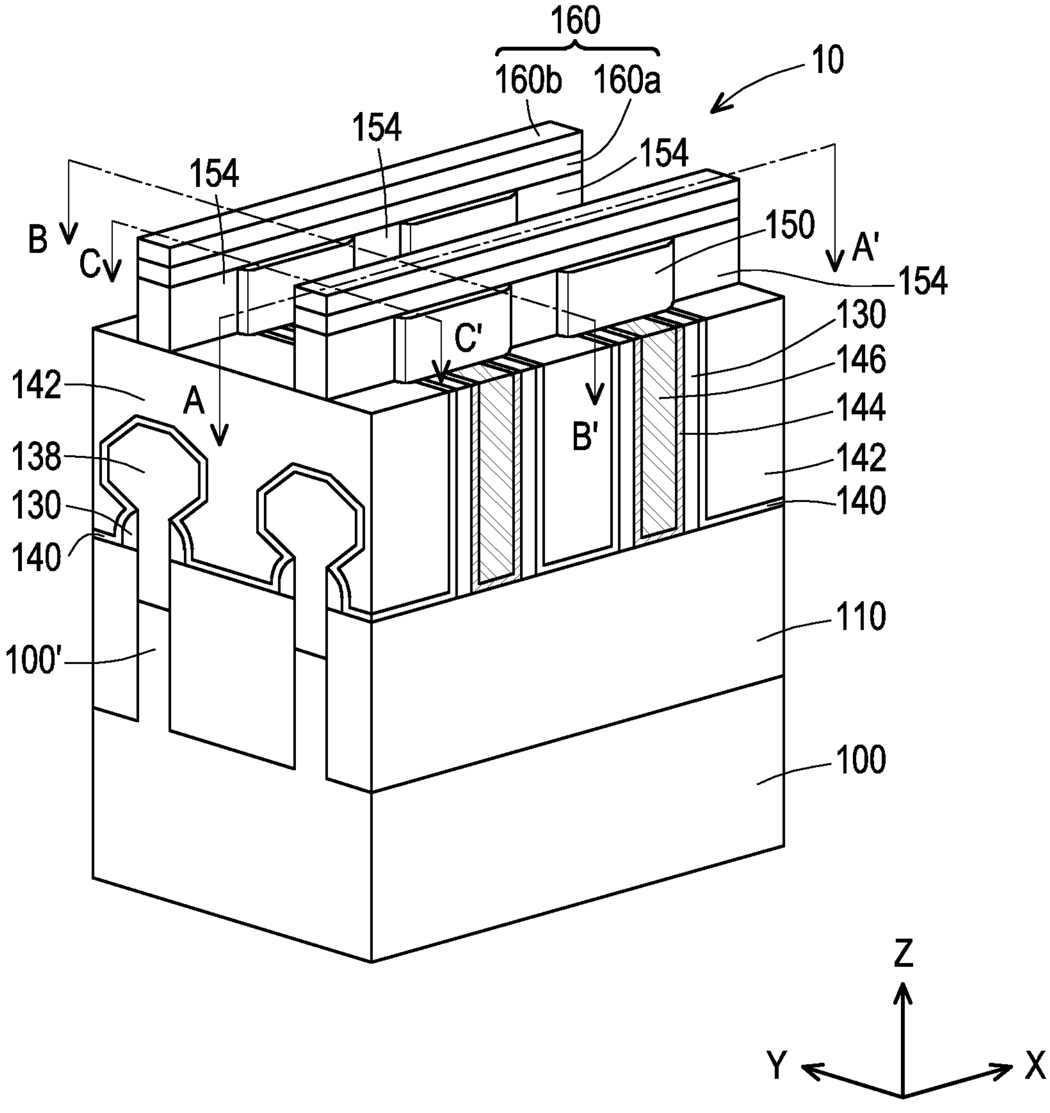
Figure 1R:
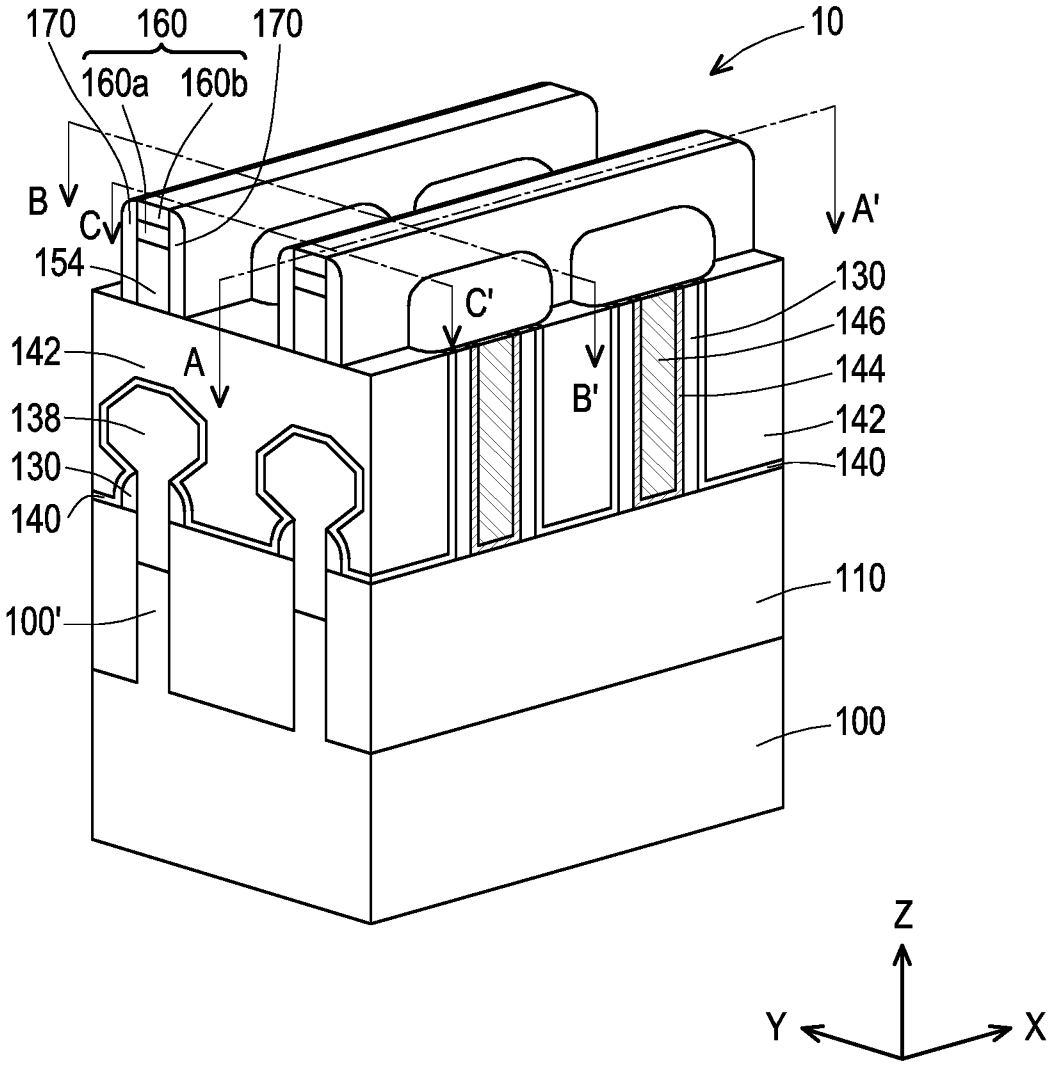
Figure 1S:
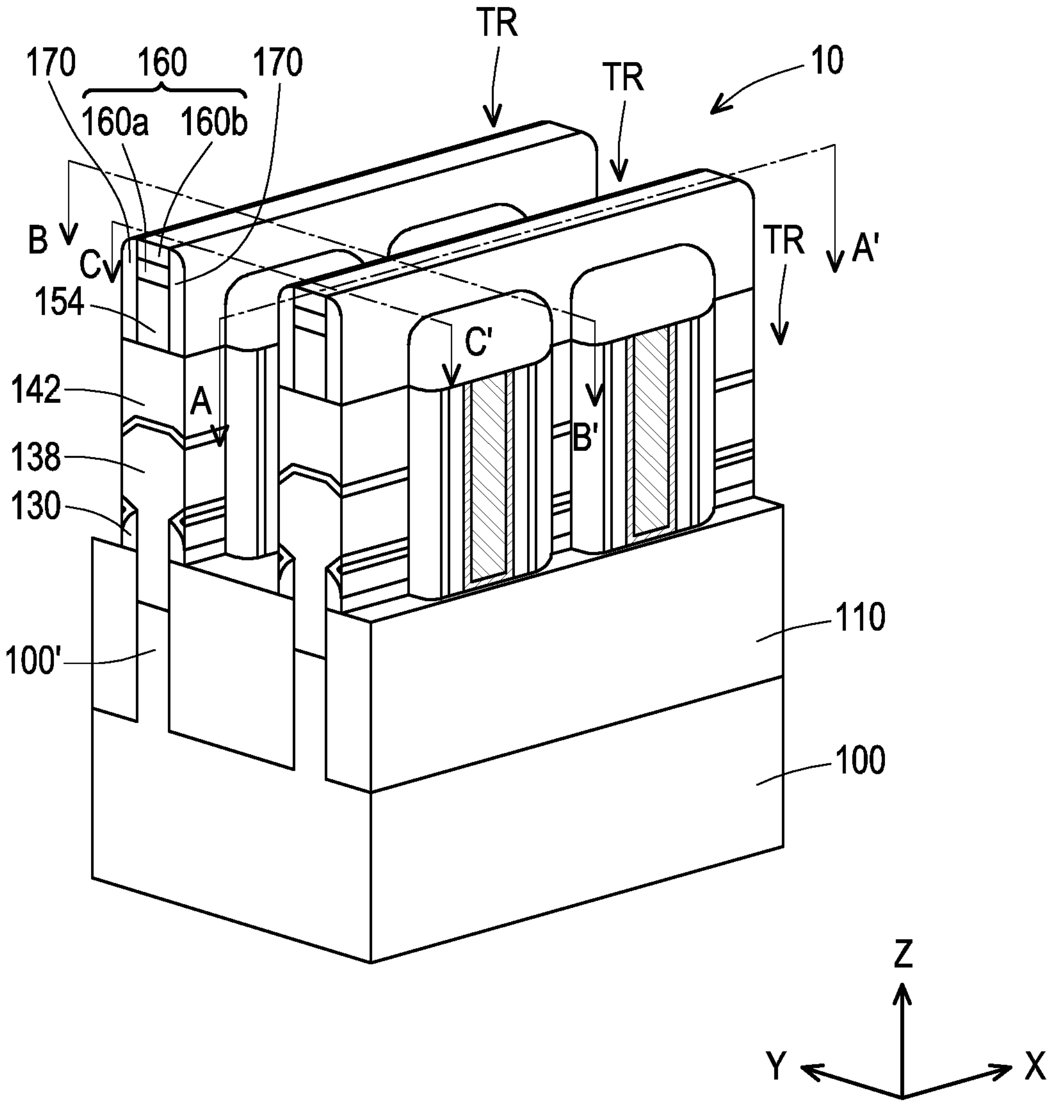
Figure 1T:
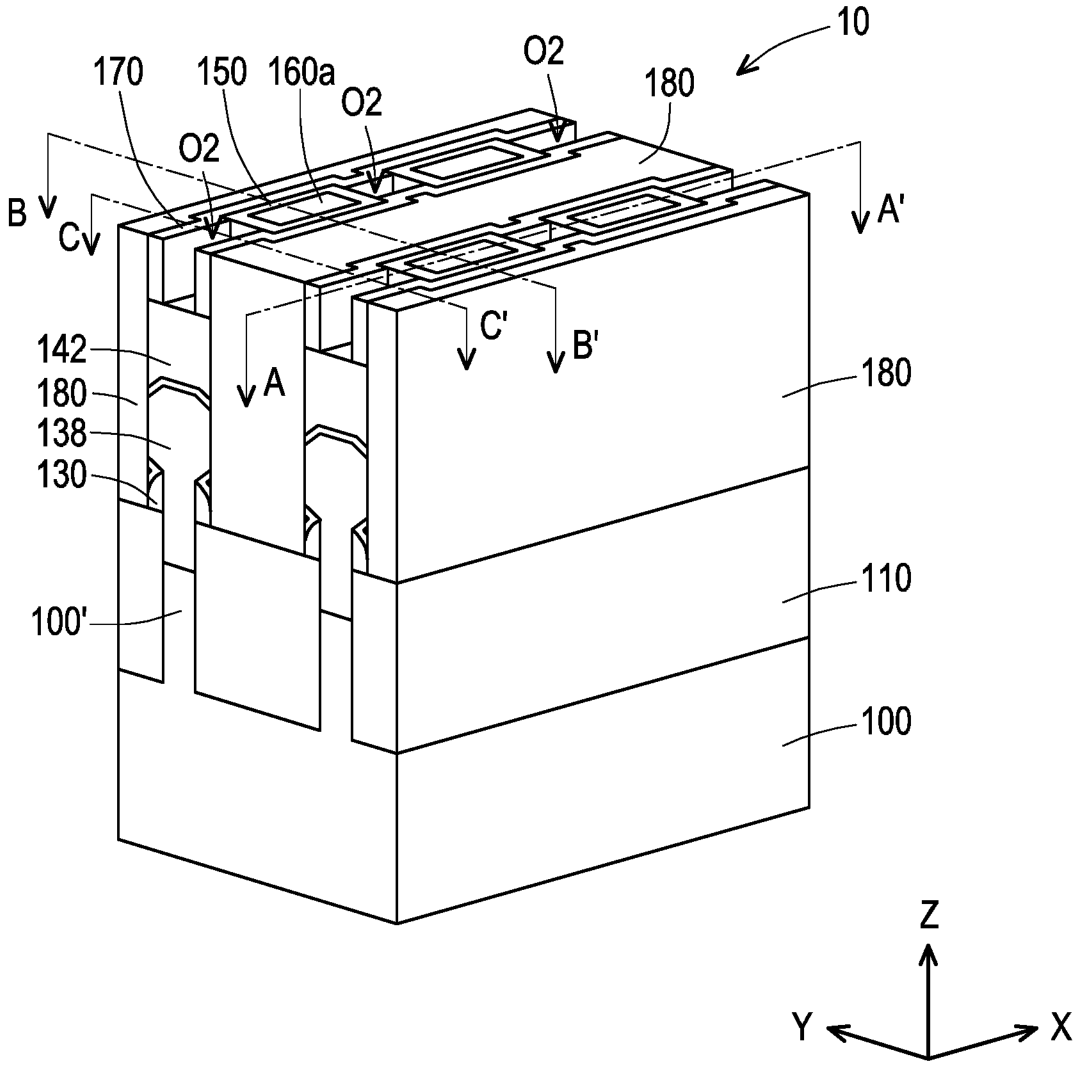
Figure 1U:
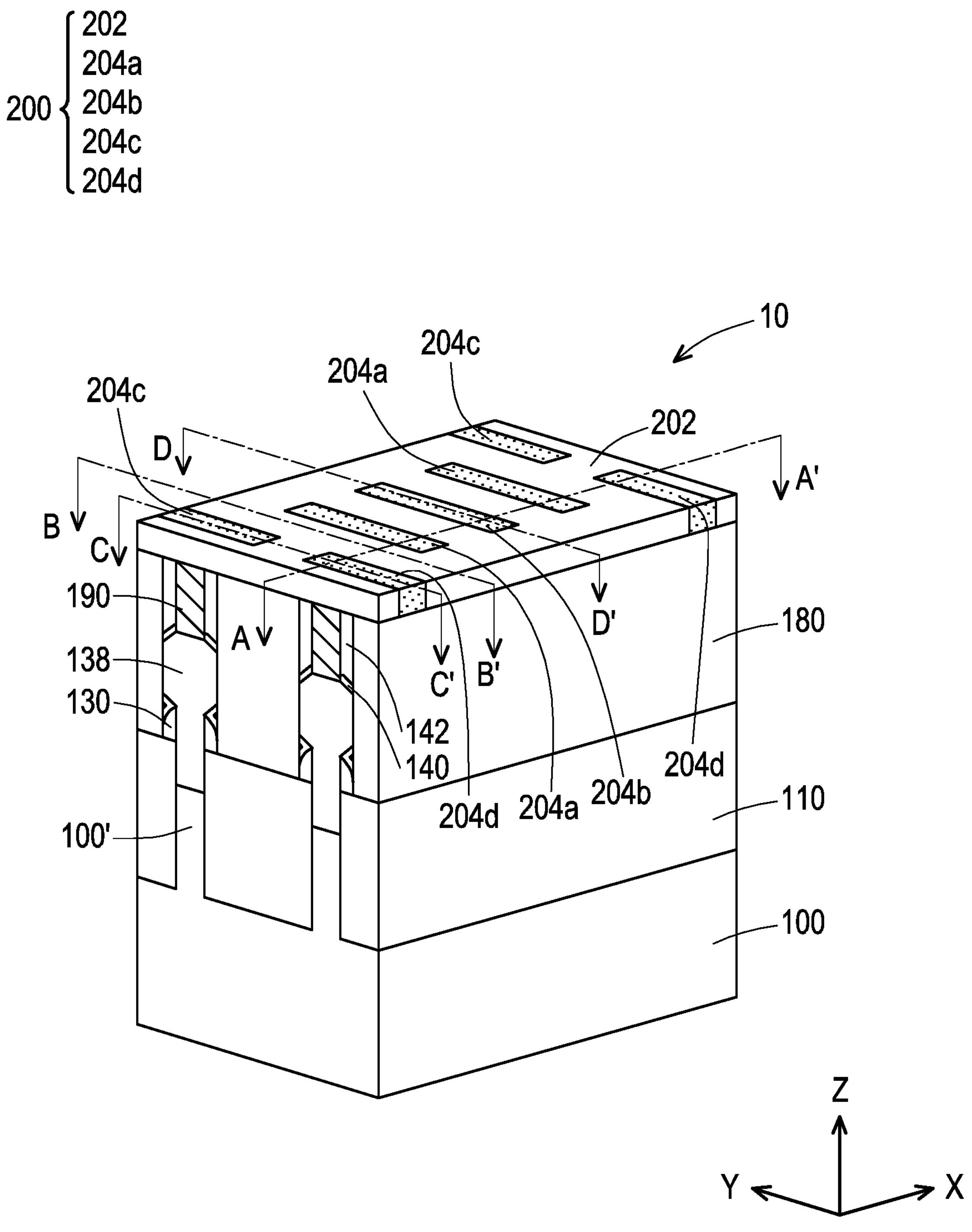
Figure 2:
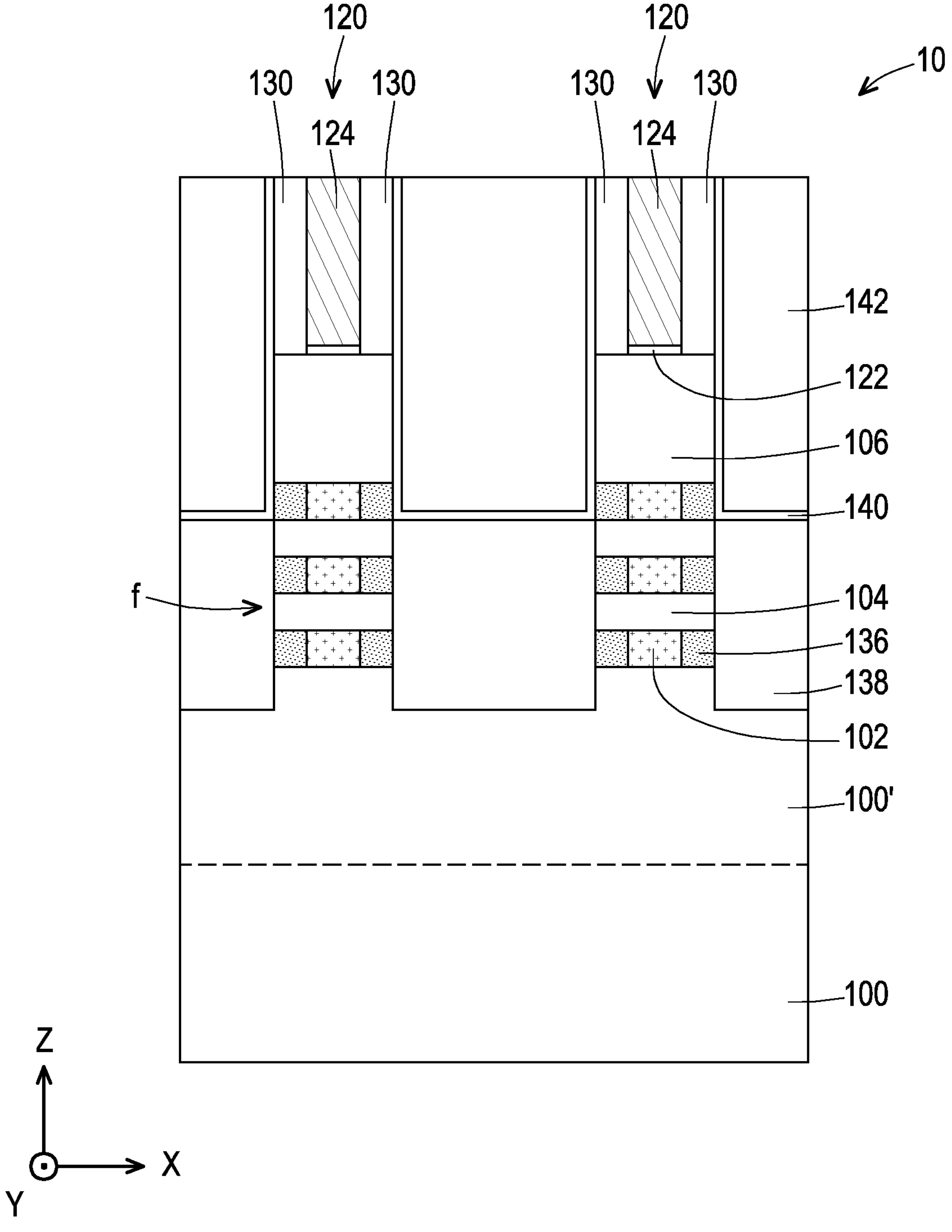
FIG. 2 is a schematic cross-sectional view along line A-A' shown in FIG. 1H.
Figure 3:
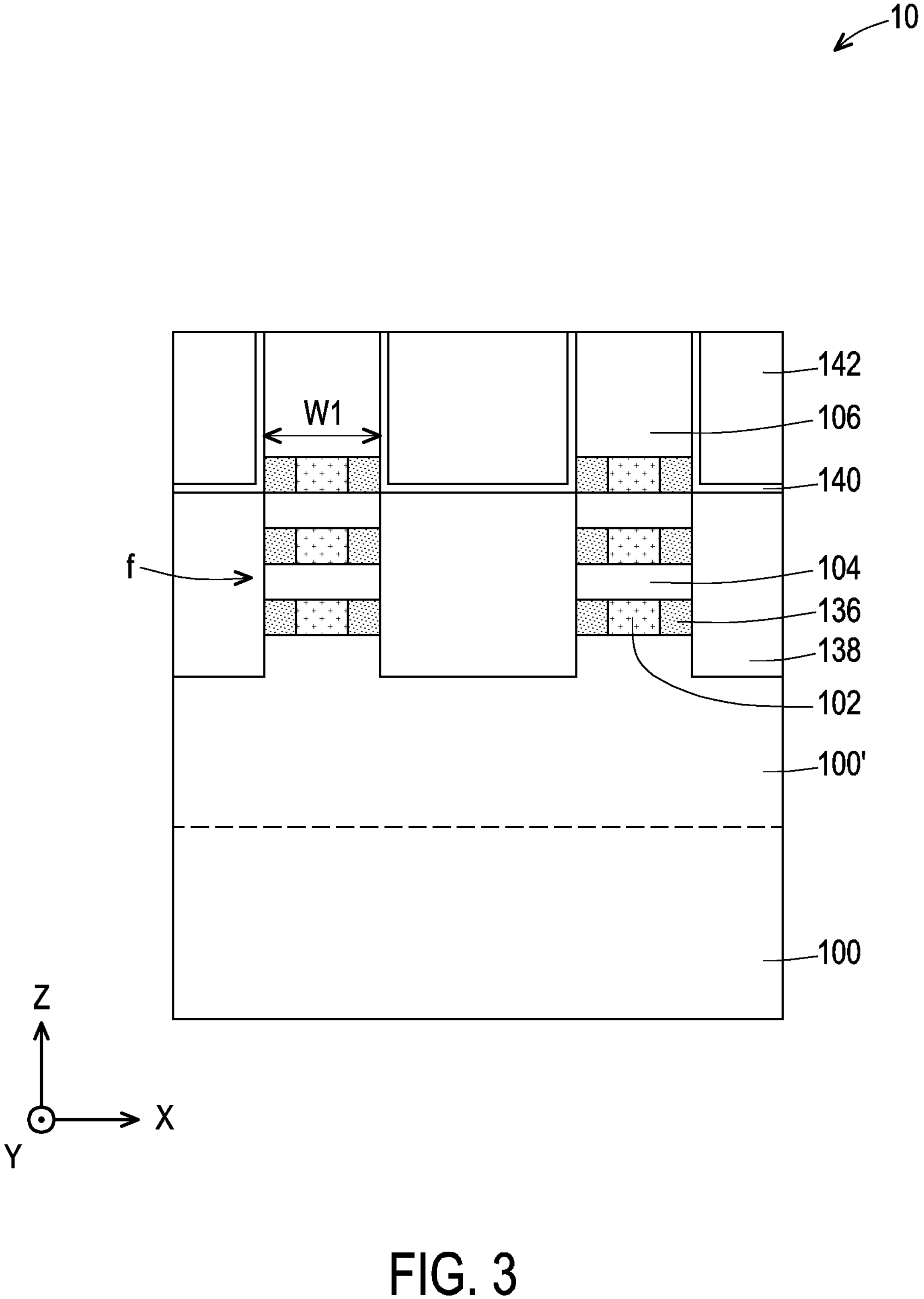
FIG. 3 is a schematic cross-sectional view along line A-A' shown in FIG. 1I.
Figure 4A:
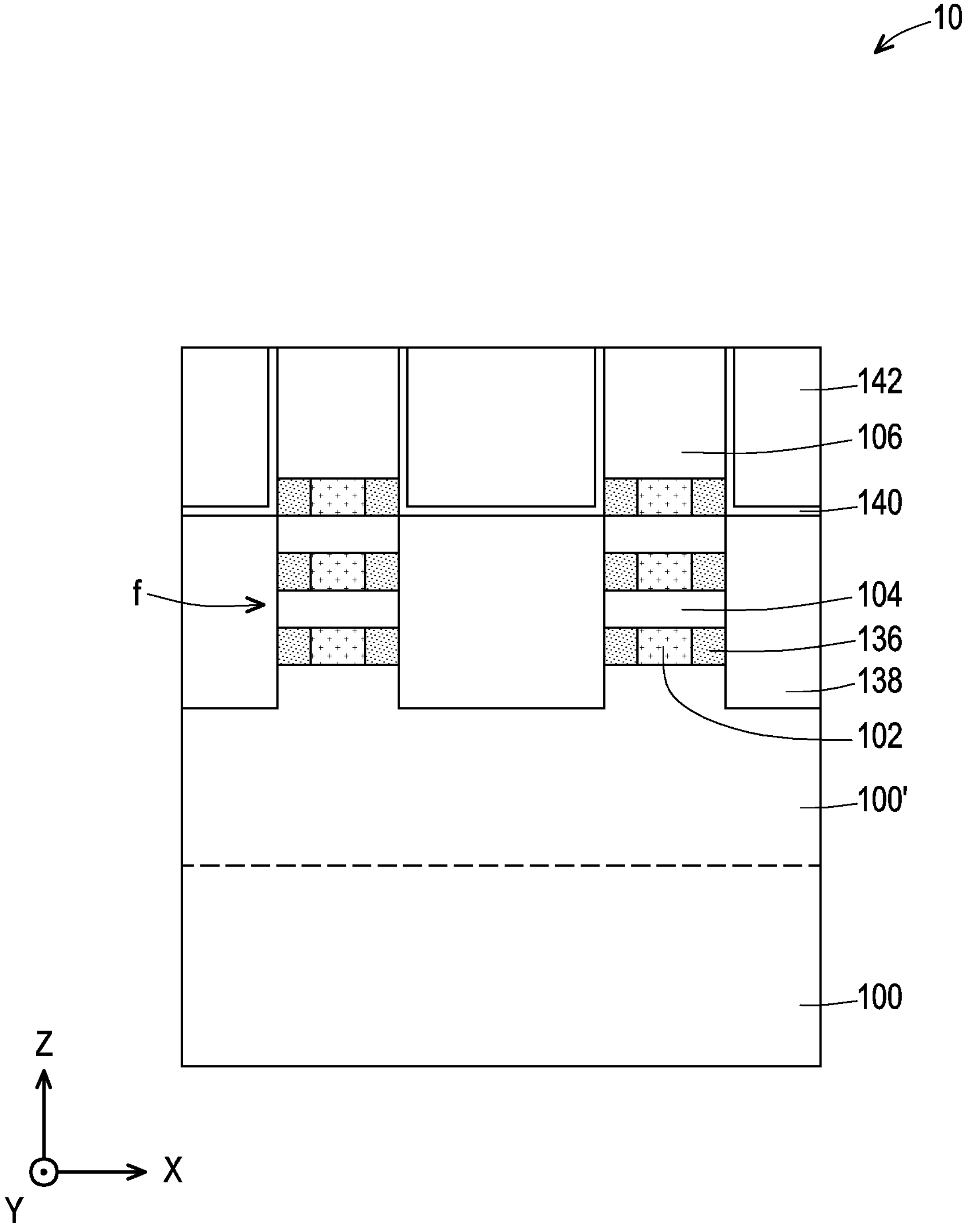
FIG. 4A and FIG. 4B respectively are schematic cross-sectional views along line A-A' and line B-B' shown in FIG. 1J.
Figure 4B:
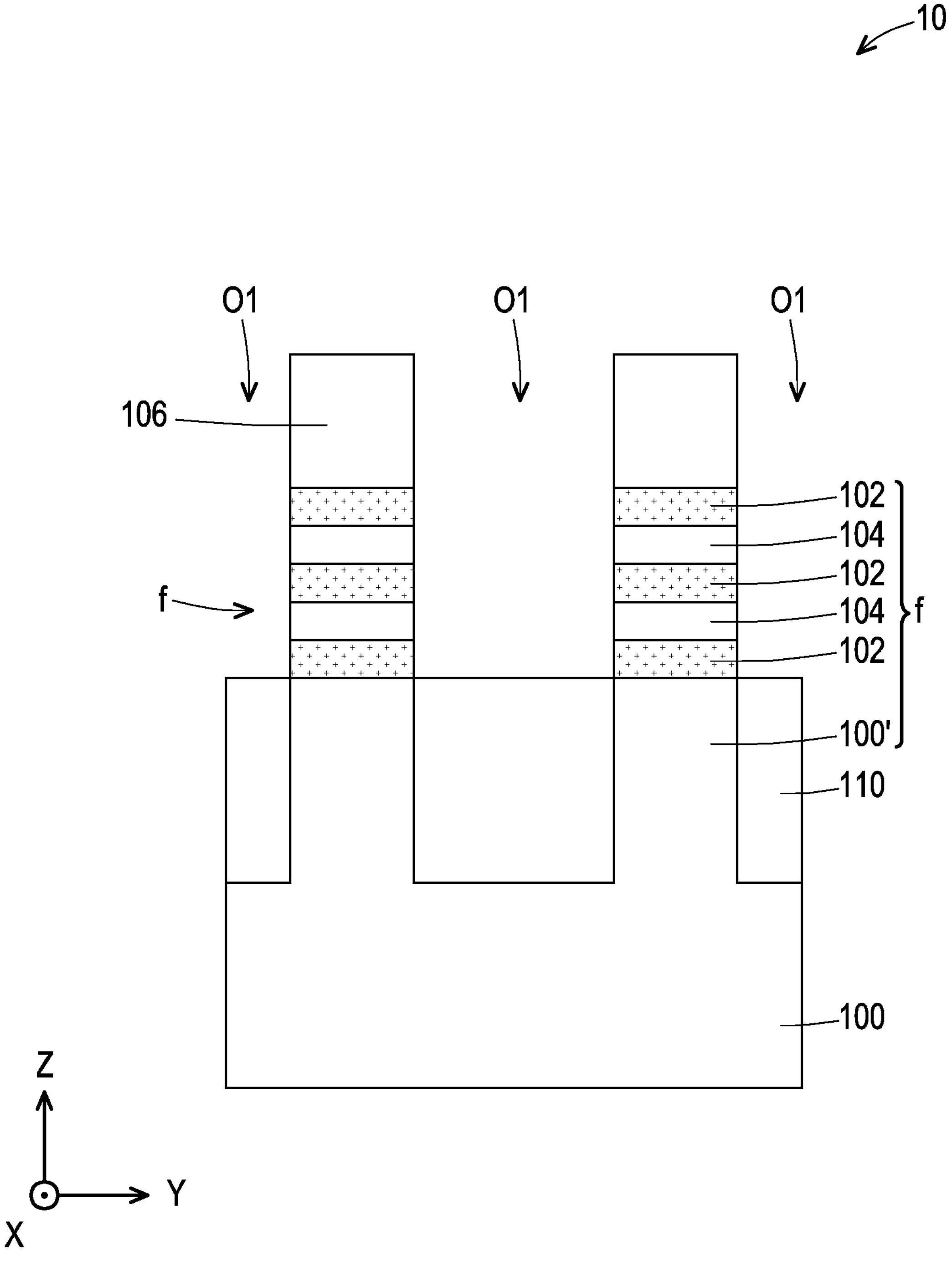
Figure 5A:
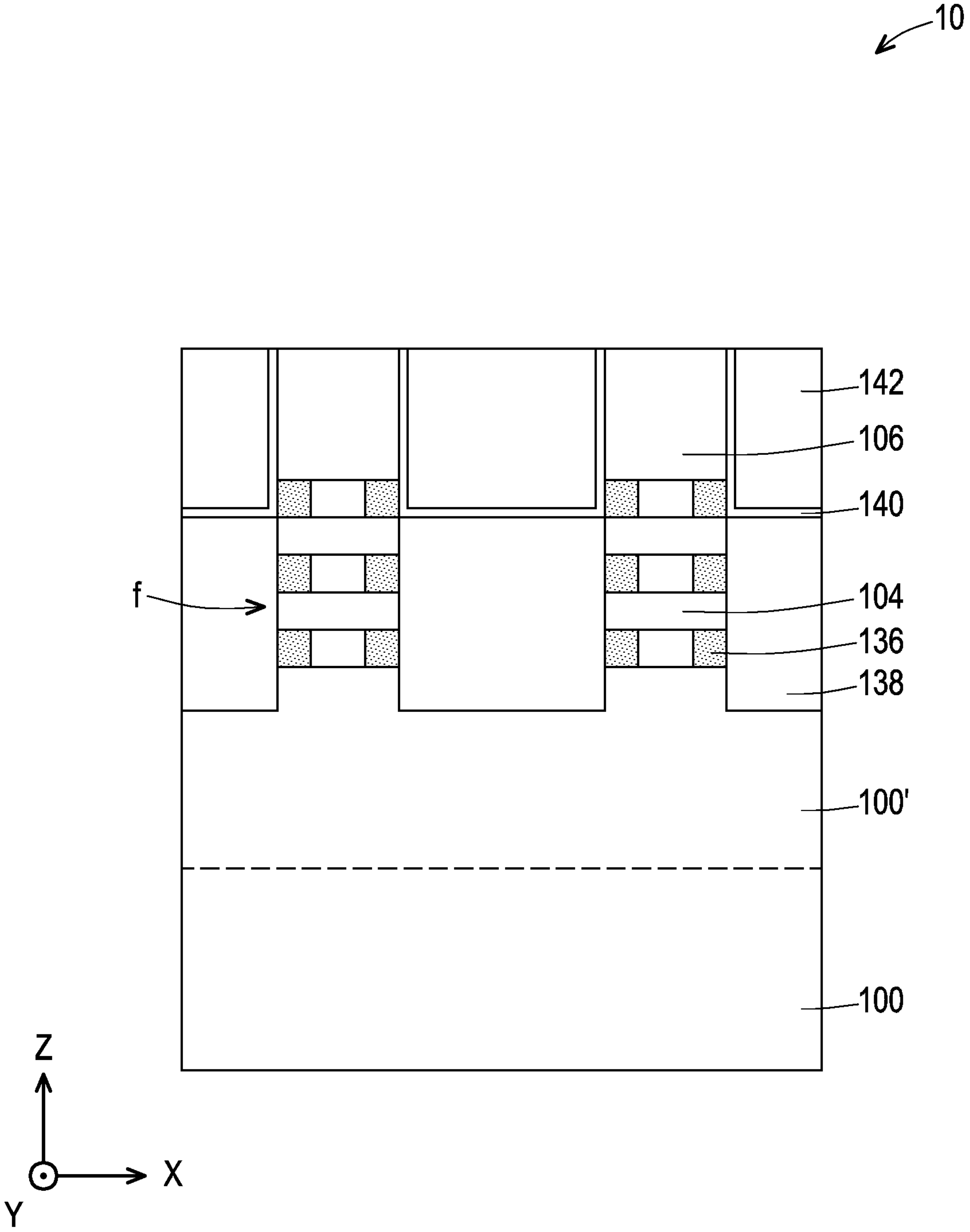
FIG. 5A and FIG. 5B respectively are schematic cross-sectional views along line A-A' and line B-B' shown in FIG. 1K.
Figure 5B:
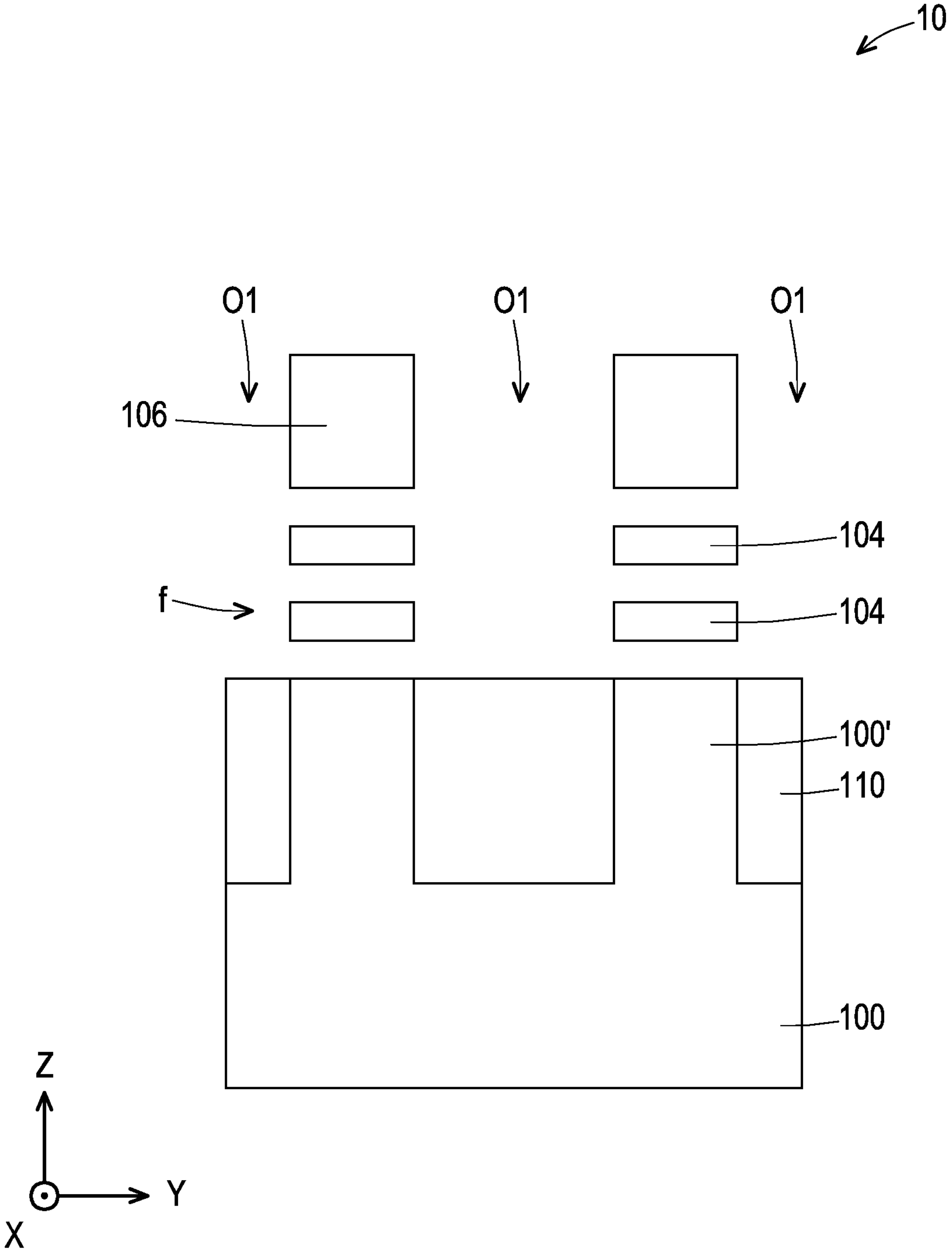
Figure 6A:
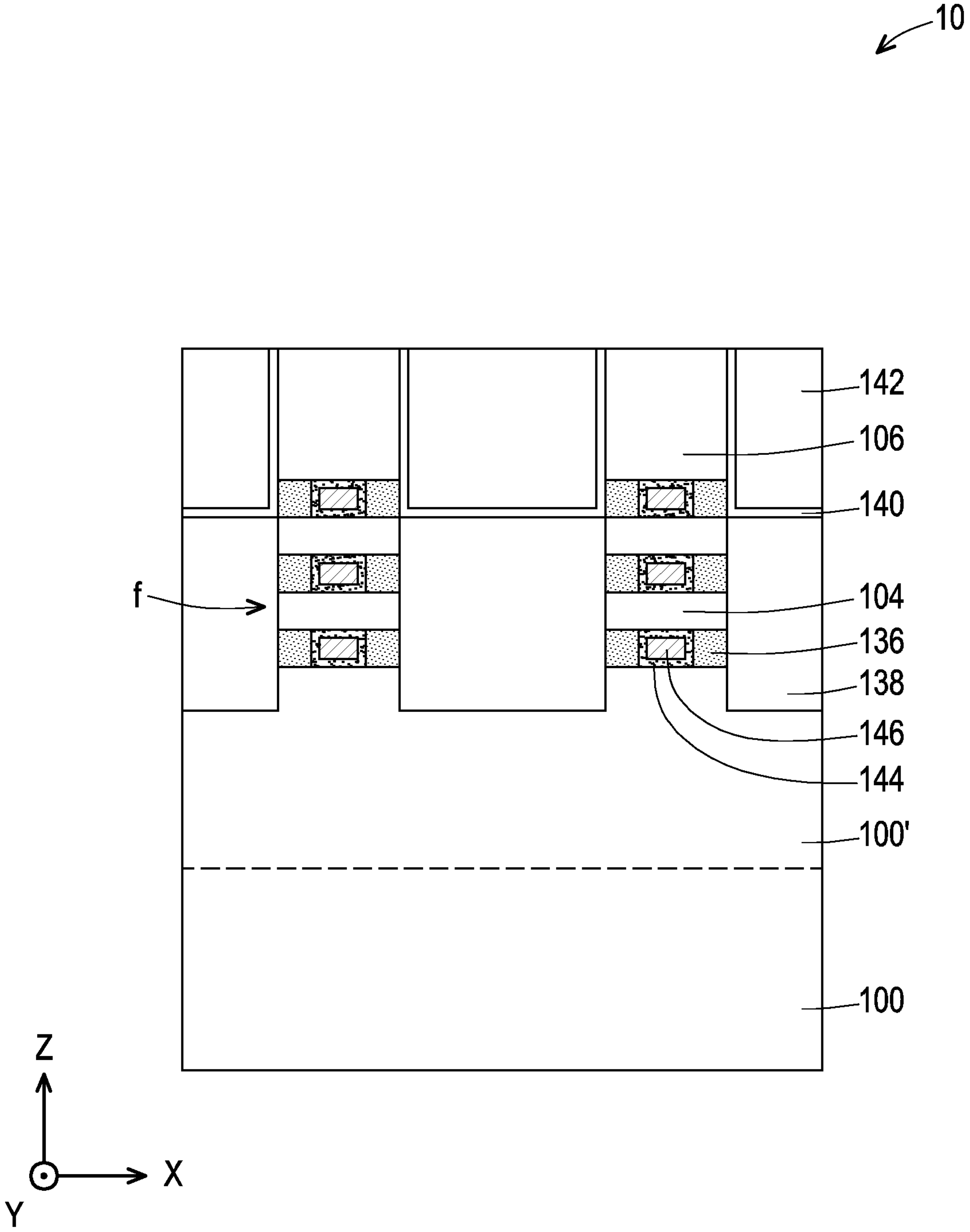
FIG. 6A and FIG. 6B respectively are schematic cross-sectional views along line A-A' and line B-B' shown in FIG. 1L.
Figure 6B:
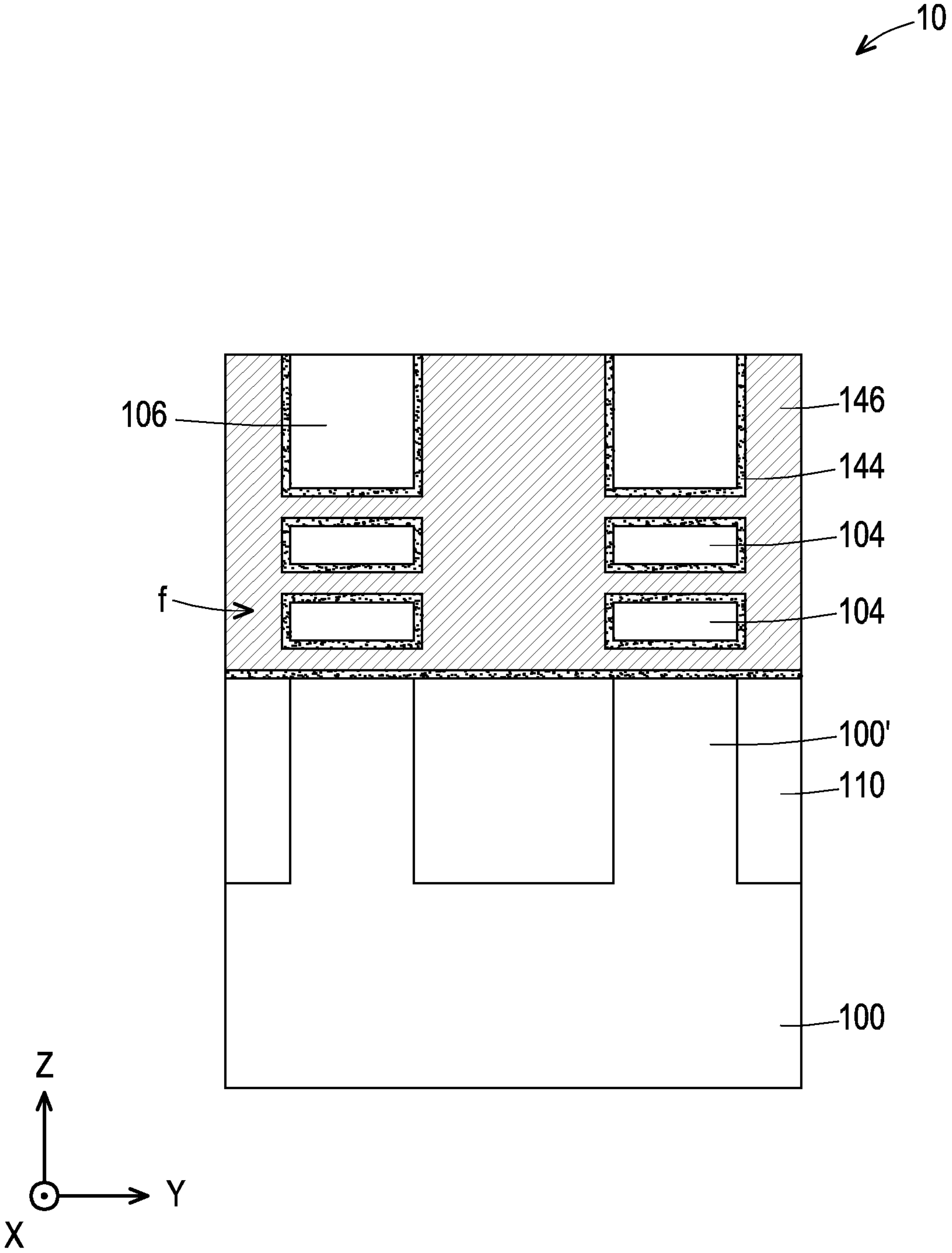
Figure 7A:
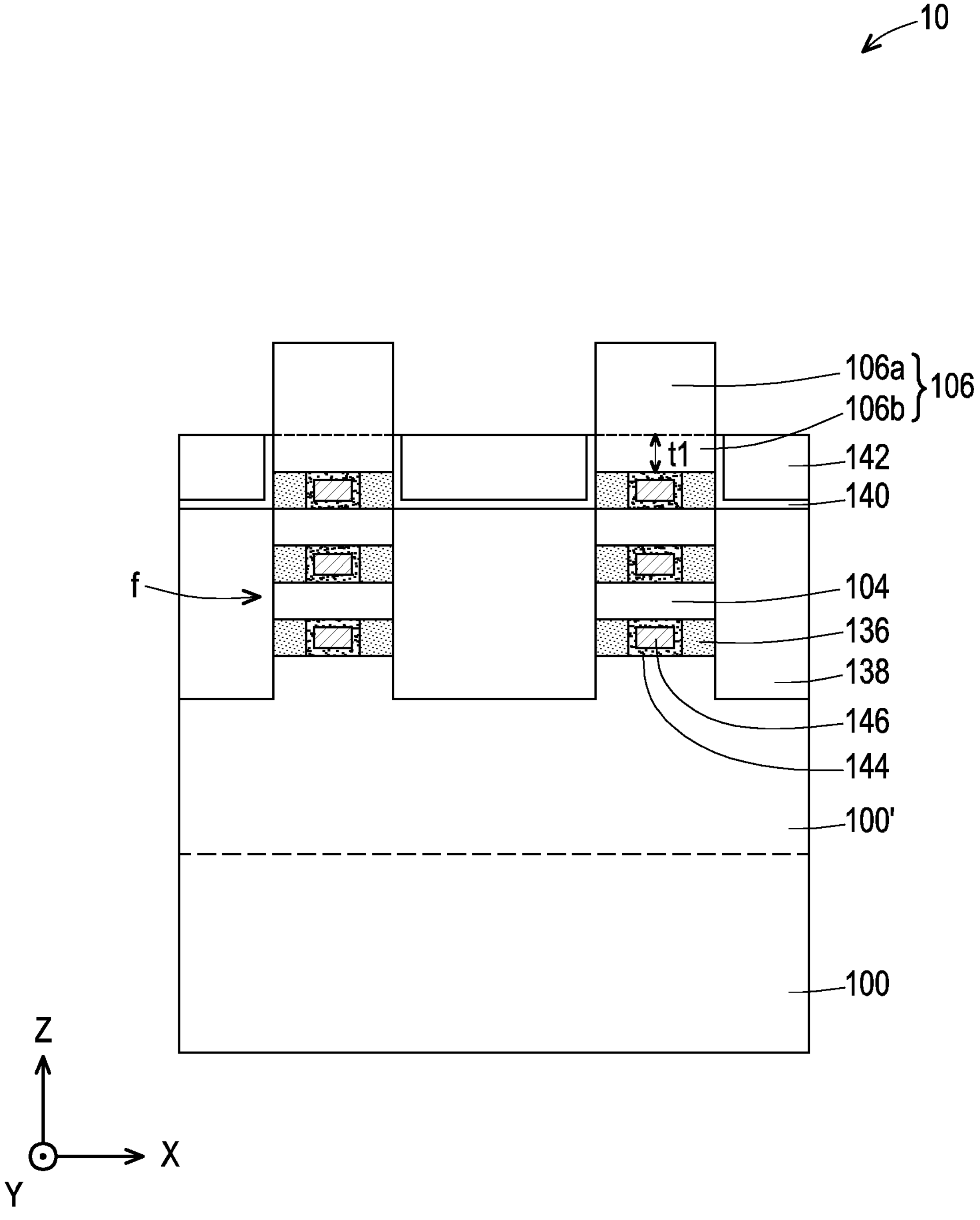
FIG. 7A and FIG. 7B respectively are schematic cross-sectional views along line A-A' and line B-B' shown in FIG. 1M.
Figure 7B:
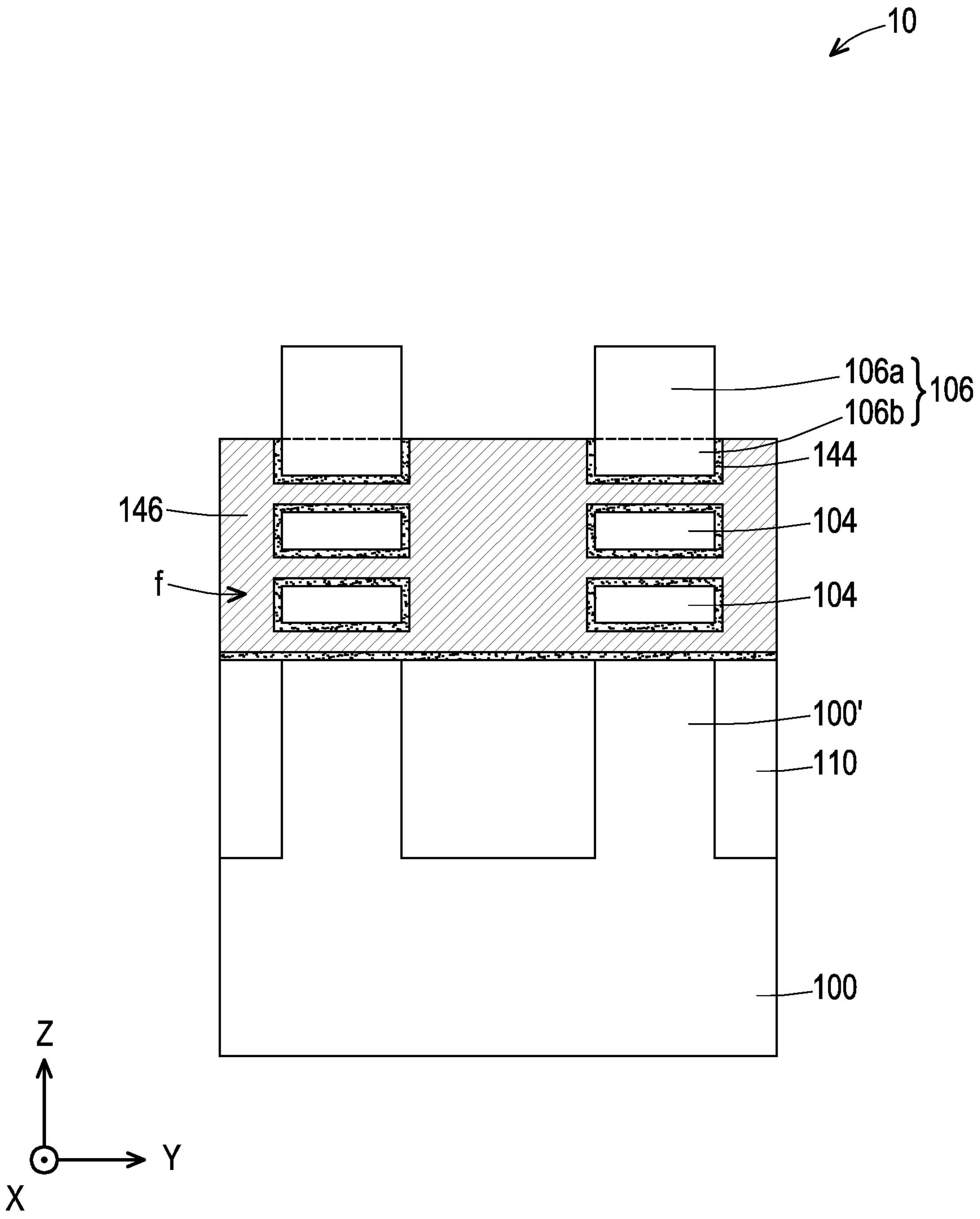
Figure 8A:
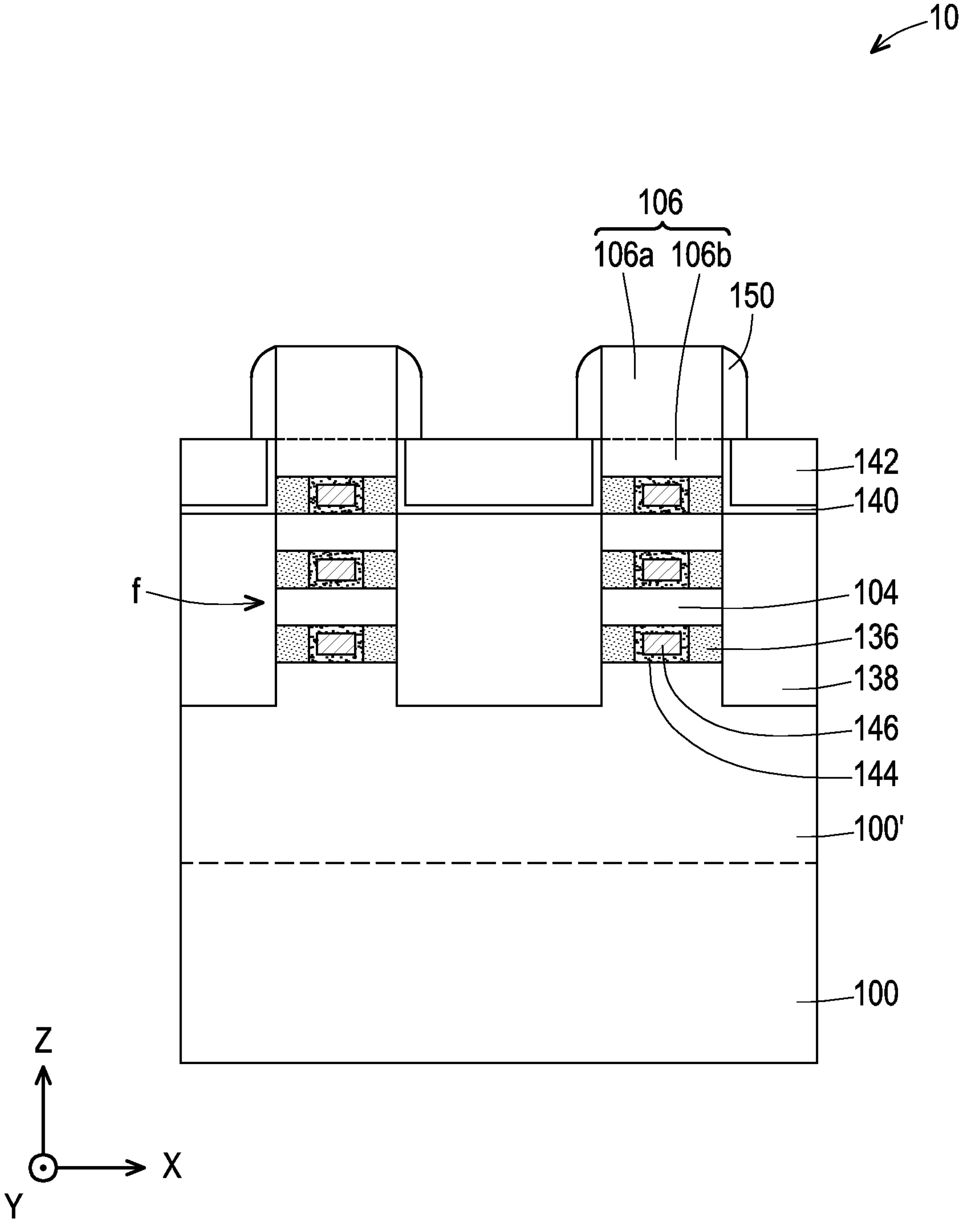
FIG. 8A and FIG. 8B respectively are schematic cross-sectional views along line A-A' and line B-B' shown in FIG. 1N.
Figure 8B:
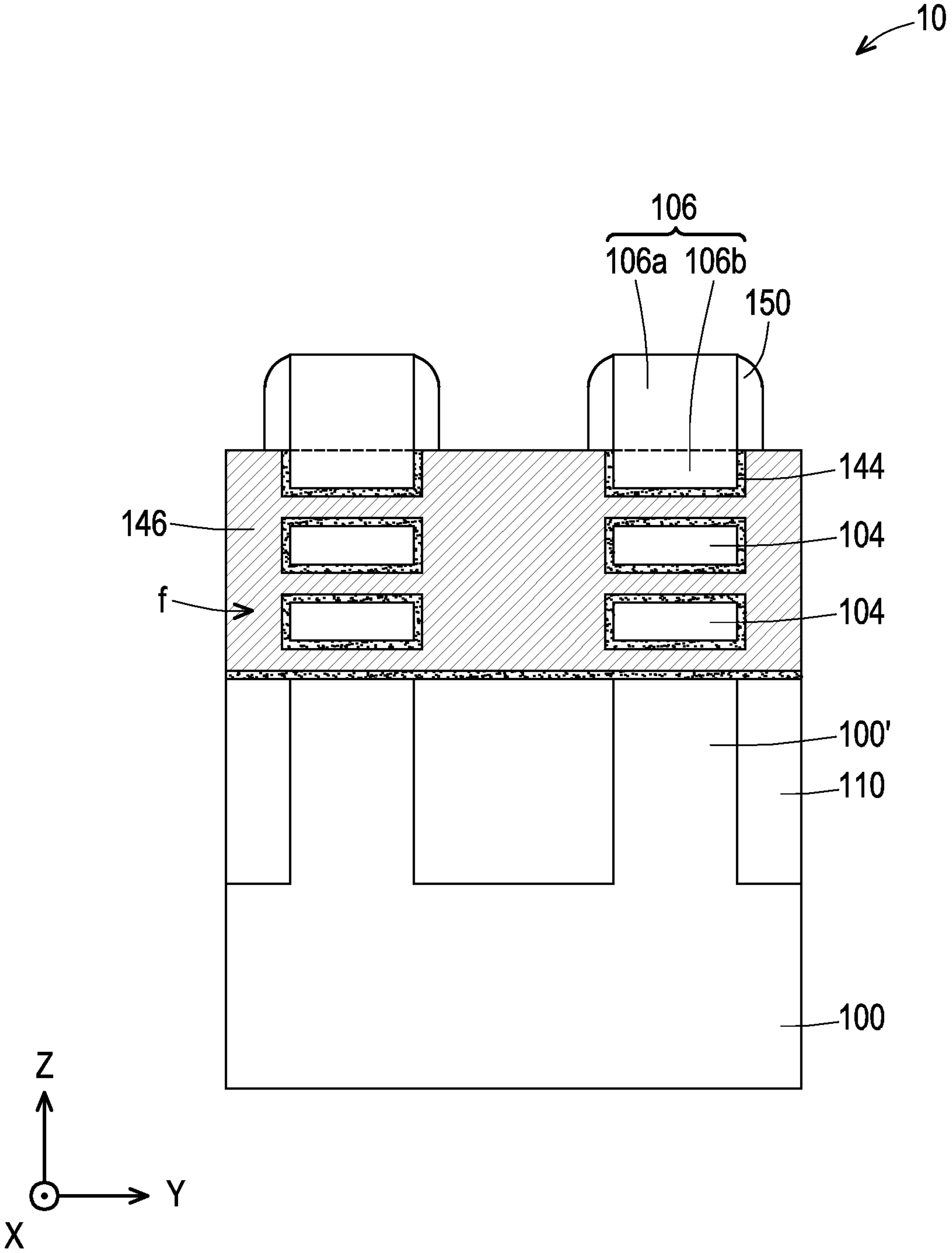
Figure 9A:
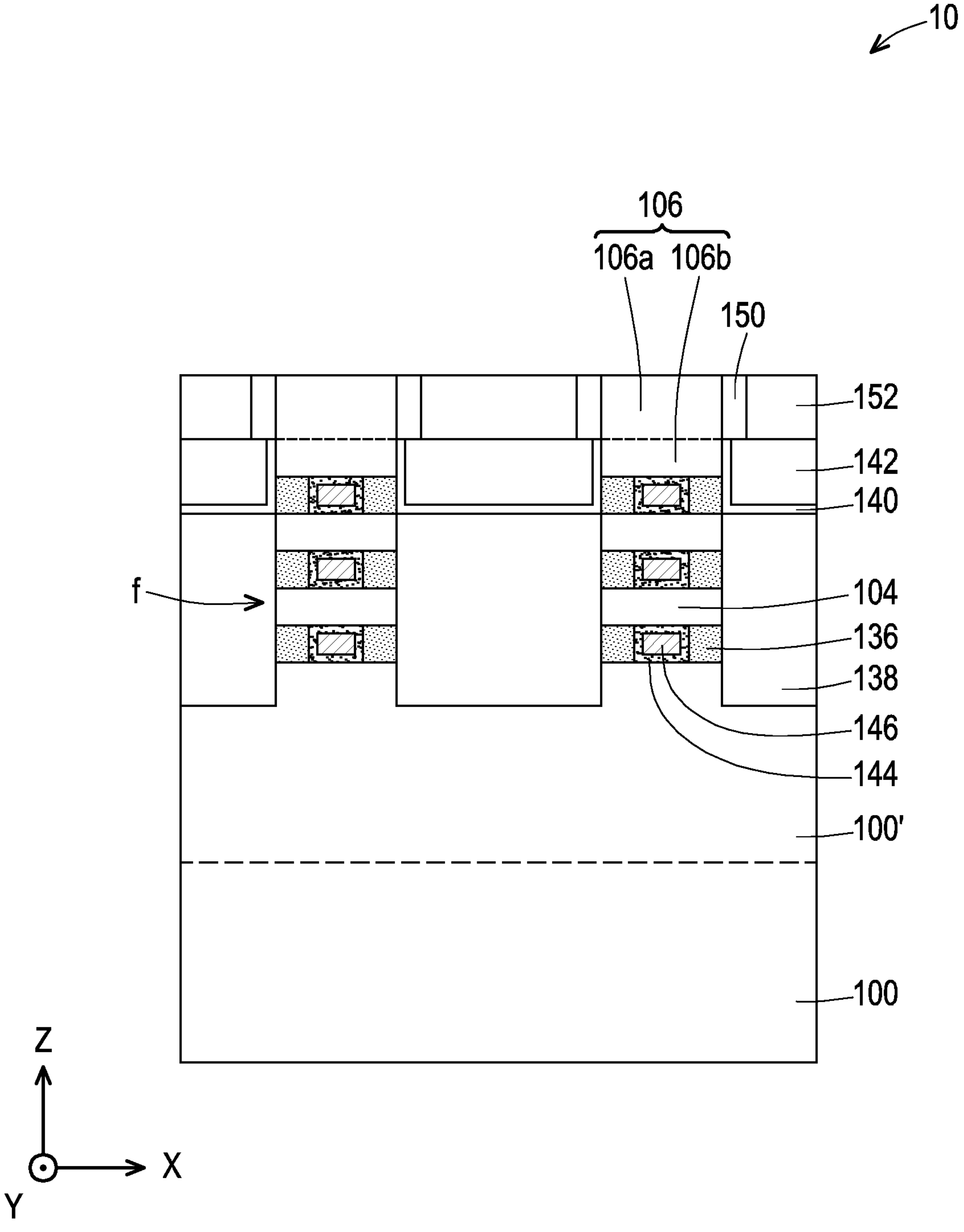
FIG. 9A and FIG. 9B respectively are schematic cross-sectional views along line A-A' and line B-B' shown in FIG. 1O.
Figure 9B:
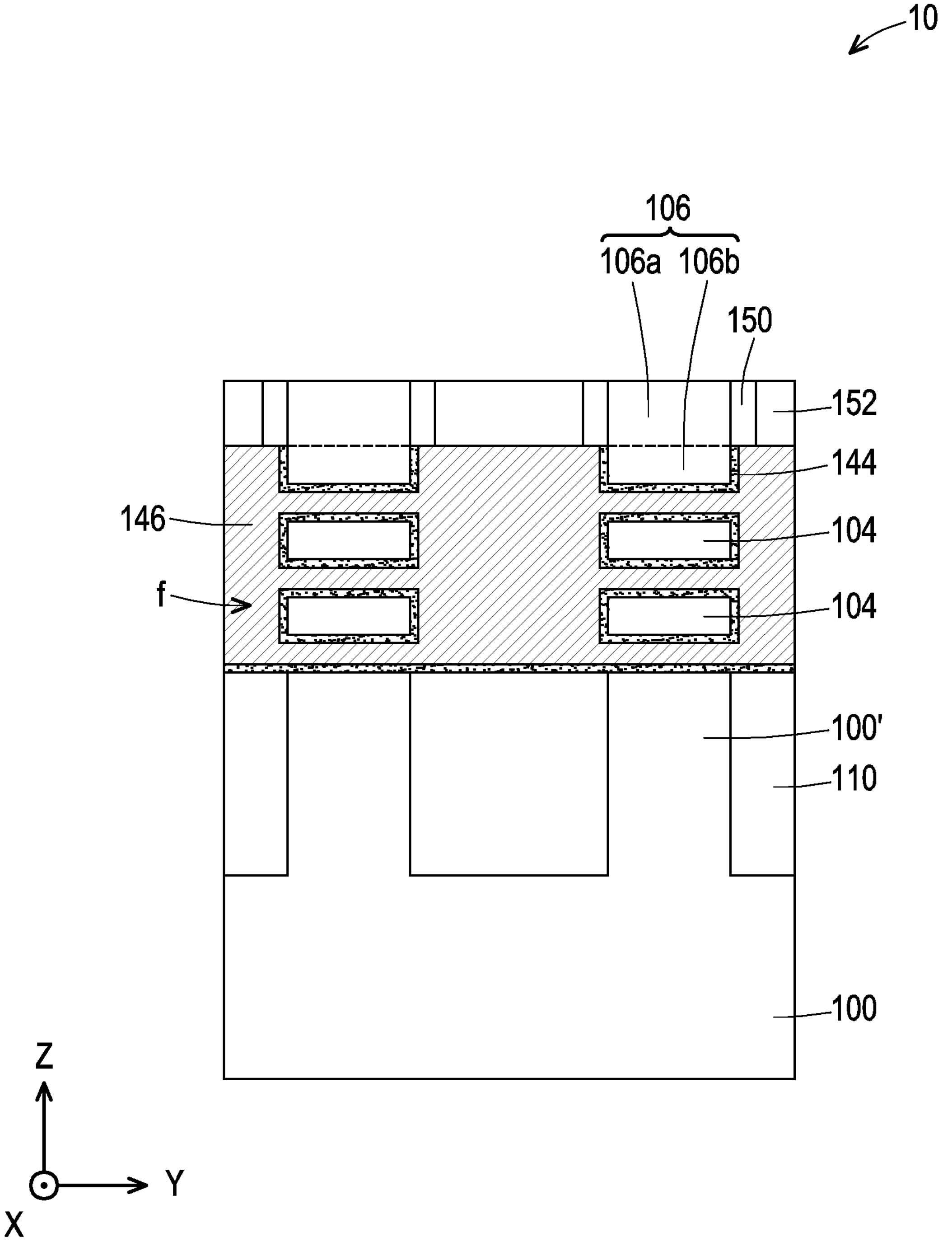
Figure 10A:
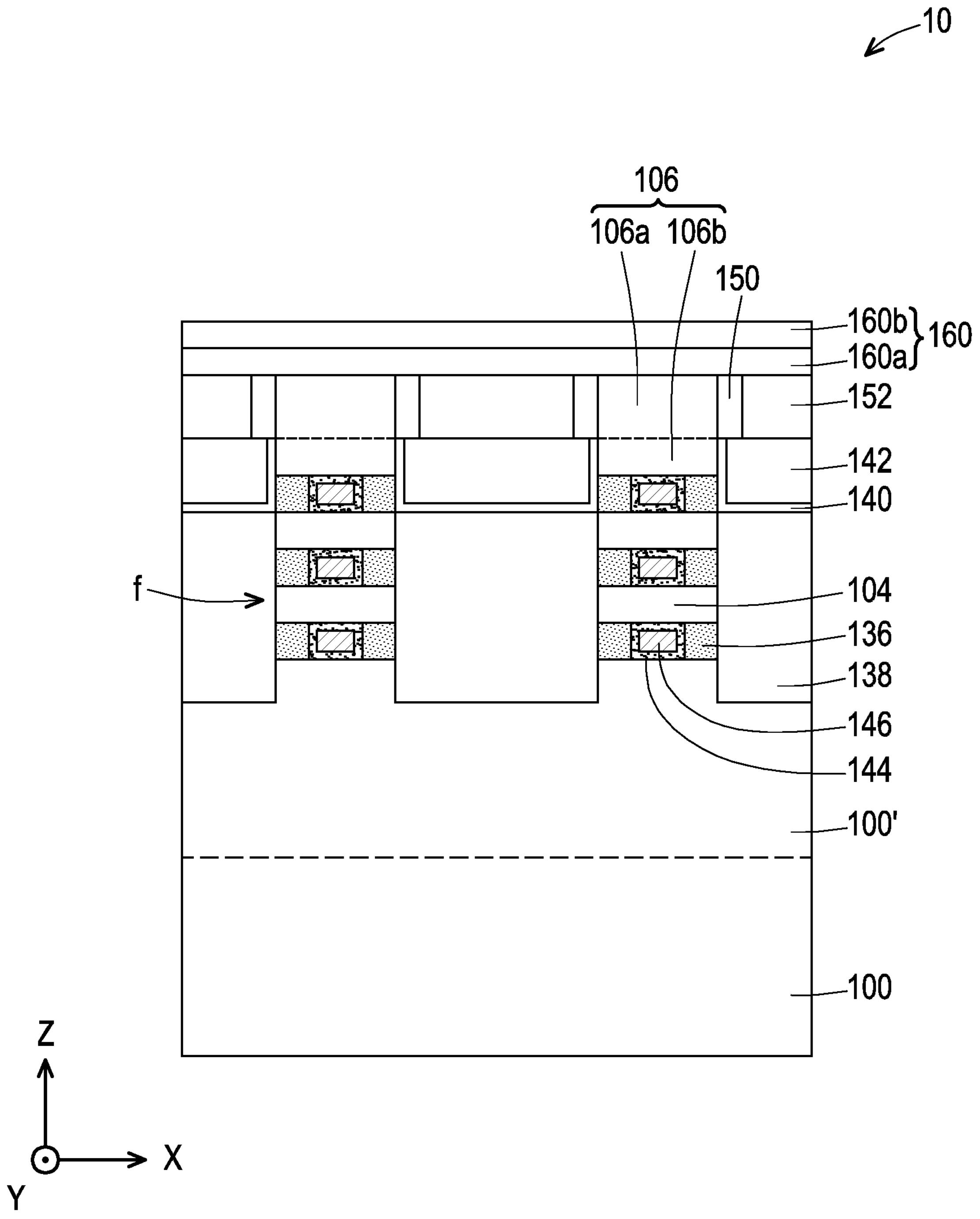
FIG. 10A and FIG. 10B respectively are schematic cross-sectional views along line A-A' and line B-B' shown in FIG. 1P.
Figure 10B:
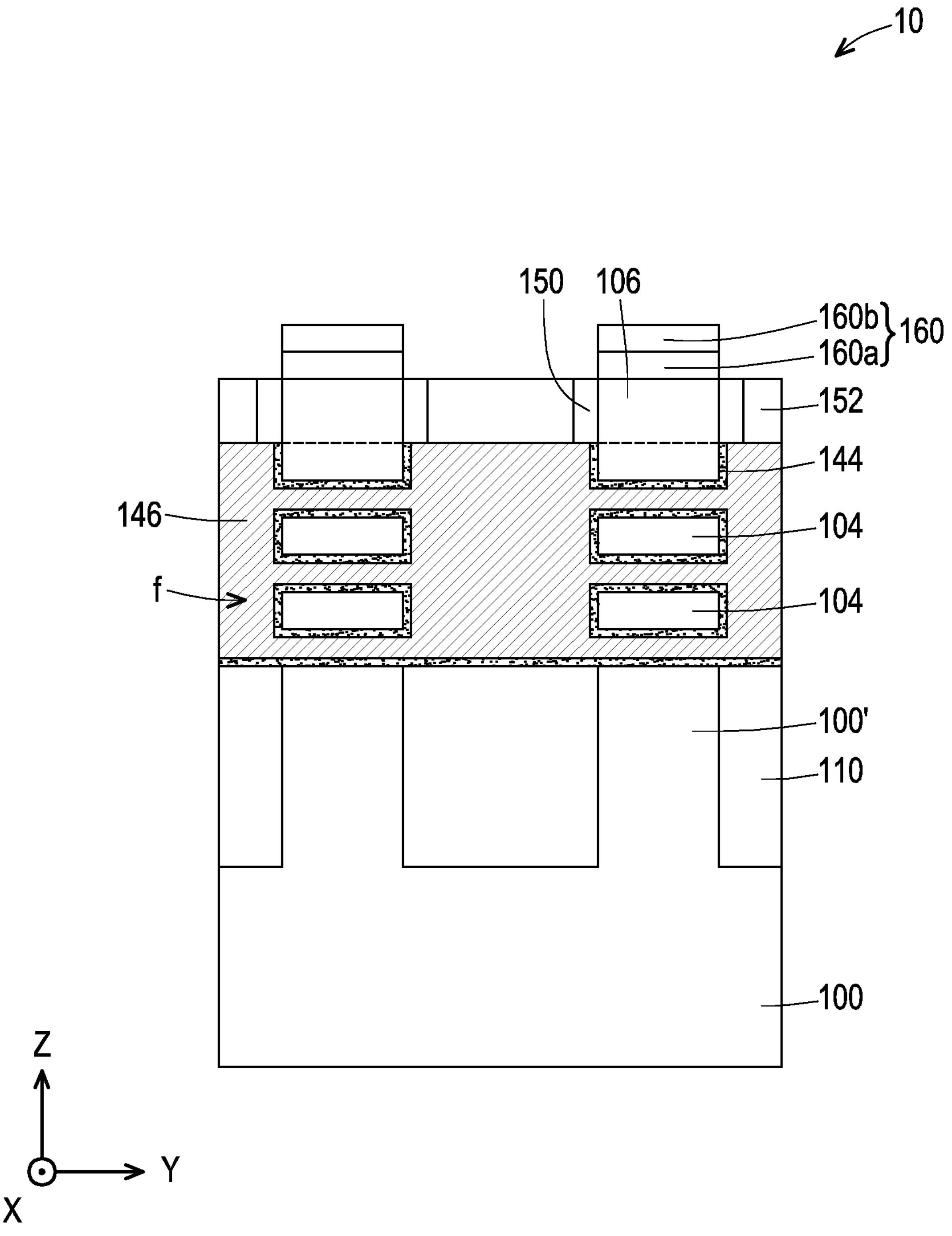
Figure 11A:
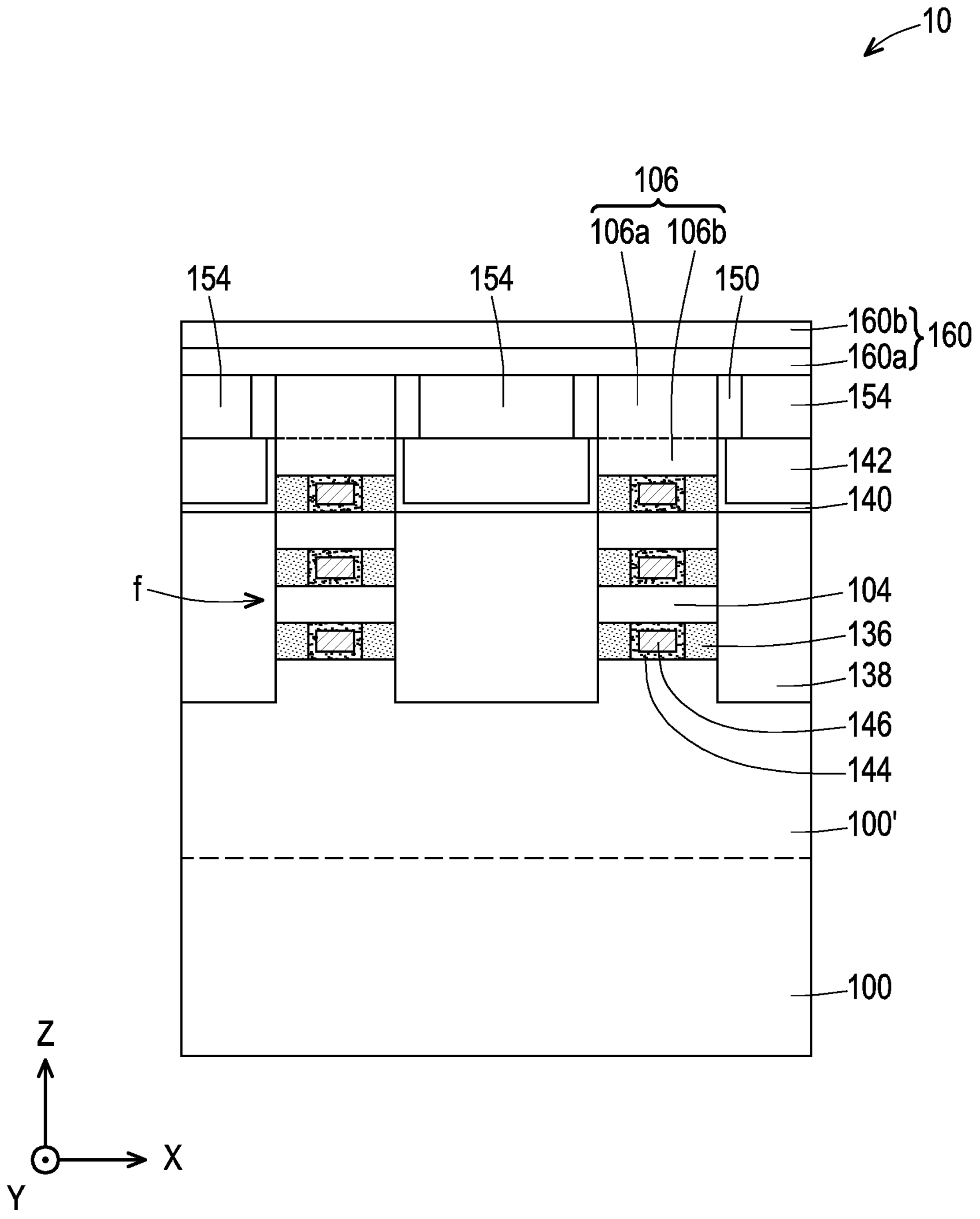
FIG. 11A FIG. 11B and FIG. 11C respectively are schematic cross-sectional views along line A-A', line B-B' and line C-C' shown in FIG. 1Q.
Figure 11B:
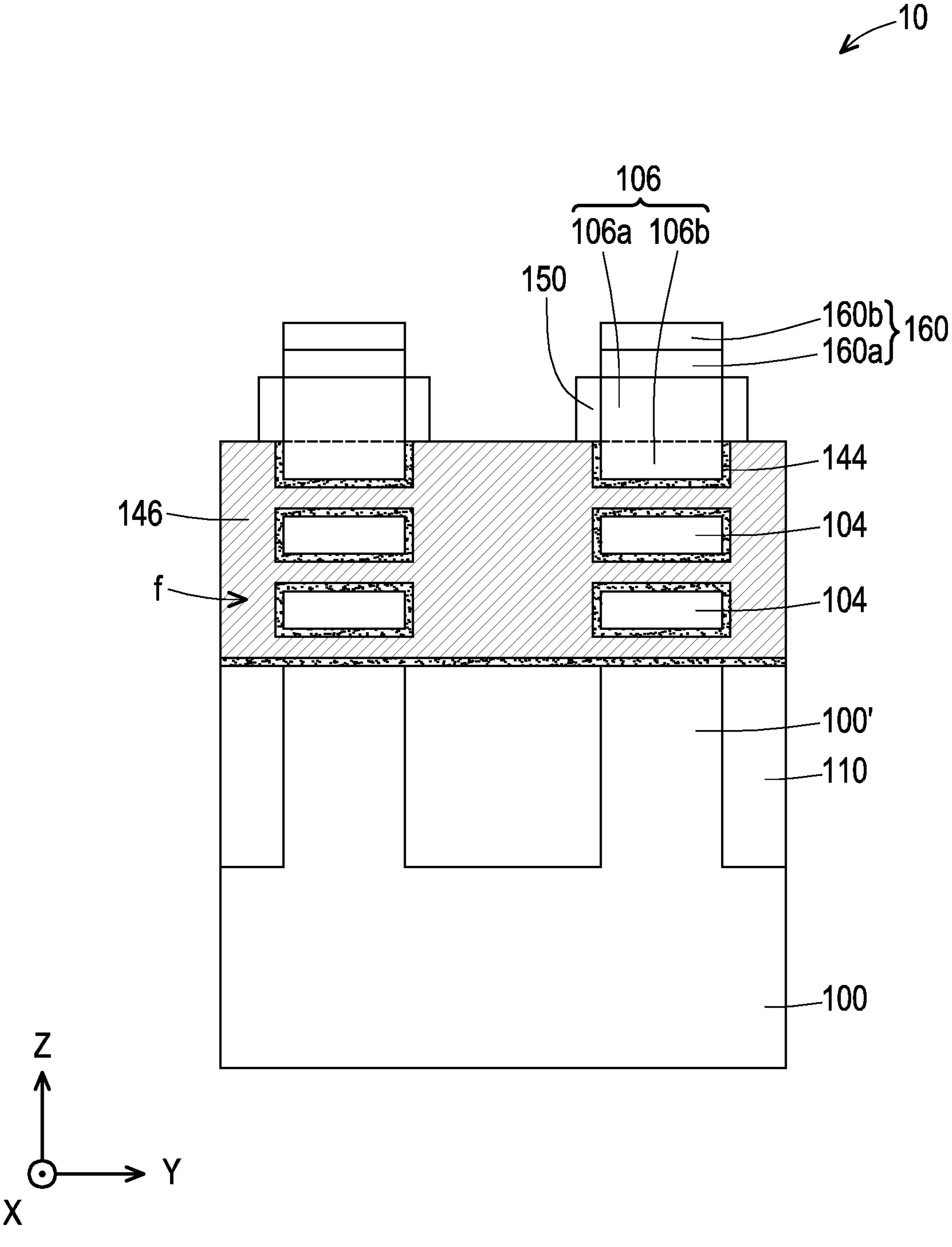
Figure 11C:
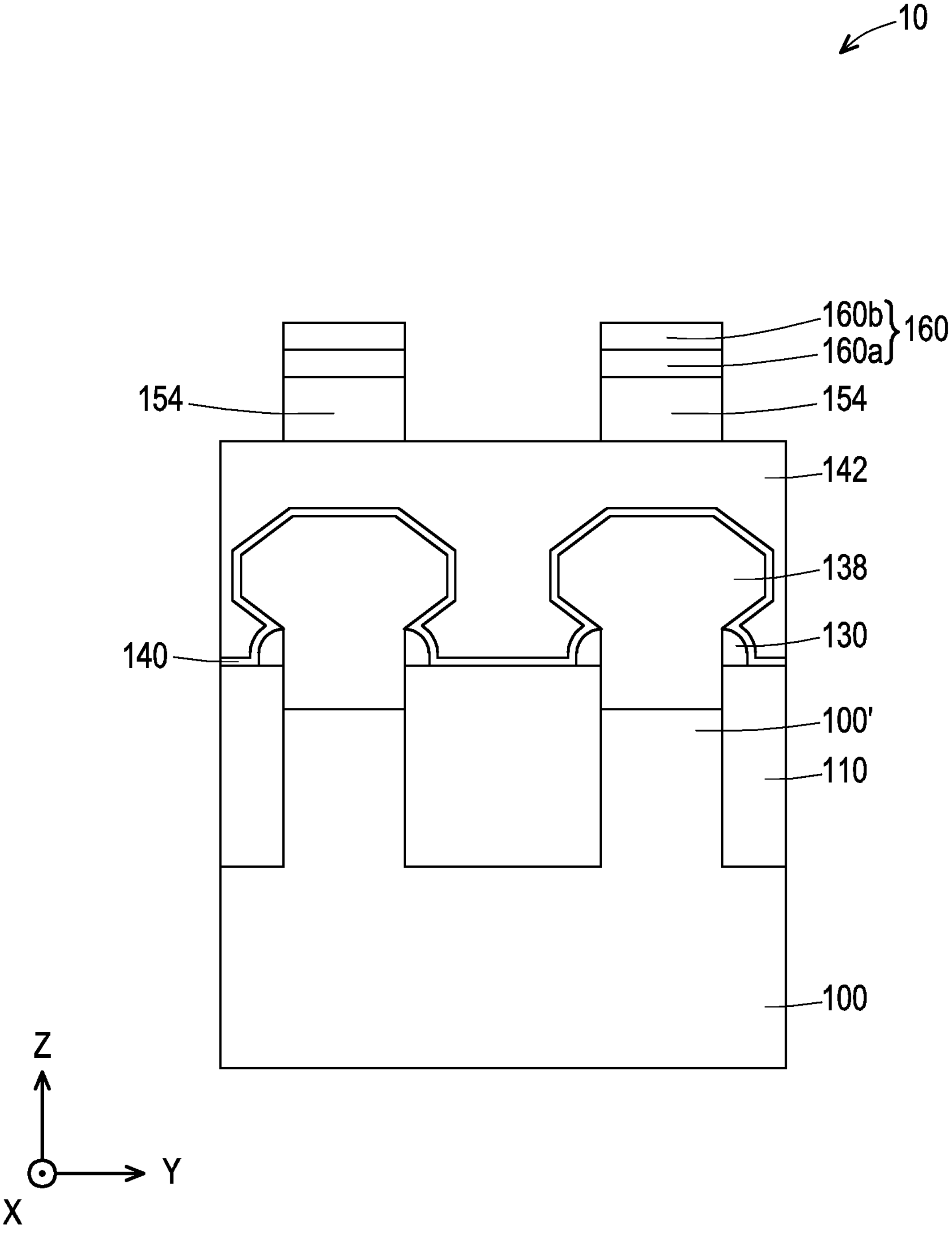
Figure 12A:
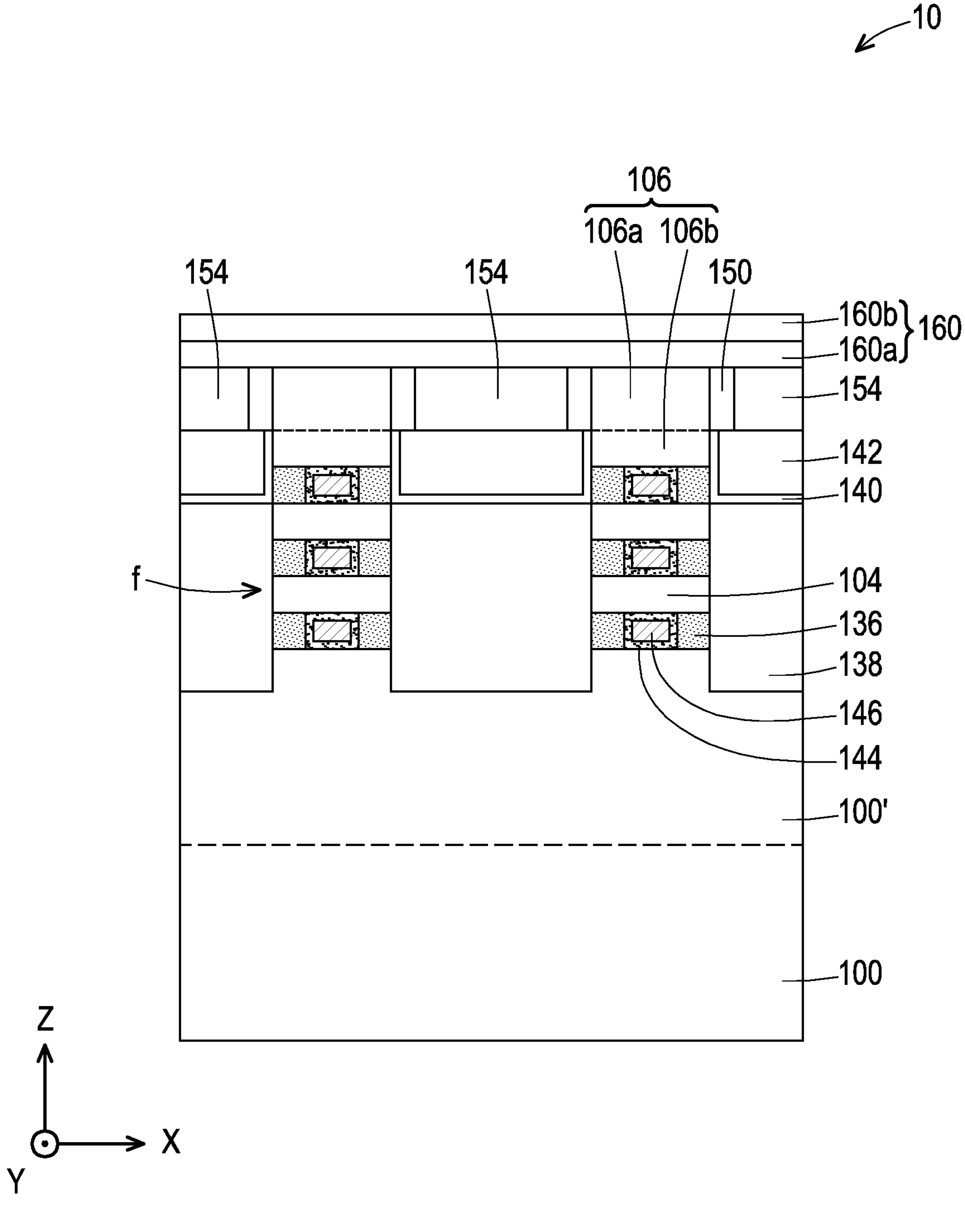
FIG. 12A, FIG. 12B and FIG. 12C respectively are schematic cross-sectional views along line A-A', line B-B' and line C-C' shown in FIG. 1R.
Figure 12B:
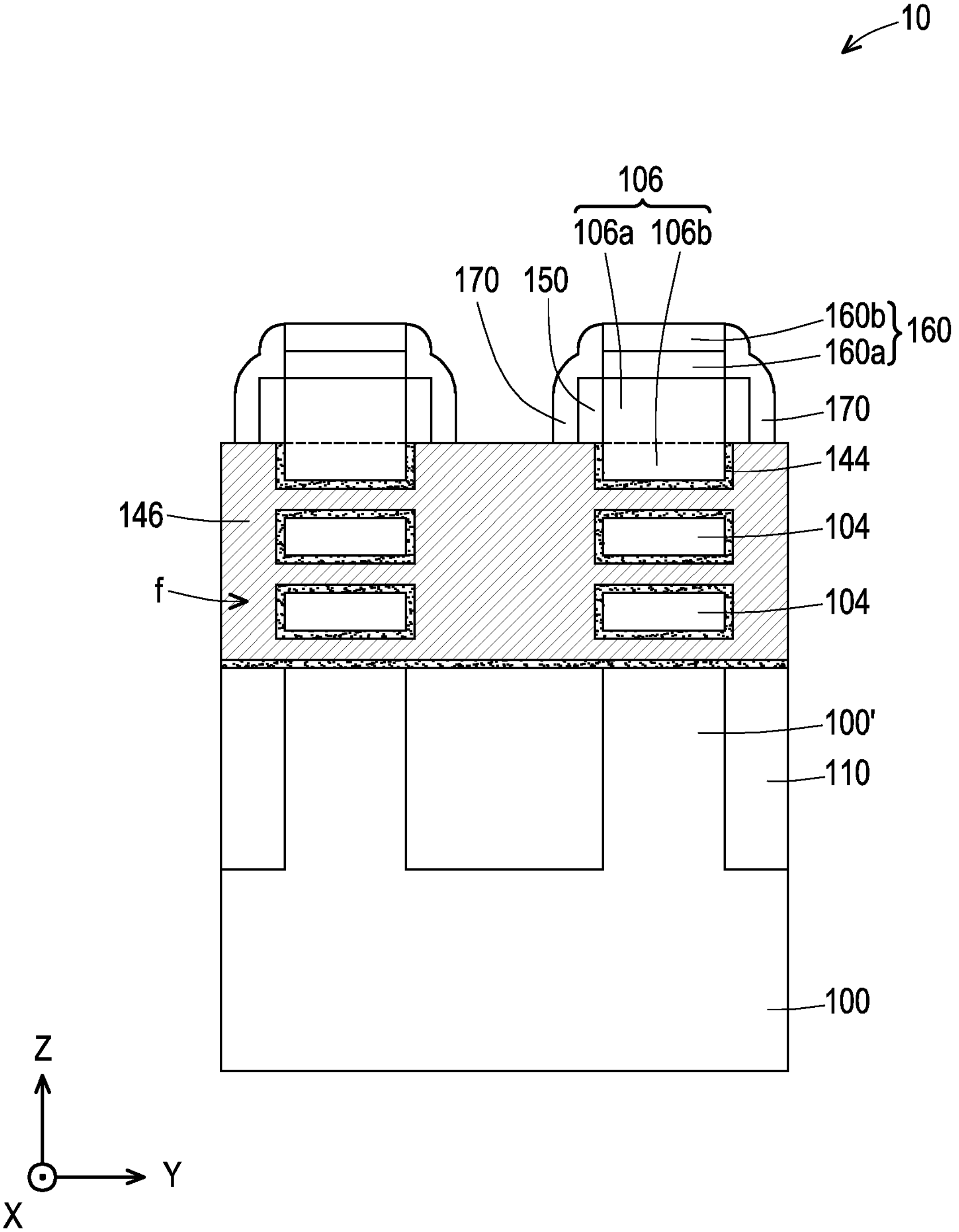
Figure 12C:
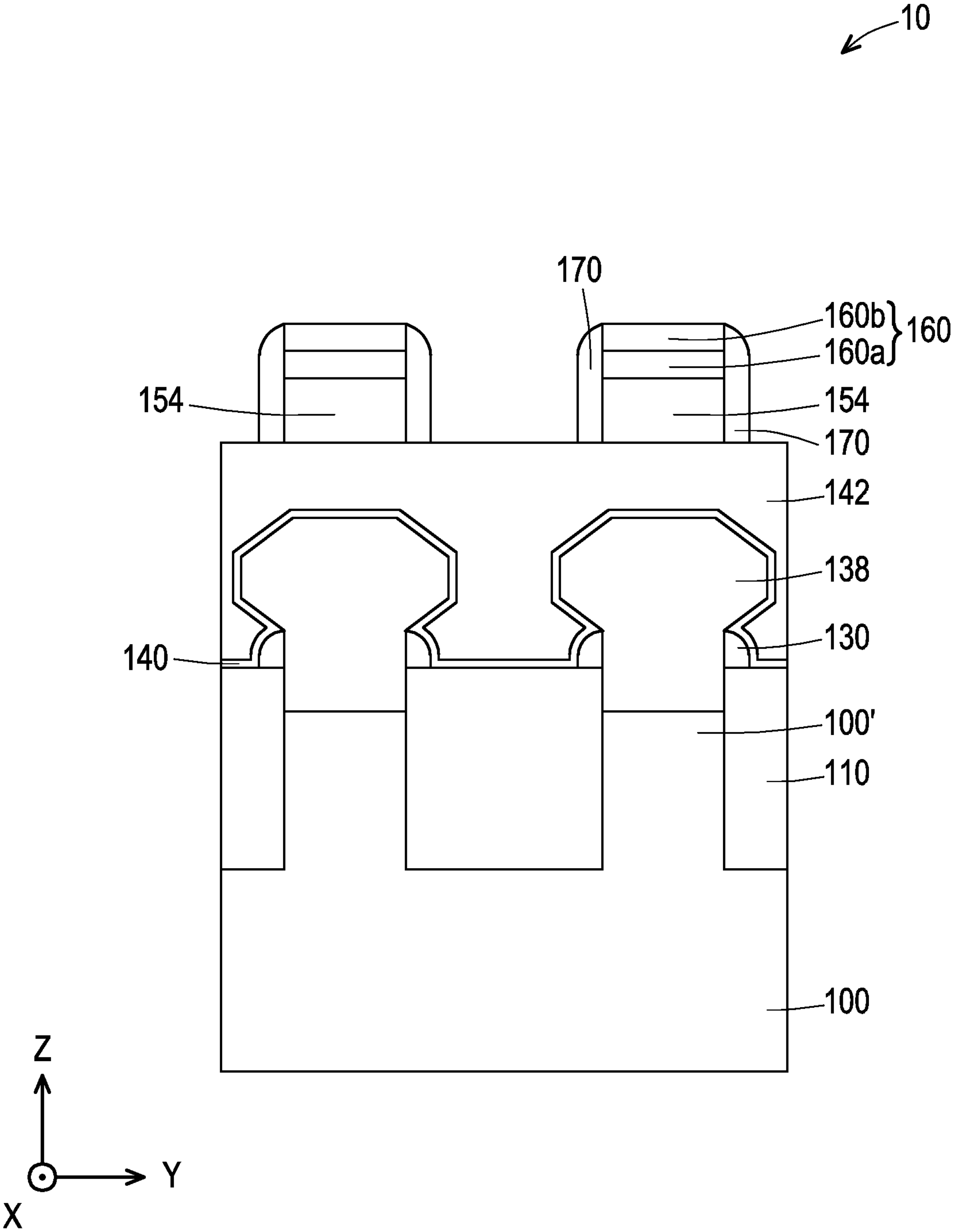
Figure 13A:
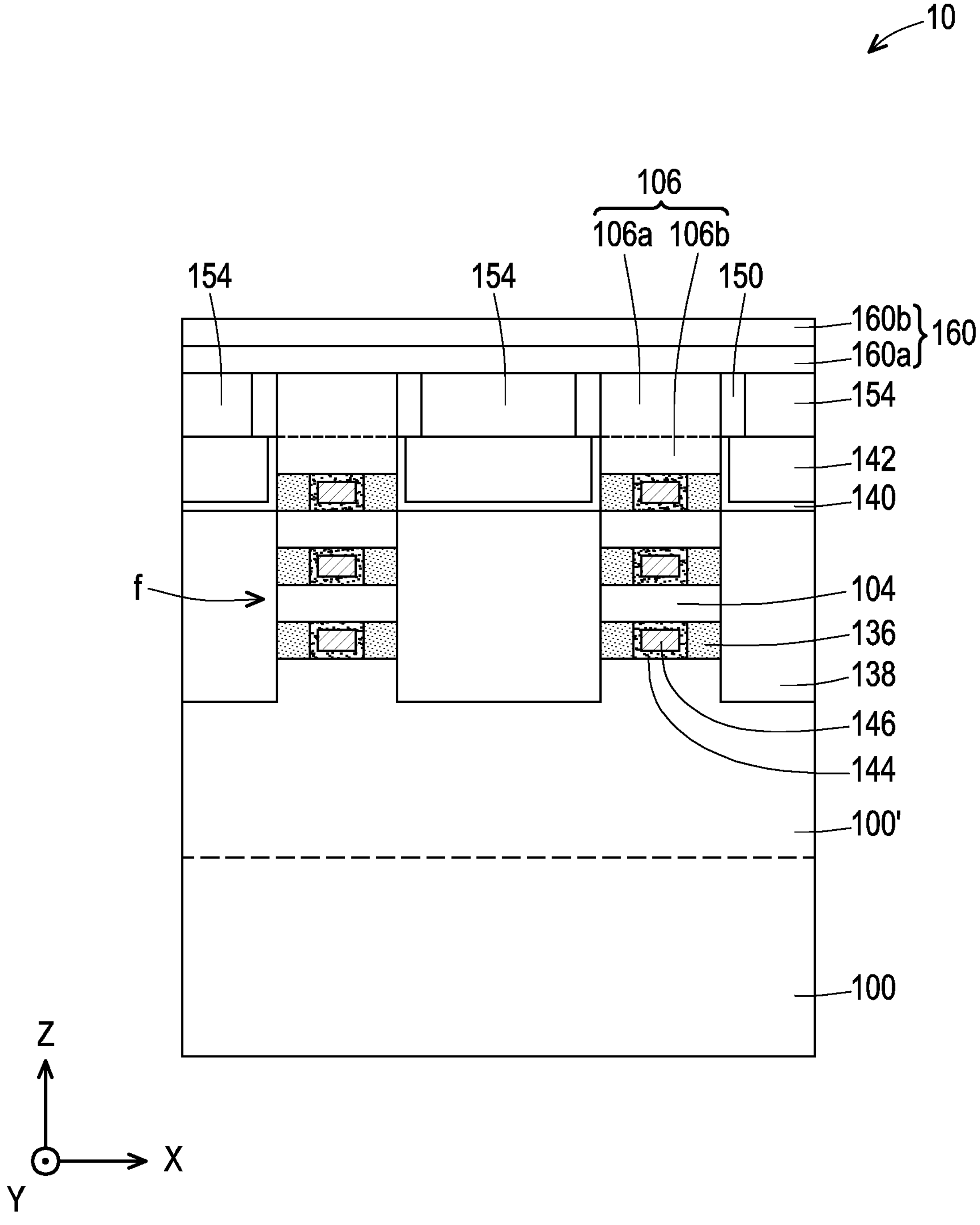
FIG. 13A, FIG. 13B and FIG. 13C respectively are schematic cross-sectional views along line A-A', line B-B' and line C-C' shown in FIG. 1S.
Figure 13B:
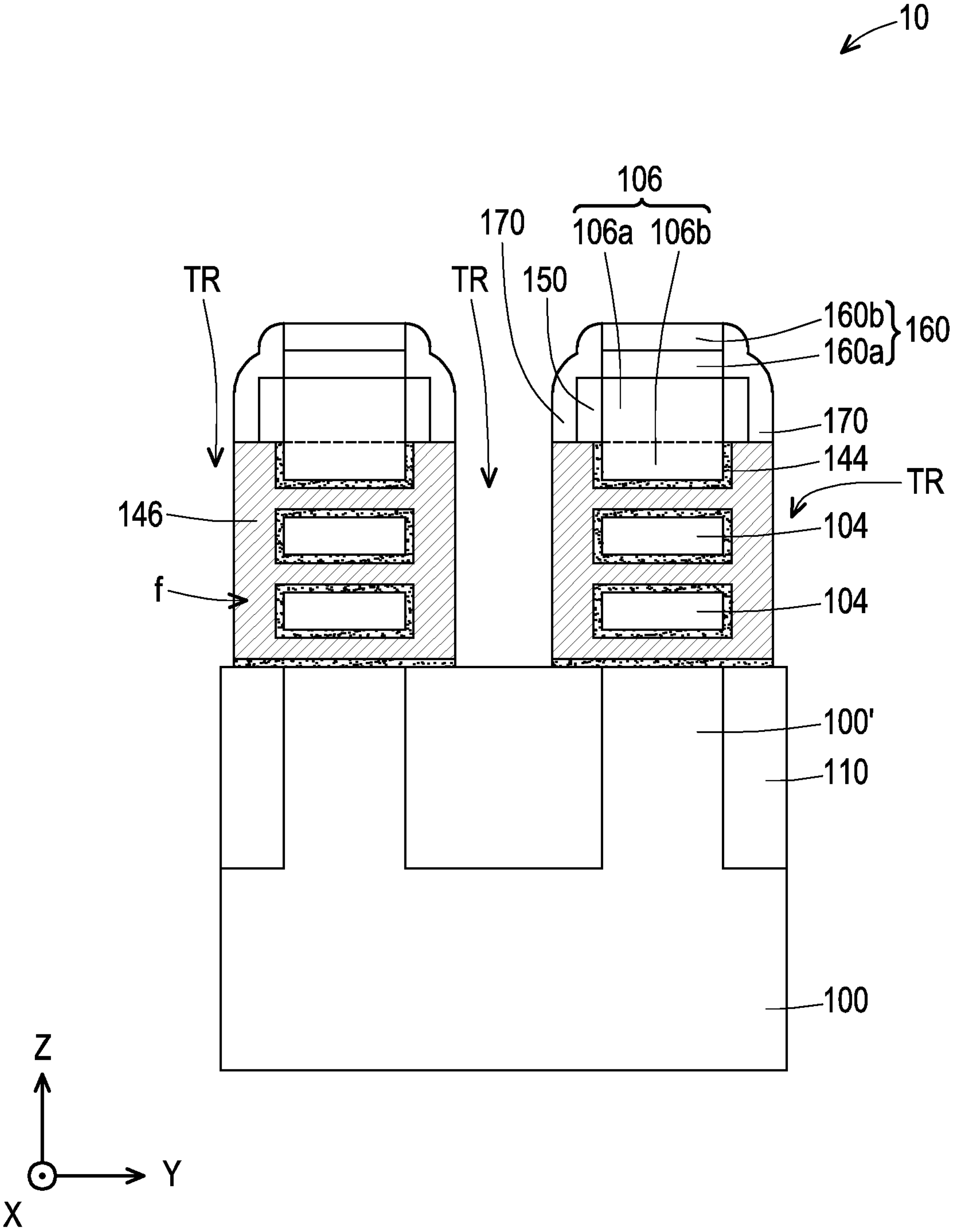
Figure 13C:
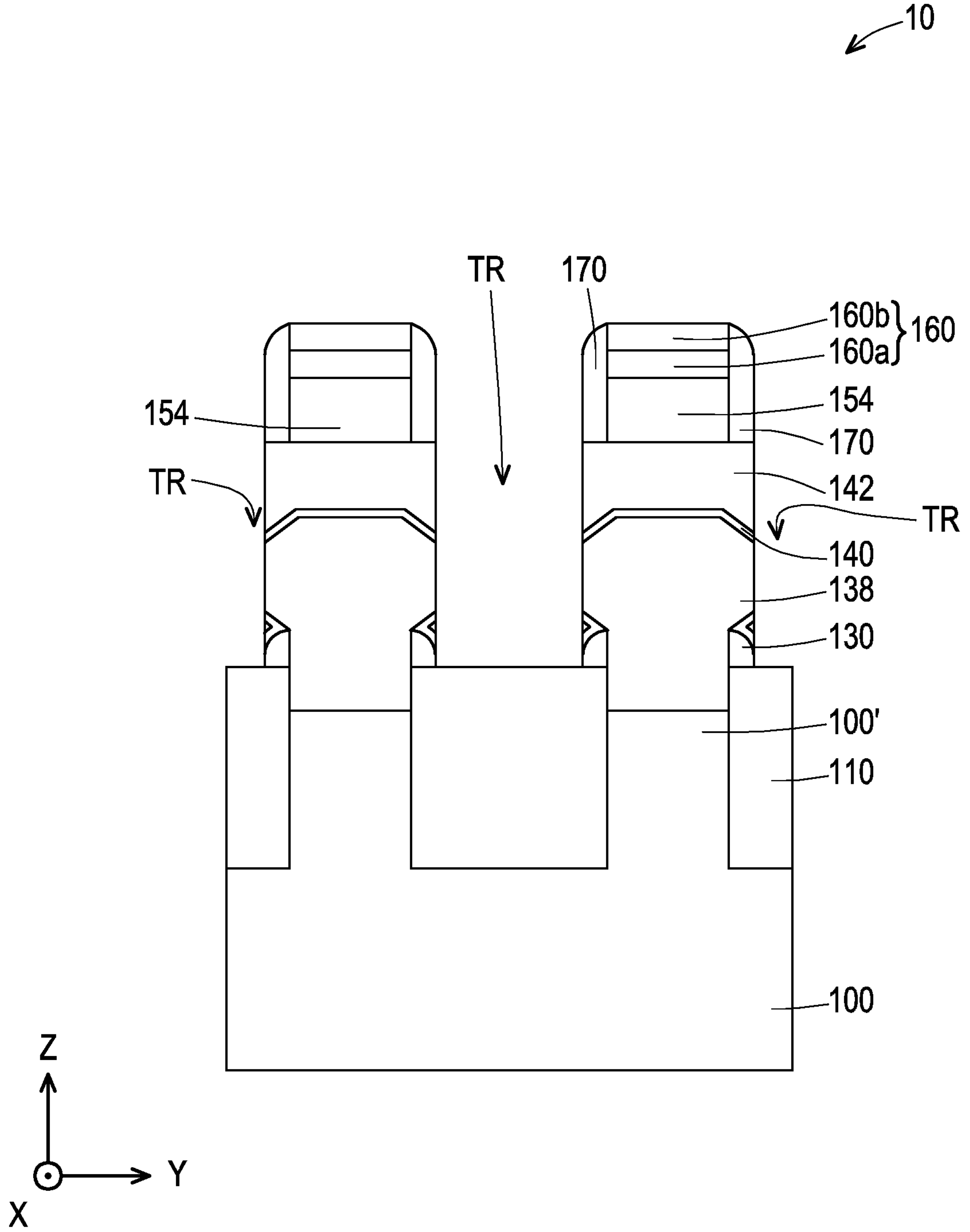

FIG. 1A through FIG. 1U are schematic perspective views of various stages in a manufacturing method of a semiconductor device 10 in accordance with some embodiments of the disclosure. FIG. 2 is a schematic cross-sectional view along line A-A' shown in FIG. 1H. FIG. 3 is a schematic cross-sectional view along line A-A' shown in FIG. 1I. FIG. 4A and FIG. 4B respectively are schematic cross-sectional views along line A-A' and line B-B' shown in FIG. 1J. FIG. 5A and FIG. 5B respectively are schematic cross-sectional views along line A-A' and line B-B' shown in FIG. 1K. FIG. 6A and FIG. 6B respectively are schematic cross-sectional views along line A-A' and line B-B' shown in FIG. 1L. FIG. 7A and FIG. 7B respectively are schematic cross-sectional views along line A-A' and line B-B' shown in FIG. 1M. FIG. 8A and FIG. 8B respectively are schematic cross-sectional views along line A-A' and line B-B' shown in FIG. 1N. FIG. 9A and FIG. 9B respectively are schematic cross-sectional views along line A-A' and line B-B' shown in FIG. 1O. FIG. 10A and FIG. 10B respectively are schematic cross-sectional views along line A-A' and line B-B' shown in FIG. 1P. FIG. 11A FIG. 11B and FIG. 11C respectively are schematic cross-sectional views along line A-A', line B-B' and line C-C' shown in FIG. 1Q. FIG. 12A, FIG. 12B and FIG. 12C respectively are schematic cross-sectional views along line A-A', line B-B' and line C-C' shown in FIG. 1R. FIG. 13A, FIG. 13B and FIG. 13C respectively are schematic cross-sectional views along line A-A', line B-B' and line C-C' shown in FIG. 1S.

Figure 14A:
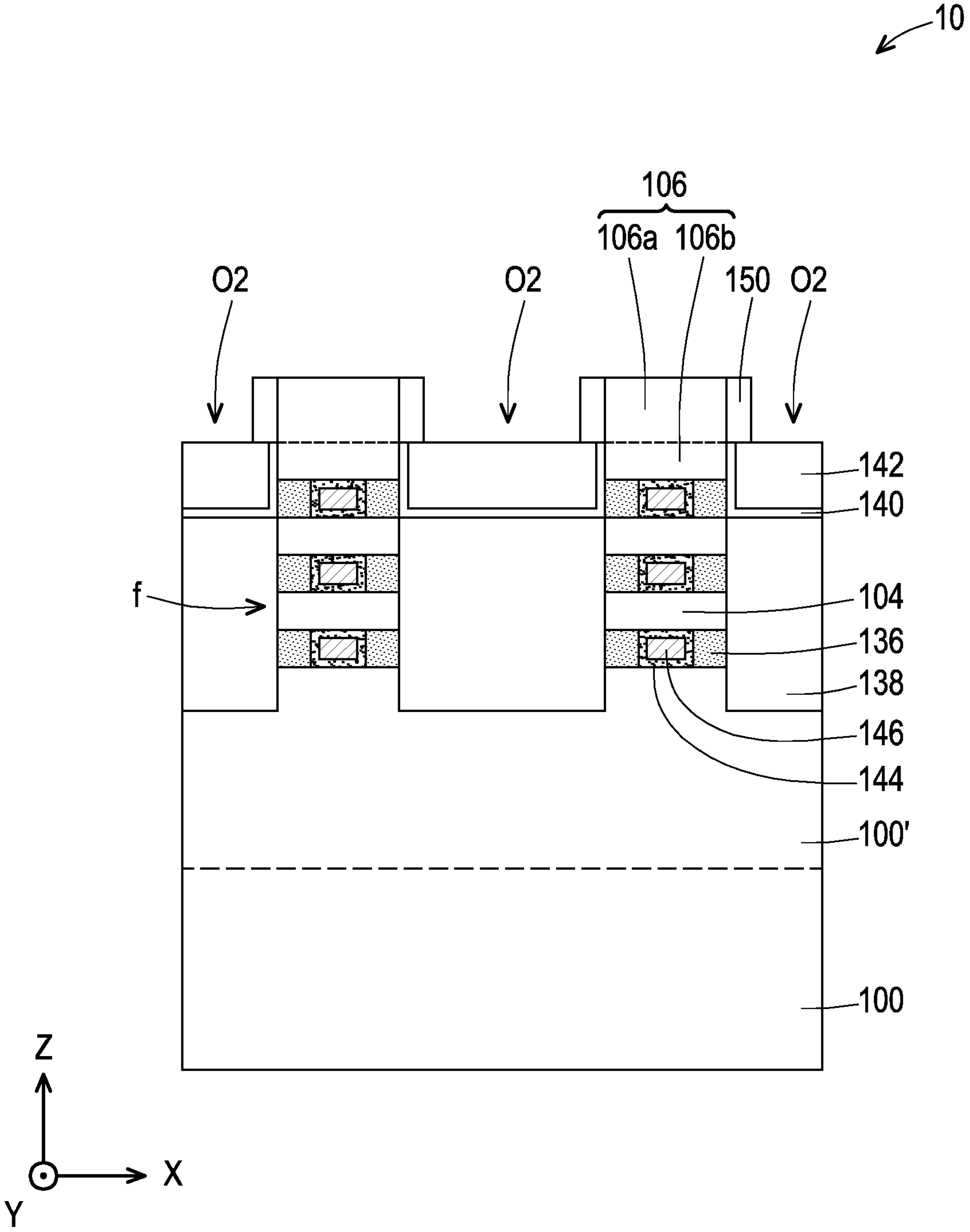
FIG. 14A, FIG. 14B and FIG. 14C respectively are schematic cross-sectional views along line A-A', line B-B' and line C-C' shown in FIG. 1T.
Figure 14B:
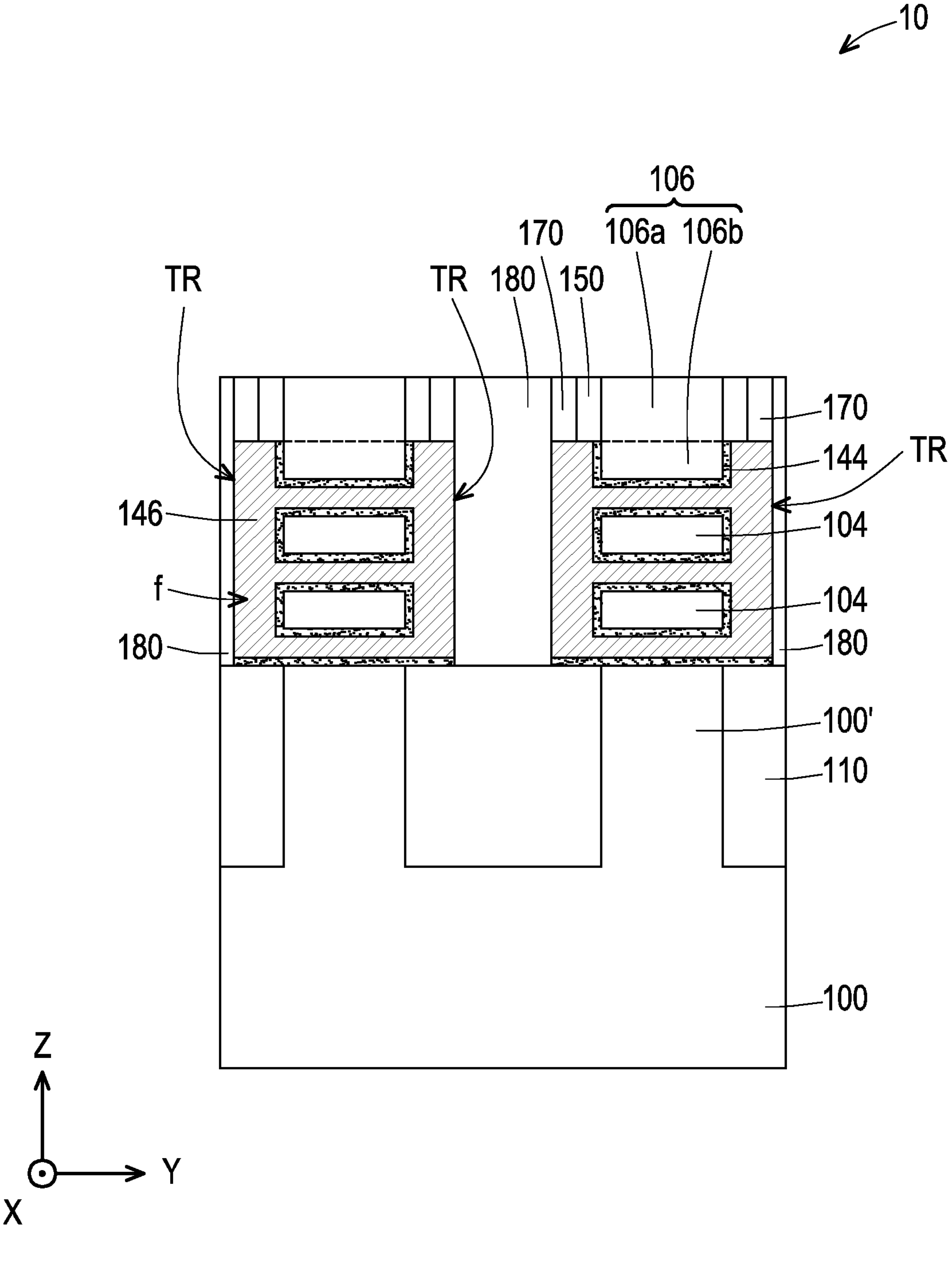
Figure 14C:
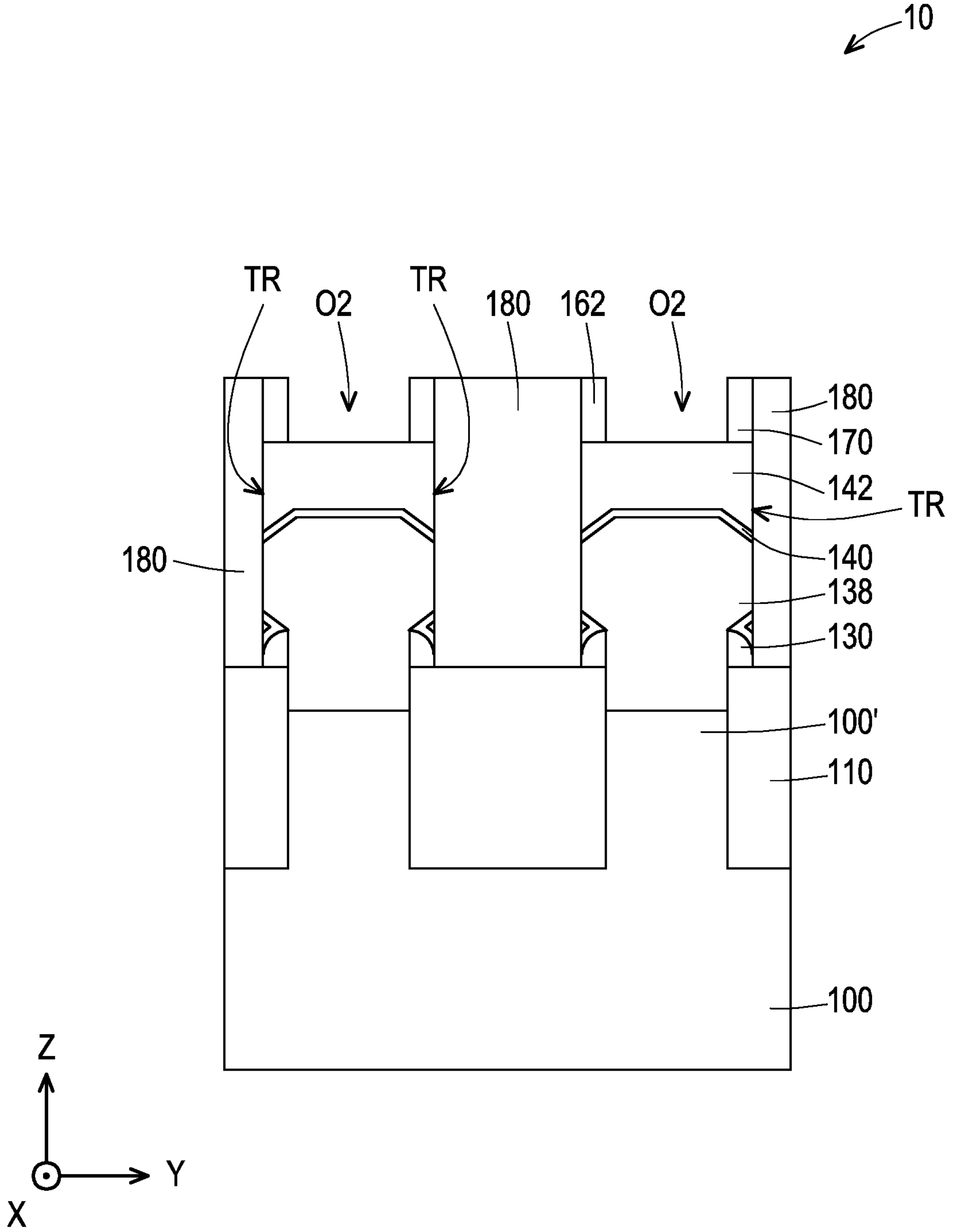

FIG. 14A, FIG. 14B and FIG. 14C respectively are schematic cross-sectional views along line A-A', line B-B' and line C-C' shown in FIG. 1T. FIG. 15A, FIG. 15B, FIG. 15C and FIG. 15D respectively are schematic cross-sectional views along line A-A', line B-B', line C-C' and line D-D' shown in FIG. 1U.

It is understood that additional operations can be provided before, during, and after the operations shown by FIGS. 1A-1U, and some of the operations described below can be replaced or eliminated, for additional embodiments of the method. The order of the operations/processes may be interchangeable.

The semiconductor device 10 may be an intermediate device fabricated during processing of an integrated circuit (IC), or a portion thereof, that may comprise static random-access memory (SRAM) and/or other logic circuits, passive components such as resistors, capacitors, and inductors, and active components such as p-type field-effect transistors (PFETs), n-type FETs (NFETs), fin-like FETs (FinFETs), metal-oxide semiconductor field effect transistors (MOSFET), complementary metal-oxide semiconductor (CMOS) transistors, bipolar transistors, high voltage transistors, high frequency transistors, and/or other memory cells. The semiconductor device 10 can be a portion of a core region (often referred to as a logic region), a memory region (such as a static random access memory (SRAM) region), an analog region, a peripheral region (often referred to as an input/output (I/O) region), a dummy region, other suitable region, or combinations thereof, of an IC. In some embodiments, the semiconductor device 10 may be a portion of an IC chip, a system on chip (SoC), or portion thereof. The present disclosure is not limited to any particular number of devices or device regions, or to any particular device configurations.

Referring to FIG. 1A, a substrate (wafer) 100 is provided. In the depicted embodiment, the substrate 100 is a bulk substrate that includes silicon. Alternatively or additionally, the bulk substrate includes another elementary semiconductor, such as germanium; a compound semiconductor, such as silicon carbide, silicon phosphide, gallium arsenide, gallium phosphide, indium phosphide, indium arsenide, indium antimonide, zinc oxide, zinc selenide, zinc sulfide, zinc telluride, cadmium selenide, cadnium sulfide, and/or cadmium telluride; an alloy semiconductor, such as SiGe, SiPC, GaAsP, AlInAs, AlGaAs, GaInAs, GaInP, and/or GaInAsP; other group III-V materials; other group II-IV materials; or combinations thereof. In some embodiments, the substrate 100 is doped with a p-type or n-type dopant of a dopant concentration about $1\times10^{15}$ atoms/cm$^{-3}$ to about $1\times10^{19}$ atoms/cm$^{-3}$.

The substrate 100 may include various doped regions. In some embodiments, the substrate 100 includes n-type doped regions (for example, n-type wells) doped with n-type dopants, such as phosphorus (for example, $^{31}P$), arsenic, other n-type dopant, or combinations thereof. In some embodiments, the substrate 100 includes p-type doped region (for example, p-type wells) doped with p-type dopants, such as boron (for example, $^{11}B$, $BF_2$), indium, other p-type dopant, or combinations thereof. In some embodiments, the substrate 100 includes doped regions formed with a combination of p-type dopants and n-type dopants. The various doped regions can be formed directly on and/or in the substrate 100, for example, providing a p-well structure, an n-well structure, a dual-well structure, a raised structure, or combinations thereof. An ion implantation process, a diffusion process, and/or other suitable doping process can be performed to form the various doped regions.

The substrate 100 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 100 comprises silicon germanium (SiGe) buffer layers epitaxially grown on the silicon substrate 100. The Ge concentration of the SiGe buffer layers may increase from 30 atomic % germanium for the bottom-most buffer layer to 70 atomic % germanium for the top-most buffer layer.

Still referring to FIG. 1A, stacked semiconductor layers are formed over the substrate 100. The stacked semiconductor layers include first semiconductor layers 102 and second semiconductor layers 104. As shown in FIG. 1A, the first semiconductor layers 102 and the second semiconductor layers 104 are alternately formed on the substrate 100, so as to form a stacking structure on the substrate 100. In some embodiments, the first semiconductor layers 102 and the second semiconductor layers 104 are made of different semiconductor materials, such that the first semiconductor layers 102 could have a sufficient etching selectivity with respect to the second semiconductor layers 104. From another point of view, the first semiconductor layers 102 and the second semiconductor layers 104 are made of materials having different lattice constants. In some embodiments, the material of each of the first semiconductor layers 102 and the second semiconductor layers 104 includes Si, Ge, SiGe, GeSn, SiGeSn, GaAs, InSb, GaP, GaSb, InAlAs, InGaAs, GaSbP, GaAsSb or InP. In some embodiments, the first semiconductor layers 102 are made of SiGe, whereas the second semiconductor layers 104 are made of Si. In certain embodiments, the first semiconductor layers 102 are made of $Si_{1-x}Ge_x$, where $0.15 \leq x \leq 0.5$, and second semiconductor layers 104 are made of Si. In some embodiments, $0.15 \leq x \leq 0.25$. In other embodiments, the second semiconductor layers 104 are made of $Si_{1-y}Ge_y$, where y is equal to or less than about 0.2 and x>y.

In FIG. 1A, three layers of the first semiconductor layer 102 and two layers of the second semiconductor layer 104 are disposed. However, the number of the first semiconductor layer 102 is not limited to three and the number of the second semiconductor layer 104 is not limited to three, and may be as small as 1 (each layer) and in some embodiments, 2-20 layers of each of the first and second semiconductor layers are formed. By adjusting the numbers of the stacked layers, a driving current of the semiconductor device 10 can be adjusted.

In some embodiments, the first semiconductor layers 102 and the second semiconductor layers 104 are epitaxially formed over the substrate 100. The thickness of the first semiconductor layers 102 may be equal to or smaller than that of the second semiconductor layers 104, and is in a range from about 2 nm to about 10 nm in some embodiments, and is in a range from about 3 nm to about 5 nm in other embodiments. The thickness of the second semiconductor layers 104 is in a range from about 5 nm to about 20 nm in some embodiments, and is in a range from about 7.5 nm to about 12.5 nm in other embodiments. In some embodiments, the total thickness of the first semiconductor layers 102 and the second semiconductor layers 104 is in a range from about 35 nm to about 50 nm. The thickness of each of the first and second semiconductor layers may be the same, or may vary. In some embodiments, the bottom first semiconductor layer (the closest layer to the substrate 100) is thicker than the remaining first semiconductor layers. The thickness of the bottom first semiconductor layer is in a range from about 10 nm to about 50 nm in some embodiments, or is in a range from 20 nm to 40 nm in other embodiments.

Further, still referring to FIG. 1A, mask structures 106 formed over the stacking structure. In some embodiments, the mask structures 106 are hard mask structures. In some embodiments, the mask structures 106 are arranged along a second direction Y, and extend along a first direction X intersected with the second direction Y (e.g., perpendicular to the second direction Y). In some embodiments, the material of each mask structure 106 may be selected from a group consisting of SiCN, SiN, $HfO_2$, $ZrO_2$ and the like. For instance, the material of each mask structure 106 is SiCN. A method for forming the mask structures 106 may include one or more deposition process (e.g., chemical vapor deposition (CVD) process (including low pressure CVD (LPCVD) process and plasma enhanced CVD (PECVD) process), physical vapor deposition (PVD) process, atomic layer deposition (ALD) process), a thermal oxidation, and a self-aligned multiple patterning process (e.g., a self-aligned double patterning (SADP) process or a self-aligned quadruple patterning (SAQP) process). The mask structures 106 are patterned into a mask pattern by using patterning operations including photo-lithography and etching process. Although FIG. 1A illustrated that each mask structure 106 is a single-layered structure, the disclosure is not limited thereto. In some alternative embodiments, each mask structure 106 may be a bi-layered or multi-layered structure.

Referring to FIG. 1B, a top portion of the substrate 100, the stacking structure of the first semiconductor layers 102 and the second semiconductor layers 104 are patterned into fin structures f by using the mask structures 106 as shadow masks. As shown in FIG. 1B, the fin structures f are formed to extend from the substrate 100. In those embodiments where the mask structures 106 are arranged along the second direction Y and extend along the first direction X, the formed fin structures f are also arranged along the second direction Y and extend along the first direction X. A method for patterning the top portion of the substrate 100 and the stacking structure to form the fin structures f may include an etching process, such as an anisotropic etching process. The first semiconductor layers 102 are sacrificial layers which are subsequently partially removed, and the second semiconductor layers 104 are subsequently formed into channel layers of the semiconductor device 10.

As depicted in FIG. 1B, each of the fin structures f includes the patterned top portion of the substrate (i.e., a fin substrate 100'), and the patterned stacking structure including the first semiconductor layers 102 and the second semiconductor layers 104 alternately stacked. In detail, the fin structures f have upper portions constituted by the stacked semiconductor layers (i.e., the first semiconductor layers 102 and the second semiconductor layers 104) and lower portions constituted by the fin substrates 100', which also referred to as the lower fin structures. The fin structures f define the active regions of the semiconductor device 10. In FIG. 1B, two fin structures f are arranged in the second direction Y. But the number of the fin structures is not limited to two, and may be as small as one and three or more. In some embodiments, one or more dummy fin structures are formed on both sides of the fin structures f to improve pattern fidelity in the patterning operations. In some embodiments, the two fin structures f are for different types of FETs. In other embodiments, the two fin structures f are for the same type FET.

Referring to FIG. 1C, an isolation structure 110 is formed to separate and isolate the active regions of semiconductor device 10. In other words, the fin structures f are electrically separated from each other by the isolation structure 110. In some embodiments, the isolation structure 110 is also called a shallow trench isolation (STI). In some embodiments, a dielectric material layer, such as silicon oxide, silicon nitride, silicon oxynitride (SiON), SiOCN, SiCN, fluorine-doped silicate glass (FSG), or a low-K dielectric material, is deposited over the substrate 100 along sidewalls of the fin structure f, so that the fin structures f are fully embedded in the dielectric material layer. The dielectric material layer may be deposited by LPCVD process, PECVD process, flowable CVD process, PVD process, thermal oxidation, or other techniques. An anneal operation may be performed after the formation of the dielectric material layer. Then, a planarization operation, such as a chemical mechanical polishing (CMP) method and/or an etch-back method, is performed such that the illustrated top surfaces of the mask structures 106 are exposed from the dielectric material layer. In some embodiments, during the planarization operation, the dielectric material layer is substantially leveled with the mask structures 106. Subsequently, the dielectric material layer is recessed (for example, by etching) to form the isolation structure 110 so that the upper portions of the fin structures f are exposed. In the embodiment shown in FIG. 1C, the lower fin structures (i.e., fin substrates 100') are covered by the isolation structure 110. As depicted in FIG. 1C, the illustrated top surface of the isolation structure 110 is substantially flush with the illustrated bottom surface of the bottommost first semiconductor layer 102. However, the disclosure is not limited thereto. In some alternative embodiments, the dielectric material layer is recessed until the top of each of the lower fin structures is exposed. That is to say, in such embodiments, the top surface of the isolation structure 110 is lower than the bottom surface of the bottommost first semiconductor layer 102 (and, thus, is lower than top surfaces of the fin substrates 100'). Further, in some alternative embodiments, the top surface of the isolation structure 110 is higher than the bottom surface of the bottommost first semiconductor layer 102.

In some embodiments, one or more liner layers (not shown) are formed before forming the dielectric material layer. The liner layer is made of SiN or a silicon nitride-based material (e.g., SiON, SiCN or SiOCN). In some embodiments, the liner layer has a thickness between about 1 nm and about 20 nm. In some embodiments, two liner layers are formed over the substrate 100, one of the two liner layers includes silicon oxide and has a thickness between about 0.5 nm and about 5 nm, and another one of the two liner layers includes silicon nitride and has a thickness between about 0.5 nm and about 5 nm. The liner layers may be deposited through one or more processes such as such as PVD process, CVD process, or ALD process, although any acceptable process may be utilized.

Still referring to FIG. 1C, sacrificial gate structures 120 are formed over the mask structures 106 and the isolation structure 110. An extending direction of the sacrificial gate structures 120 is intersected with an extending direction of the mask structures 106, and the sacrificial gate structures 120 cover portions of the mask structures 106 that are overlapped with the sacrificial gate structures 120. Also, since the fin structures f are formed by using the mask structures 106 as shadow masks, the sacrificial gate structures 120 cover portions of the fin structures f that are overlapped with the sacrificial gate structures 120. In detail, each sacrificial gate structure 120 is formed over portions of the corresponding fin structures f which are to be channel regions. In other words, the sacrificial gate structure 120 defines the channel region of the semiconductor device 10. In those embodiments where the fin structures f are arranged along the second direction Y and extend along the first direction X, the sacrificial gate structures 120 may be arranged along the first direction X and extend along the second direction Y.

In some embodiments, each sacrificial gate structure 120 includes a sacrificial gate dielectric layer 122 and a sacrificial gate electrode 124. In some embodiments, no sacrificial gate dielectric layer is formed. The sacrificial gate dielectric layer 122 is conformally formed over the fin structures f, the mask structures 106 and the isolation structure 110, whereas the sacrificial gate electrode 124 covers the sacrificial gate dielectric layer 122, and are formed to a height greater than a height of the mask structures 106. In some embodiments, each sacrificial gate structure 120 further includes a capping structure 126 lying on the sacrificial gate electrode 124. The capping structure 126 may include a capping layer 126*a* and a capping layer 126*b* lying above the capping layer 126*a*. In some embodiments, the capping layer 126*b* has rounded top corners. Materials of the sacrificial gate dielectric layer 122, the capping layer 126*a* and the capping layer 126*b* may respectively include silicon oxide, silicon nitride, silicon oxynitride, the like or combinations thereof, whereas a material of the sacrificial gate electrode 124 may include polysilicon.

In some embodiments, the formation of the sacrificial gate structures 120 includes sequentially forming a sacrificial gate dielectric material layer, a sacrificial gate electrode layer and capping material layers over the substrate 100, and then patterning the sacrificial gate dielectric material layer, the sacrificial gate electrode layers and the capping material layer. The sacrificial gate dielectric material layer, the sacrificial gate electrode layers are deposited using a CVD process, including LPCVD process and PECVD process, PVD process, ALD process, or other suitable process. A photo-lithography and etching process is performed to pattern the sacrificial gate dielectric material layer, the sacrificial gate electrode layer and the capping material layer to form the sacrificial gate structures 120 over the channel regions of the fin structures f. The photo-lithography process includes photoresist coating (for example, spin-on coating), soft baking, mask aligning, exposure, post-exposure baking, developing the photoresist, rinsing, drying (for example, hard baking), other suitable processes, or combinations thereof. The etching process includes dry etching, wet etching, other etching methods, or combinations thereof.

By patterning the sacrificial gate structures 120, the mask structures 106 and also the corresponding upper portions of the fin structures f with the first semiconductor layers 102 and the second semiconductor layers 104 are partially exposed on opposite sides of each sacrificial gate structure 120, thereby defining source/drain (S/D) regions, as shown in FIG. 1C. In this disclosure, a source and a drain are interchangeably used and the structures thereof are substantially the same. In FIG. 1C, two sacrificial gate structures 120 are arranged in the second direction X. But the number of the sacrificial gate structures is not limited to two, and may be as small as one and three or more. In certain embodiments, one or more dummy sacrificial gate structures are formed on both sides of the sacrificial gate structures to improve pattern fidelity.

Referring to FIG. 1D, a gate spacer layer 128 is formed on the current structure. In some embodiments, the gate spacer layer 128 is globally formed over the structure as shown in FIG. 1C. In these embodiments, the isolation structure 110, the fin structures f, the mask structures 106 and the sacrificial gate structures 120 may be conformally covered by the gate spacer layer 128. A material of the gate spacer layer 128 may include silicon oxide, silicon nitride, silicon carbide, silicon oxynitride, SiCN, silicon oxycarbide, SiOCN, the like or combinations thereof, and a method for forming the gate spacer layer 128 may include a deposition process, such as a CVD process or an ALD process. In some embodiments, the gate spacer layer 128 is deposited to a thickness in a range from about 2 nm to about 10 nm. In the embodiment shown in FIG. 1D, the gate spacer layer 128 is a single layer. However, the disclosure is not limited thereto. In some alternative embodiments, the gate spacer layer 128 includes a multi-layer structure, such as a first dielectric layer that includes silicon nitride and a second dielectric layer that includes silicon oxide.

Referring to FIG. 1E, after the gate spacer layer 128 is formed, an etching process is performed on the gate spacer layer 128. In some embodiments, the etching process is an anisotropic etching process. During the etching process, most of the gate spacer layer 128 is removed from horizontal surfaces, leaving the sidewall spacers 130 on the vertical surfaces such as the sidewalls of the sacrificial gate structures 120, the sidewalls of the exposed fin structures f and the sidewalls of the mask structures 106. That is to say, portions of the gate spacer layer 128 in the X-Y plane are removed and portions of the gate spacer layer 128 along a vertical direction Z perpendicular to the first direction X and the second direction Y remain substantially unchanged and form the sidewall spacers 130. The sidewall spacers 130 formed on the sidewalls of the sacrificial gate structures 120 are also referred to as gate spacers. As shown in FIG. 1E, the capping structure 126 (e.g., the capping layer 126*b*) is exposed from the sidewall spacers 130. In some embodiments, isotropic etching may be subsequently performed to remove portions of the sidewall spacers 130 from the mask structures 106 and the upper portions of the S/D regions of the exposed fin structures f. In some embodiments, a thickness of the sidewall spacers 130 is about 1 nm to about 10 nm.

Subsequently, still referring to FIG. 1E, the fin structures f of the S/D regions are recessed down below the top surface of the isolation structure 110 to form recesses 132. The S/D recessed process may be performed by using dry etching and/or wet etching. As shown in FIG. 1E, the sidewall spacers 130 formed on the S/D regions of the exposed fin structures f partially remain. In such embodiments, the recesses 132 are formed between the remained sidewall spacers 130. However, the disclosure is not limited thereto. In some alternative embodiments, the sidewall spacers 130 formed in the S/D regions of the exposed fin structures f are fully removed. As depicted in FIG. 1E, each of the recesses 132 includes sidewalls formed by the isolation structure 110 and a bottom surface formed by the illustrated top surface of the corresponding fin substrate 100'.

Further, during the S/D recessed process, the portions of the mask structures 106 in the S/D regions of the exposed fin structures f are also removed, while the portions of the mask structures 106 in the channel regions of the fin structures f are remained. At this stage, the end portions of the mask structures 106 under the sacrificial gate structures 120 have substantially flat faces which are flush with the sidewall spacers 130, as shown in FIG. 1E. Also, at this stage, end portions of the stacking structure of the first and second semiconductor layers 102, 104 under the sacrificial gate structures 120 have substantially flat faces which are flush with the sidewall spacers 130, as shown in FIG. 1E. However, the disclosure is not limited thereto. In some alternative embodiments, the end portions of the mask structures 106 and the end portions of the stacking structure of the first and second semiconductor layers 102, 104 are slightly etched. Further, as show in FIG. 1E, after the S/D recessed process, the first and second semiconductor layers 102, 104 and the mask structures 106 laterally penetrate through the sacrificial gate structures 120.

Referring to FIG. 1F, the first semiconductor layers 102 are laterally recessed from the second semiconductor layers 104, the sidewall spacers 130 formed on the sidewalls of the sacrificial gate structures 120 (i.e., the gate spacers) and the mask structures 106. As such, recesses 134 are formed at sidewalls of the remained portions of the fin structures f. From another point of view, the recesses 134 are formed between the second semiconductor layers 104, between the bottommost second semiconductor layers 104 and the fin substrates 100' and between the topmost second semiconductor layers 104 and the mask structures 106, such that portions (edges) of the second semiconductor layers 104 are suspended. In some embodiments, the first semiconductor layers 102 are laterally recessed from the gate spacers by a distance ranging from about 2 nm to about 10 nm. A method for lateral recessing the first semiconductor layers 102 may include an etching process, such as an isotropic etching process. By properly selecting etchants for the etching process and/or by properly selecting the materials of the first semiconductor layers 102, the second semiconductor layers 104 and the mask structures 106, the first semiconductor layers 102 can be etched without consuming the second semiconductor layers 104, the mask structures 106 and other components in the current structure. As discussed above, in some embodiments, the first semiconductor layers 102 include SiGe, the second semiconductor layers 104 include Si, the mask structures 106 includes SiCN.

In some embodiments, the first semiconductor layers 102 are laterally recessed (etched) so that edges of the first semiconductor layers 102 are located substantially below a side face of the sacrificial gate electrode 124. In some embodiments, end portions (edges) of the first semiconductor layers 102 under the sacrificial gate structure are substantially flush with the side faces of the sacrificial gate electrode 124. Here, "being substantially flush" means the difference in the relative position is less than about 1 nm. In some embodiments, during the recess etching of the first semiconductor layers 102 and/or the recess etching of the fin structures f of the S/D regions as described with FIG. 1E, end portions of the second semiconductor layers 104 are also laterally etched. The recessed amount of the first semiconductor layers 102 is greater than the recessed amount of the second semiconductor layers 104. In some embodiments, the second semiconductor layers 104 are laterally recessed from the gate spacers by a distance ranging from about 1 nm to about 4 nm, and the difference of the distance by which the first semiconductor layers 102 are laterally recessed from the gate spacers and the distance by which the second semiconductor layers 104 are laterally recessed from the gate spacers is in a range from about 1 nm to about 9 nm.

Referring to FIG. 1G, an insulating material is filled in the recesses 134 at the sidewalls of the fin structures f to form inner spacers 136. In some embodiments, as shown in FIG. 1G, exposed surfaces of the inner spacers 136 are substantially flush and coplanar with exposed surfaces of the second semiconductor layers 104, exposed surfaces of the mask structures 106 and sidewalls of the gate spacers. However, the disclosure is not limited thereto. In some alternative embodiments, the exposed surfaces of the inner spacers 136 are dented from the exposed surfaces of the second semiconductor layers 104, the exposed surfaces of the mask structures 106 and the sidewalls of the gate spacers.

The material of the insulating material for forming the inner spacers 136 may include silicon oxide, silicon nitride, silicon carbide, silicon carbide nitride, silicon oxide carbide, silicon carbide oxynitride, or other suitable dielectric materials or combinations thereof. The method for forming the inner spacers 136 may include initially forming an insulating material layer globally covering the structure shown in FIG. 1F, and then removing portions of the insulating material layer outside the recesses 134. In this way, the remained portions of the insulating material layer form the inner spacers 136. In some embodiments, the insulating material layer is formed by using a deposition process (e.g., a CVD process or an ALD process), and the portions of the insulating material layer are removed by using an etching process (e.g., an anisotropic etching process).

Referring to FIG. 1H and FIG. 2, S/D patterns 138 are formed from the recesses 132 (in FIG. 1G). The sacrificial gate structures 120 are respectively located between a pair of the S/D patterns 138, and are separated from the S/D patterns 138 by the gate spacers. In addition, the second semiconductor layers 104 and the inner spacers 136 covered by each sacrificial gate structure 120 are in lateral contact with a pair of the S/D patterns 138. In the embodiment shown in FIG. 1H and FIG. 2, the top surfaces of the S/D patterns 138 are substantially flush and coplanar with the illustrated top surfaces of the topmost second semiconductor layers 104. However, the disclosure is not limited thereto. In some alternative embodiments, the top surfaces of the S/D patterns 138 may not flush and coplanar with the illustrated top surfaces of the topmost second semiconductor layers 104. That is, the top surfaces of the S/D patterns 138 may be higher or lower than the illustrated top surfaces of the topmost second semiconductor layers 104.

The S/D patterns 138 may include a semiconductor material such as silicon (Si) or germanium (Ge); a compound semiconductor such as silicon germanium (SiGe), silicon carbide (SiC), silicon phosphide (SiP), silicon phosphide carbide (SiCP), gallium arsenide (GaAs), gallium phosphide (GaP), indium phosphide (InP), indium arsenide (InAs), indium antimonide (InSb); an alloy semiconductor such GaAsP, AlInAs, AlGaAs, InGaAs, GaInP, and/or GaInAsP; or combinations thereof. For example, the S/D patterns 138 includes one or more layers of Si, SiP, SiC and SiCP for an n-channel FET or Si, SiGe, Ge for a p-channel FET.

In some embodiments, the S/D patterns 138 are formed by an epitaxial process. In these embodiments, the S/D patterns 138 may be grown from the fin substrates 100' exposed by the recesses 132. The epitaxy process may include CVD deposition (for example, vapor-phase epitaxy (VPE), ultra-high vacuum CVD (UHV-CVD) process, LPCVD process, and/or PECVD process), molecular beam epitaxy, other suitable SEG processes, or combinations thereof. It is noted that the present disclosure is not limited to the shapes of the S/D patterns 138 shown in FIG. 1H, and the S/D patterns 138 may be actually formed as other shapes. For example, in some embodiments, the S/D patterns 138 merge above the isolation structure 110.

Still referring to FIG. 1H and FIG. 2, a liner layer 140 and an interlayer dielectric (ILD) layer 142 are formed over the substrate 100. The liner layer 140 may include any suitable dielectric material, such as SiO, SiON, SiN, SiCN, SiOC, SiOCN, and may be formed by any suitable method, such as ALD process, CVD process, PVD process, other suitable methods, or combinations thereof. The liner layer 140 functions as a contact etch stop layer (CESL) in the subsequent etching operations. As illustrated in FIG. 1H and FIG. 2, the liner layer 140 is conformally formed over the isolation structure 110. In detail, as shown in FIG. 1H and FIG. 2, the liner layer 140 is disposed along the gate spacers and covers the S/D patterns 138. In other words, the liner layer 140 has a conformal profile over the S/D patterns 138 (e.g., having about the same thickness on outer surfaces of S/D patterns 138). In some embodiments, the liner layer 140 has a thickness of about 1 nm to 10 nm. The ILD layer 142 is formed over the liner layer 140. The ILD layer 142 includes a low-k dielectric material, such as tetraethylorthosilicate (TEOS), un-doped silicate glass, or doped silicon oxide (SiO) such as borophosphosilicate glass (BPSG), fused silica glass (FSG), phosphosilicate glass (PSG), boron doped silicon glass (BSG), other suitable dielectric materials, or combinations thereof. The ILD layer 142 may include a multi-layer structure having multiple dielectric materials. The ILD layer 142 may be formed by a deposition process such as flowable CVD process, spin-on-glass (SOG), other suitable methods, or combinations thereof.

Further, still referring to FIG. 1H and FIG. 2, after the ILD layer 142 is formed, a planarization operation, such as CMP, is performed to planarize the illustrated top surface of the semiconductor device 10. As illustrated in FIG. 1H and FIG. 2, during the planarization operation, the capping structures 126 of the sacrificial gate structures 120 are removed, so that the sacrificial gate electrodes 124 are exposed.

Referring to FIG. 1I and FIG. 3, another planarization operation, such as CMP, is performed on the semiconductor device 10 to expose the mask structures 106. In detail, as illustrated in FIG. 1I and FIG. 3, during the planarization operation for exposing the mask structures 106, portions of the liner layer 140, the ILD layer 142, the sacrificial gate dielectric layers 122, the sacrificial gate electrodes 124 and the sidewall spacers 130 are remove, so that the illustrated top surfaces of the mask structures 106 are exposed. In some embodiments, as shown in FIG. 3, the dimension W1 of the mask structure 106 along the direction Y ranges from about 10 nm to about 120 nm.

Referring to FIG. 1J, FIG. 4A and FIG. 4B, the sacrificial gate dielectric layers 122 and the sacrificial gate electrodes 124 are removed, so as to form gate trenches O1 each between the corresponding sidewall spacers 130 (i.e., gate spacers). In some embodiments, the sacrificial gate electrodes 124 are removed by etching process. The etching process includes dry etching process, wet etching process, other etching methods, or combinations thereof. As shown in FIG. 1J and FIG. 4B, the first semiconductor layers 102 and the second semiconductor layers 104 previously covered by the sacrificial gate structures 120 are currently exposed in the gate trenches O1. Further, as shown in FIG. 1J, during the removing process, the sidewall spacers 130 remain substantially intact while the sacrificial gate dielectric layers 122 and the sacrificial gate electrodes 124 are totally removed. This is because the specific etching selectivity is chosen based on the material differences between the sidewall spacers 130 and the sacrificial gate electrodes 124, and between the sidewall spacers 130 and the sacrificial gate dielectric layers 112. Also, as shown in FIG. 1J, during the removing process, the mask structures 106 remain substantially intact while the sacrificial gate dielectric layers 122 and the sacrificial gate electrodes 124 are totally removed. This is because the specific etching selectivity is chosen based on the material differences between the mask structures 106 and the sacrificial gate electrodes 124, and between the mask structures 106 and the sacrificial gate dielectric layers 112. In some embodiments, for the etchant used in the removing process of the sacrificial gate electrodes 124, the etching selectivity of the material of the sidewall spacers 130 or the material of the mask structures 106 to the material of the sacrificial gate electrodes 124 is larger than about 100.

Referring to FIG. 1K, FIG. 5A and FIG. 5B, after the gate trenches O1 are formed, the first semiconductor layers 102 are removed from the gate trenches O1. As a result, surfaces of the second semiconductor layers 104 exposed and released in the gate trenches O1 function as channel regions. As such, the removal process of the first semiconductor layers 102 is also referred to as a channel release process. Form another point of view, as shown in FIG. 1K and FIG. 5B, the second semiconductor layers 104 are suspended, and the suspended second semiconductor layers 104 are collectively referred to as a nanostructure. In some embodiments, the second semiconductor layers 104 are slightly etched or not etched depending on the design of the semiconductor device 10. For example, the second semiconductor layers 104 may be slightly etched to form a wire-like shape (for nanowire transistors); the second semiconductor layers 104 may be slightly etched to form a sheet-like shape (for nanosheet transistors); or the second semiconductor layers 104 may be slightly etched to form other geometrical shape (for other nanostructure transistors). In addition, as shown in FIG. 1K and FIG. 5A, inner sidewalls of the inner spacers 136 previously covered by the first semiconductor layers 102 are currently exposed in the gate trenches O1.

In some embodiments, the first semiconductor layers 102 are removed by a selective etching process that is tuned to remove only the first semiconductor layers 102 while the second semiconductor layers 104, the inner spacers 136 and the mask structures 106 remain substantially unchanged. The selective etching may be a selective wet etching, a selective dry etching, or a combination thereof. The selective etching may be performed by properly selecting etchants for the etching process and/or properly selecting the materials of the first semiconductor layers 102, the second semiconductor layers 104, the inner spacers 136 and the mask structures 106. In some embodiments, the selective wet etching process may include a HF or $NH_4OH$ etchant. In some embodiments, the selective removal of first semiconductor layers 102 may include an oxidation process (for example, to form oxidized semiconductor layers comprising SiGeOx) followed by an oxidation removal (for example, SiGeOx removal).

In some embodiments, the exposed portions of the second semiconductor layers 104 are optionally trimmed. The trimming reduces the thicknesses of the exposed portions of the second semiconductor layers 104. For example, the trimming can reduce the thickness of the second semiconductor layers 104 by an amount in the range of about 40% to about 70%. The trimming may be performed concurrently with the channel release process, or may be performed after the channel release process is performed. For example, the exposed portions of the second semiconductor layers 104 may be trimmed by an acceptable etching process that selectively etches the material(s) of the second semiconductor layers 104 at a faster rate than the materials of other components in the current structure (e.g., the inner spacers 136, the gate spacers, and/or the mask structures 106). In some embodiments, the etching process includes a chemical oxide removal (COR) process.

Referring to FIG. 1L, FIG. 6A and FIG. 6B, gate dielectric layers 144 and gate electrodes 146 are formed in the gate trenches O1 respectively defined between adjacent gate spacers. The gate dielectric layers 144 and the gate electrodes 146 may be collectively referred as gate structures, and the previously shown sacrificial gate structures 130 may be regarded as being replaced by the gate structures. As shown in FIG. 1L, FIG. 6A and FIG. 6B, the gate dielectric layers 144 are respectively lining on the exposed surfaces of the second semiconductor layers 104, the substrate (i.e., the fin substrate 100'), the inner spacers 136, the gate spacers and the isolation structure 110 in the corresponding one of the gate trenches O1 defined between adjacent gate spacers, and the gate electrodes 146 fill the remainder space in these gate trenches O1. From another point of view, as shown in FIG. 6B, the gate dielectric layer 144 wraps around each of the suspended second semiconductor layers 104 in the channel region of the fin structure f.

The material of the gate dielectric layer 144 may include a high-k dielectric material. Examples of the high-k dielectric material may include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The material of the gate electrode 146 may include TIN, TiCN, TION, WCN, WN, TSN, TSON, TiAl, TiAlC, TiAlO, TiAlON, other suitable materials, and/or combinations thereof. In addition, the method for forming the gate dielectric layers 144 may include a deposition process, such as a CVD process or an ALD process, whereas a method for forming the gate electrodes 146 may include a deposition process (e.g., a CVD process or an ALD process), a plating process (e.g., an electrical plating process or an electroless plating process) or a combination thereof. In some embodiments, the thickness of the gate dielectric layer 144 ranges from about 5 nm to about 15 nm. In some embodiments, a planarization process is optionally performed to remove the extra parts of the gate dielectric layers 144 and the gate electrodes 146.

In some embodiments, one or more work function layer (not shown) is formed between each gate dielectric layer 144 and the overlying gate electrode 146. In addition, in some embodiments, interfacial layers (not shown) may be formed on the exposed surfaces of the second semiconductor layers 104 before forming the gate dielectric layers 144. Those skilled in the art may select proper materials and formation methods for the work function layers and the interfacial layers according to process requirements, the present disclosure is not limited thereto.

Referring to FIG. 1M, FIG. 7A and FIG. 7B, a pulling back process is performed to expose a top portion **106*a* of each mask structure 106. In detail, as shown in FIG. 1M, FIG. 7A and FIG. 7B, during the pulling back process, portions of the sidewall spacers 130, the liner layer 140, the ILD layer 142, the gate dielectric layers 144 and the gate electrodes 146 are removed, while the top portions 106*a* of the mask structures 106 remain substantially unchanged. That is, the pulling back process may include a selective etching process. The selective etching process may be a selective dry etching process, a selective wet etching process, or a combination thereof. The selective etching process may be performed by properly selecting etchants for the etching process and/or properly selecting the materials of the mask structures 106, the sidewall spacers 130, the liner layer 140, the ILD layer 142, the gate dielectric layers 144 and the gate electrodes 146**. In some embodiments, the selective dry etching process may include $NF_3$ or $NH_3$ etchant.

Further, as shown in FIG. 1M, FIG. 7A and FIG. 7B, the top portion **106*a* of each mask structure 106 protrudes from the illustrated top surfaces of the sidewall spacers 130, the liner layer 140, the ILD layer 142, the gate dielectric layers 144 and the gate electrodes 146 along the vertical direction Z. That is to say, the illustrated top surface of the top portion 106*a* is located at higher height level than the illustrated top surfaces of the sidewall spacers 130, the liner layer 140, the ILD layer 142, the gate dielectric layers 144 and the gate electrodes 146. In other words, the top of the dielectric wall material 110 is located at higher height level than the top of each of the fin structures f. Further, as shown in FIG. 7A and FIG. 7B, after the pulling back process, a bottom portion 106*b* of each mask structure 106 is still surrounded by the liner layer 140 and the ILD layer 142. In some embodiments, the thickness t1 of the bottom portion 106*b* of each mask structure 106** along the vertical direction Z is in a range from about 3 nm to about 15 nm.

Referring to FIG. 1N, FIG. 8A and FIG. 8B, sidewall spacers 150 are formed on sidewalls of the top portions **106*a* of the mask structures 106. In some embodiments, the method for forming the sidewall spacers 150 may include the following steps. Initially, a deposition process is performed to form a spacer layer (not shown) globally covering the structure shown in FIG. 1M. In various examples, the deposition process of the spacer layer includes a CVD process (such as PECVD process, sub-atmospheric CVD (SACVD) process, or flowable CVD process), an ALD process, or other suitable deposition process. Afterwards, an etching process is performed on the spacer layer to form the sidewall spacers 150. In some embodiments, the etching process is an anisotropic etching process. During the etching process, most of the spacer layer is removed from horizontal surfaces, leaving the sidewall spacers 150 on the vertical surfaces (i.e., the sidewalls of the top portions 106***a*). That is to say, portions of the spacer layer in the X-Y plane are removed and portions of the spacer layer along the vertical direction Z remain substantially unchanged and form the sidewall spacers 150.

Referring to FIG. 1O, FIG. 9A and FIG. 9B, a contact sacrificial layer 152 is formed over the sidewall spacers 130, the liner layer 140, the ILD layer 142, the gate dielectric layers 144 and the gate electrodes 146 and surrounding the top portions 106*a*. In some embodiments, the method for forming the contact sacrificial layer 152 may include the following steps. Initially, a deposition process is performed to form the contact sacrificial layer 152 over the substrate 100. In various examples, the deposition process of the contact sacrificial layer 152 includes a PVD process, a CVD process (such as PECVD process, or sub-atmospheric CVD (SACVD) process), an ALD process, or other suitable deposition process. The material of the contact sacrificial layer 152 may include poly-silicon, amorphous silicon or a combination thereof. Afterwards, a planarization operation, such as CMP, is performed to planarize the illustrated top surface of the semiconductor device 10. In detail, as illustrated in FIG. 1O, FIG. 9A and FIG. 9B, after the planarization operation, the illustrated top surface of the contact sacrificial layer 152, the illustrated top surfaces of the sidewall spacers 150 and the illustrated top surfaces of the top portions 106*a* are substantially flush and coplanar with each other. Further, as illustrated in FIG. 1N, FIG. 8A and FIG. 8B, FIG. 1O, FIG. 9A and FIG. 9B, during the planarization operation, the end portions of the contact sacrificial layer 152, the sidewall spacers 150 and the top portions 106*a* are slightly removed.

Referring to FIG. 1P, FIG. 10A and FIG. 10B, mask structures 160 are formed over the contact sacrificial layer 152. In some embodiments, the mask structures 160 are hard mask structure. In some embodiments, the mask structures 160 are arranged along the second direction Y, and extend along the first direction X. In addition, in some embodiments, each mask structure 160 includes a first mask layer 160*a* and a second mask layer 160*b* formed over the first mask layer 160*a*. The method for forming the mask structures 160 may include one or more deposition process (e.g., CVD process (including LPCVD process and PECVD process), PVD process, ALD process), a thermal oxidation, and a self-aligned multiple patterning process (e.g., a SADP process or a SAQP process). In some embodiments, the pad oxide layer 160*a* is made of a silicon oxide, which can be formed by a thermal oxidation; and the pad nitride layer 160*b* is made of a silicon nitride, silicon oxynitride and/or silicon carbide, which is formed by CVD process, including LPCVD process and PECVD process, PVD process, ALD process, or other suitable process. The mask structures 160 are patterned into a mask pattern by using patterning operations including photo-lithography and etching process. In some embodiments, the photo-lithography process may include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof.

As shown in FIG. 1P and FIG. 10B, the sidewall of the mask structure 160 along the first direction X is substantially flush or aligned with the corresponding sidewall of the mask structure 106 along the first direction X. From another point of view, portions of the sidewall spacer 150 along the first direction X are not covered by the corresponding mask structure 160. Further, as shown in FIG. 1P, FIG. 10A and FIG. 10B, the vertical projection of the mask structure 106 onto the substrate 100 is located within the span of the vertical projection of the corresponding mask structure 160 onto the substrate 100. That is to say, the sidewalls of the mask structure 106 all overlap with the corresponding mask structure 160 along the vertical direction Z. From another point of view, as shown in FIG. 1P, the mask structure 160 overlaps with two mask structures 106 arranged along the first direction X.

Referring to FIG. 1Q, FIG. 11A, FIG. 11B and FIG. 11C, the contact sacrificial layer 152 is patterned into contact sacrificial patterns 154 by using the mask structures 160 as shadow masks. As shown in FIG. 1Q, since the mask structure 160 extends along the first direction X, and the corresponding mask structures 106 are covered by the mask structure 160, the contact sacrificial patterns 154 are formed to be alternately arranged with the corresponding mask structures 106 along the first direction X. The method for patterning the contact sacrificial layer 152 to form the contact sacrificial patterns 154 may include an etching process, such as an anisotropic etching process. In such embodiments, the mask structures 160 used as etching masks. In detail, as shown in FIG. 1Q, FIG. 11A, FIG. 11B and FIG. 11C, during the patterning process, the sidewall spacers 150 remain substantially intact while the contact sacrificial layer 152 is patterned. This is because the specific etching selectivity is chosen based on the material differences between the sidewall spacers 150 and the contact sacrificial layer 152. To be more specific, since the sidewall spacers 150 have the different etch selectivity from the contact sacrificial layer 152, during the patterning process (e.g., etching process) for forming the contact sacrificial patterns 154, the sidewall spacers 150 are used as self-aligned masks. That is, the patterning process (e.g., etching process) for forming the contact sacrificial patterns 154 is referred to as a self-aligned etching process. From another point of view, since the portions of the sidewall spacer 150 along the first direction X are not covered by the corresponding mask structure 160, after the self-aligned etching process for forming the contact sacrificial patterns 154, the portions of the sidewall spacer 150 along the first direction X are exposed.

Further, it is noted that the contact sacrificial patterns 154 are formed to correspond the intended locations of the subsequently formed contacts (e.g., contacts 190 shown in FIG. 15A, FIG. 15C and FIG. 15D). As such, during the patterning process for forming the contact sacrificial patterns 154, the mask structures 160 used as shadow masks cover the intended locations of the subsequently formed contacts.

Referring to FIG. 1R, FIG. 12A, FIG. 12B and FIG. 12C, sidewall spacers 170 are formed on sidewalls of the contact sacrificial patterns 154, sidewalls of the mask structures 160 and side surfaces of the exposed portions of the sidewall spacers 150 along the first direction X. In some embodiments, the method for forming the sidewall spacers 170 may include the following steps. Initially, a deposition process is performed to form a spacer layer (not shown) globally covering the structure shown in FIG. 1Q. In various examples, the deposition process of the spacer layer includes a CVD process (such as PECVD process, sub-atmospheric CVD (SACVD) process, or flowable CVD process), an ALD process, or other suitable deposition process. Afterwards, an etching process is performed on the spacer layer to form the sidewall spacers 170. In some embodiments, the etching process is an anisotropic etching process. During the etching process, most of the spacer layer is removed from horizontal surfaces, leaving the sidewall spacers 170 on the vertical surfaces (i.e., the sidewalls of the contact sacrificial patterns 154, the sidewalls of the mask structures 160 and the side surfaces of the exposed portions of the sidewall spacers 150 along the first direction X). That is to say, portions of the spacer layer in the X-Y plane are removed and portions of the spacer layer along the vertical direction Z remain substantially unchanged and form the sidewall spacers 170.

Referring to FIG. 1S, FIG. 13A, FIG. 13B and FIG. 13C, an etching process is performed to form trenches TR into the current structure by using the sidewall spacers 170 as shadow masks. As shown in FIG. 1S, since the mask structures 160 are arranged along the second direction Y and extend along the first direction X, and the sidewall spacers 170 are formed on the sidewalls of the mask structures 160 along the first direction X, the formed trenches TR are also arranged along the second direction Y and extend along the first direction X. In some embodiments, the etching process for forming the trenches TR is an anisotropic etching process.

In detail, as shown in FIG. 1R, FIG. 12B, FIG. 1S and FIG. 13B, the trench TR continuously extends across adjacent gate structures (each including the gate dielectric layer 144 and the gate electrode 146) along the first direction X to cut each of the gate structures into separate sections. That is, the gate structures intersected with the trenches TR are segmented by the trenches TR. Further, as show in FIG. 1R, FIG. 12C, FIG. 1S and FIG. 13C, along with segmentation of the gate structures, the sidewall spacers 130, the liner layer 140, the ILD layer 142 and the S/D patterns 138 are also cut by the trench TR as well. To be more specific, as shown in FIG. 1S, FIG. 13A, FIG. 13B and FIG. 13C, during the etching process for forming the trenches TR, the sidewall spacers 170 remain substantially intact while the structure underlying the sidewall spacers 170 (e.g., including the sidewall spacers 130, the liner layer 140, the ILD layer 142, the gate dielectric layers 144, the gate electrodes 146 and the S/D patterns 138) is etched. This is because the specific etching selectivity is chosen based on the material differences between the sidewall spacers 170 and the sidewall spacers 130, between the sidewall spacers 170 and the liner layer 140, between the sidewall spacers 170 and the ILD layer 142, between the sidewall spacers 170 and the gate dielectric layers 144, between the sidewall spacers 170 and the gate electrodes 146, and between the sidewall spacers 170 and the S/D patterns 138. As such, the said etching process using the sidewall spacers 170 as shadow masks is considered a self-aligned cut-metal gate (CMG) etching process. That is, the sidewall spacers 170 are used as self-aligned masks. Accordingly, due to the self-aligned CMG etching process is performed, the process window of the gate structures can be enlarged, the parasitic capacitance can be reduced and the gate length scaling can be permitted. In some embodiments, the distance d1 between the gate dielectric layer 144 wrapping around the second semiconductor layer 104 and the exposed sidewall of the separated gate structure ranges from about 5 nm to about 20 nm. In detail, as shown in FIG. 13B, the distance d1 is defined by the sidewall spacer 170, and the distance d1 is tuned by selecting the thicknesses of the sidewall spacer 170 and the sidewall spacer 150.

Referring to FIG. 1T, FIG. 14A, FIG. 14B and FIG. 14C, a dielectric layer 180 is formed in the trenches TR. The dielectric layer 180 includes a low-k dielectric material, such as TEOS, un-doped silicate glass, or doped silicon oxide (SiO) such as BPSG, FSG, PSG, BSG, other suitable dielectric materials, or combinations thereof. The dielectric layer 180 may include a multi-layer structure having multiple dielectric materials. The dielectric layer 180 may be formed by a deposition process such as flowable CVD process, SOG, other suitable methods, or combinations thereof.

Further, still referring to FIG. 1T, FIG. 14A, FIG. 14B and FIG. 14C, after the dielectric layer 180 is formed, a planarization operation, such as CMP, is performed to planarize the illustrated top surface of the semiconductor device 10. As illustrated in FIG. 1T, FIG. 14A, FIG. 14B and FIG. 14C, during the planarization operation, the mask structures 160 and portions of the sidewall spacers 170 located on the sidewalls of the mask structures 160 are removed, so that the contact sacrificial patterns 154, the sidewall spacers 170, the sidewall spacers 150 and the top portions 106*a* of the mask structures 106 are exposed.

Continued referring to FIG. 1T, FIG. 14A, FIG. 14B and FIG. 14C, the exposed contact sacrificial patterns 154 are removed to form openings O2. In some embodiments, the contact sacrificial patterns 154 are removed by etching process. The etching process includes dry etching process, wet etching process, other etching methods, or combinations thereof. As shown in FIG. 1T, FIG. 14A and FIG. 14C, the liner layer 140 previously covered by the contact sacrificial patterns 154 is currently exposed in the openings O2. Further, as shown in FIG. 1T, FIG. 14A and FIG. 14C, during the removing process, the sidewall spacers 150 and the sidewall spacers 170 remain substantially intact while the contact sacrificial patterns 154 are totally removed. This is because the specific etching selectivity is chosen based on the material differences between the sidewall spacers 150 and the contact sacrificial patterns 154, and between the sidewall spacers 170 and the contact sacrificial patterns 154. Further, it is noted that since the contact sacrificial patterns 154 are formed to correspond the intended locations of the subsequently formed contacts (e.g., contacts 190 shown in FIG. 15A, FIG. 15C and FIG. 15D), the formed openings O2 also correspond the intended locations of the said contacts.

Figure 15A:
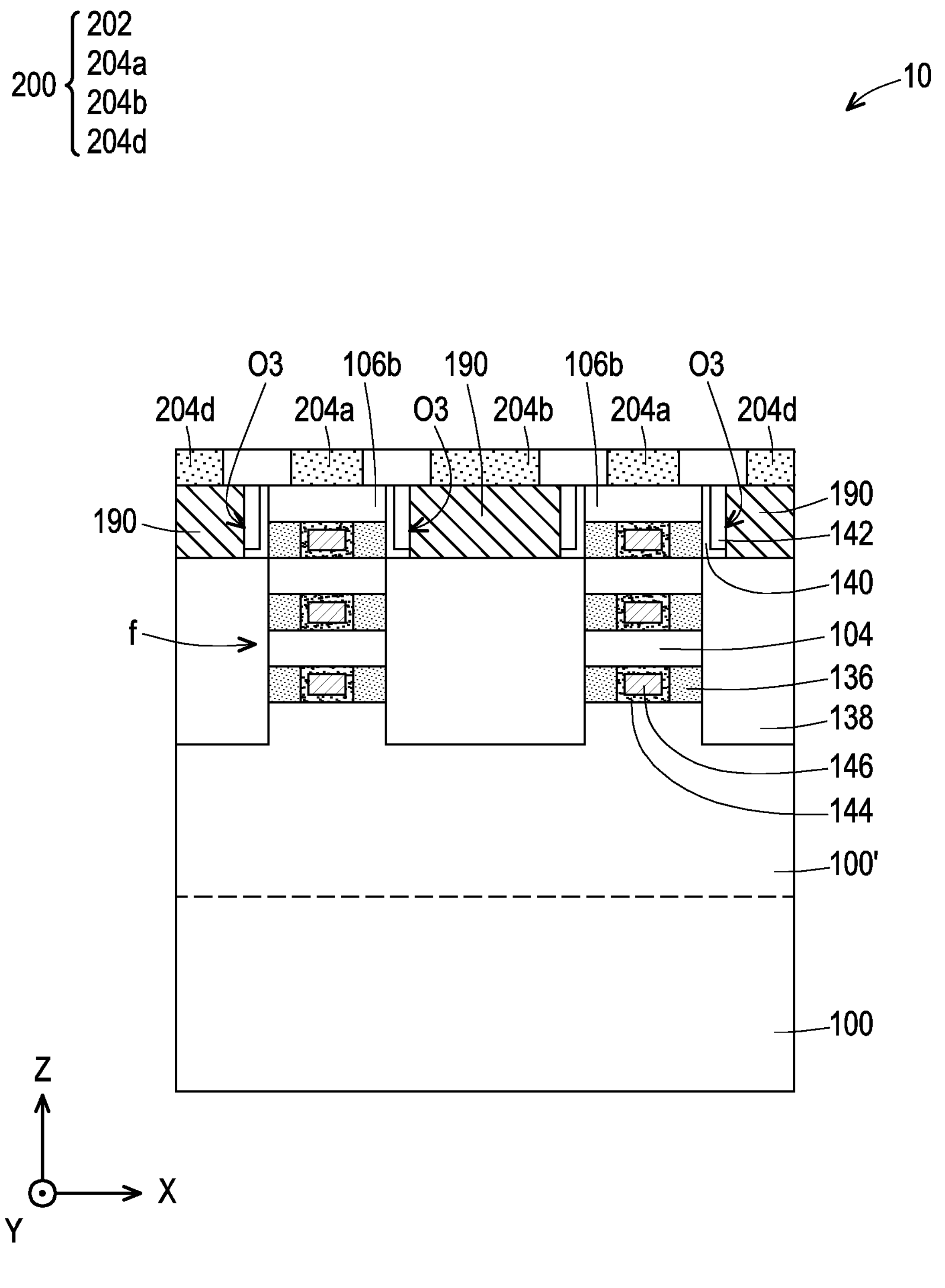
FIG. 15A, FIG. 15B, FIG. 15C and FIG. 15D respectively are schematic cross-sectional views along line A-A', line B-B', line C-C' and line D-D' shown in FIG. 1U.
Figure 15B:
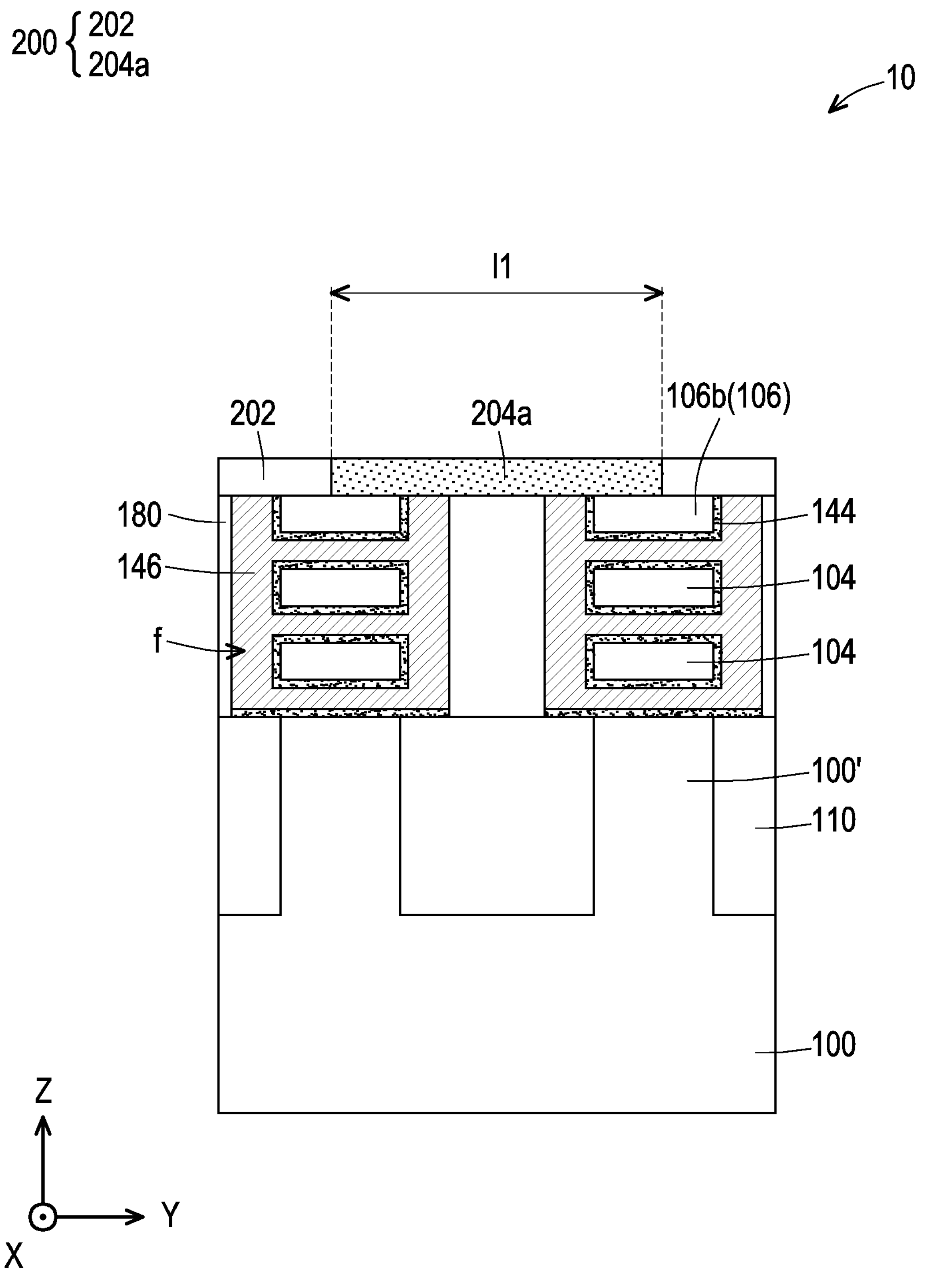
Figure 15C:
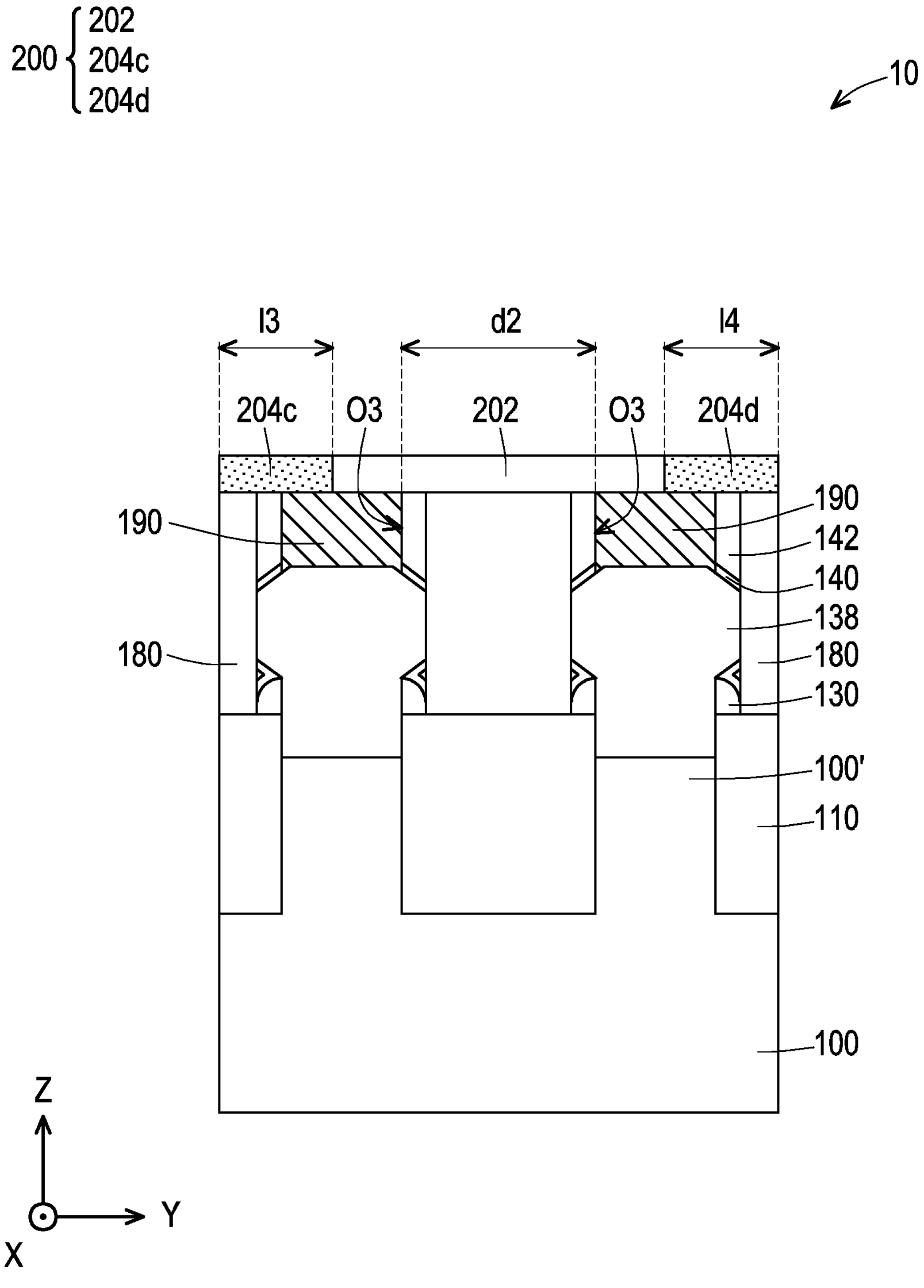
Figure 15D:
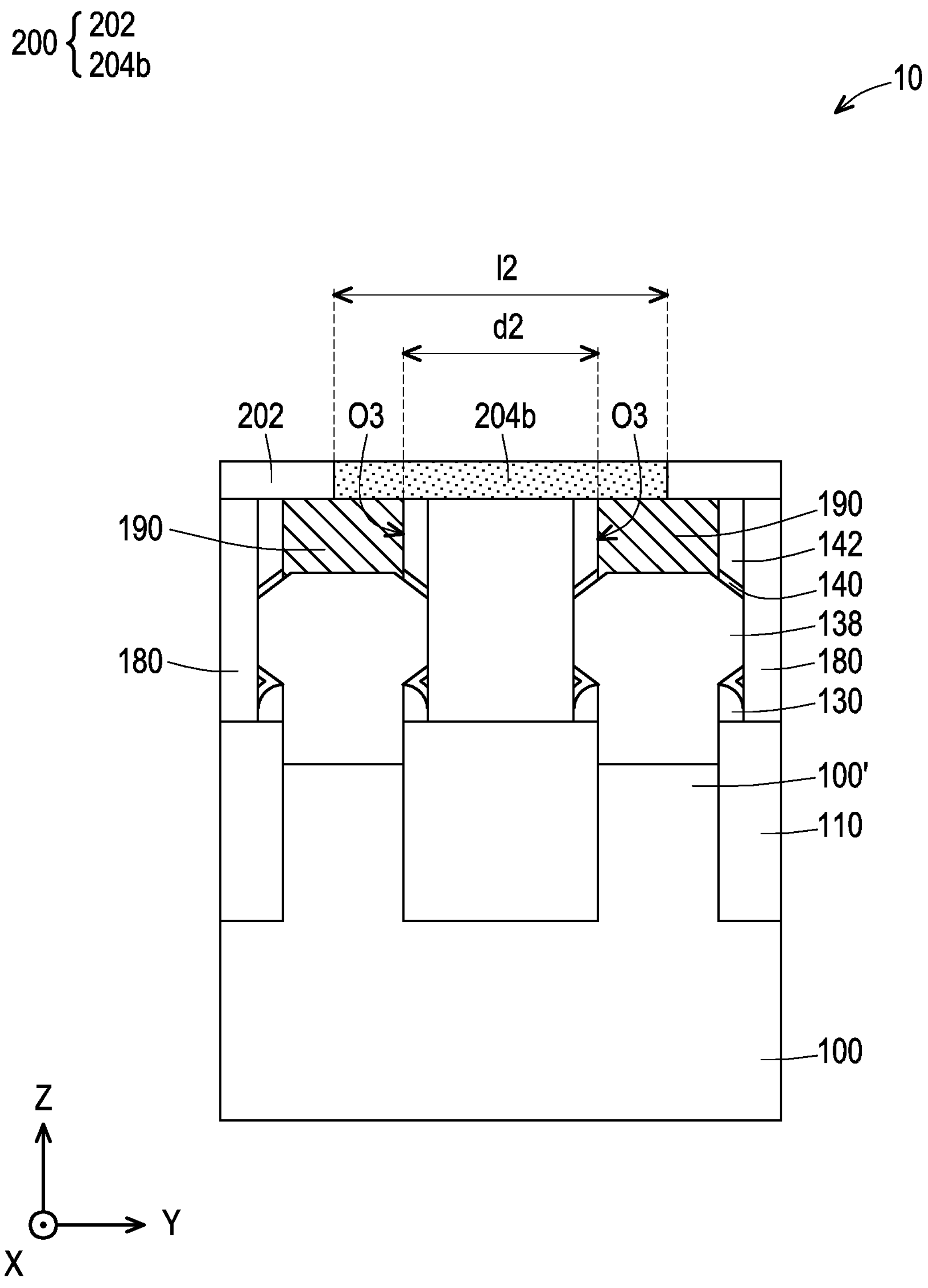

Referring to FIG. 1U, FIG. 15A, FIG. 15B, FIG. 15C and FIG. 15D, contacts 190 are formed to contact the S/D patterns 138. That is, the contacts 190 are referred to as S/D contacts. In some embodiments, the method for forming the contacts 190 may include the following steps. Initially, portions of the ILD layer 142 and the liner layer 140 are removed through the openings O2 to form contact openings O3 which expose the S/D patterns 138. In detail, the formed contact opening O3 is communicated with the corresponding opening O2. In some embodiments, the portions of the ILD layer 142 and the liner layer 140 are removed by etching process. The etching process includes dry etching process, wet etching process, other etching methods, or combinations thereof. Then, a conductive material is filled in the contact openings O3, and a planarization operation, such as CMP, may be performed to remove any excess conductive material to form the contacts 190. The conductive material may include metal. Further, as illustrated in FIG. 1U, FIG. 15A, FIG. 15B. FIG. 15C and FIG. 15D, during the planarization operation, the top portions 106*a* of the mask structures 106, the sidewall spacers 150, the sidewall spacers 170 and portions of the dielectric layer 180 are removed, so that the gate structures, the bottom portions 106*b* of the mask structures 106 and contacts 190 are exposed. Also, as FIG. 15A and FIG. 15B, the exposed top surfaces of the bottom portions 106*b* are substantially flush and coplanar with the exposed top surfaces of the gate structures; the exposed top surfaces of the bottom portions 106*b* are substantially flush and coplanar with the exposed top surfaces of the contacts 190; and the exposed top surfaces of the bottom portions 106*b* are substantially flush and coplanar with the exposed top surface of the dielectric layer 180.

It is noted that due to the self-aligned formed contact sacrificial patterns 154, the contacts 190 formed in the contact openings O3 that are formed through the opening O2 originated from the contact sacrificial patterns 154 are self-aligned formed. As such, the process window of the contacts 190 can be enlarged, and the contacted poly pitch (CPP) scaling can be permitted. In detail, as shown in FIG. 14A and FIG. 15A, the dimension of each contact 190 along the first direction X is defined by the sidewall spacers 150 used as self-aligned masks, and thus the thickness of each sidewall spacer 150 is selected depending on the desired dimension of the contacts 190. Further, as shown in FIG. 15A, FIG. 15C and FIG. 15D, the contact 190 is located right above the corresponding the S/D pattern 138, and thus the parasitic capacitance can be reduced. Form another point of view, as shown in FIG. 15A, FIG. 15C and FIG. 15D, the contact 190 is not in contact with the side surface of the corresponding the S/D pattern 138. In some embodiments, the distance d2 between the two adjacent contacts 190 along the second direction Y ranges from about 30 nm to about 60 nm.

Continued referring to FIG. 1U, FIG. 15A, FIG. 15B, FIG. 15C and FIG. 15D, after the contacts 190 are formed, an interconnect structure 200 is formed over the substrate 100. Up to here, the semiconductor device 10 is finished. In some embodiments, as shown in FIG. 1U, FIG. 15A, FIG. 15B, FIG. 15C and FIG. 15D, the interconnect structure 200 includes a dielectric layer 202 and conductive patterns 204*a*-204*d* formed in the dielectric layer 202. In some embodiments, the thickness of the dielectric layer 202 or each of the conductive patterns 204*a*-204*d* along the vertical direction Z ranges from about 10 nm to about 20 nm. In detail, as shown in FIG. 1U and FIG. 15B, the conductive pattern 204*a* extends along the second direction Y, and the conductive pattern 204*a* is in physical and electrical contact with the two adjacent gate structures along the second direction Y. In some embodiments, the length 11 of the conductive pattern 204*a* along the second direction Y ranges from about 30 nm to about 150 nm. And, as shown in FIG. 1U and FIG. 15D, the conductive pattern 204*b* extends along the second direction Y, and the conductive pattern 204*b* is in physical and electrical contact with the two adjacent contacts 190 along the second direction Y. In some embodiments, the length 12 of the conductive pattern 204*b* along the second direction Y ranges from about 30 nm to about 150 nm. In some embodiments, the two adjacent contacts 190 in physical and electrical contact with the conductive pattern 204*b* are drain contacts. Further, as shown in FIG. 1U and FIG. 15C, the conductive pattern 204*c* and the conductive pattern 204*d* are arranged along the second direction Y, each of the conductive pattern 204*c* and the conductive pattern 204*d* extends along the second direction Y, and the conductive pattern 204*c* and the conductive pattern 204*d* respectively are in physical and electrical contact with the two adjacent contacts 190 along the second direction Y. In some embodiments, the length 13 of the conductive pattern 204*c* along the second direction Y ranges from about 20 nm to about 100 nm, and the length 14 of the conductive pattern 204*d* along the second direction Y ranges from about 20 nm to about 100 nm. In some embodiments, the contact 190 in physical and electrical contact with the conductive pattern 204*c* and the contact 190 in physical and electrical contact with the conductive pattern 204*d* are source contacts.

In some embodiments, the formation of the interconnect structure 200 includes first forming the dielectric layer 202 globally over the contacts 190. The dielectric layer 202 may be formed by spin-on coating, a CVD process (such as PECVD process), or the like. After forming the dielectric layer 202, the conductive patterns 204*a*-204*d* are formed in the dielectric layer 202. In some embodiments, a plurality of openings (not shown) are formed in the dielectric layer 202, and the conductive patterns 204*a*-204*d* are formed in the openings. In some embodiments, the conductive patterns 204*a*-204*d* are formed by a single damascene process or any other suitable process. In some embodiments, the conductive patterns 204*a*-204*d* may each include a diffusion barrier layer and a conductive material thereon. The diffusion barrier layer may include one or more layers of TaN, Ta, TiN, Ti, CoW, or the like and be formed by an ALD process, or the like, and the conductive material may include copper, aluminum, tungsten, silver, combinations thereof, or the like and be formed by a CVD process, a PVD process, a plating process, or the like.

As above, by remaining the mask structures 106 in the channel regions of the fin structures f and rendering the top portions 106*a* of the mask structures 106 protruding from the illustrated top surfaces of the sidewall spacers 130, the liner layer 140, the ILD layer 142, the gate dielectric layers 144 and the gate electrodes 146 along the vertical direction Z, in the manufacturing method of the semiconductor device 10, the self-aligned CMG etching process can be performed and the self-aligned formed S/D contacts (i.e., contacts 190) can be formed. Therefore, the gate length scaling and CCP scaling can be permitted.

In accordance with an embodiment, a semiconductor device is provided. The semiconductor device includes channel layers stacked vertically apart along a first direction over a substrate; a mask structure disposed over and apart from the channel layers along the first direction; a gate structure laterally extending along a second direction perpendicular to the first direction disposed, wherein the gate structure wraps around the channel layers and laterally surround the mask structure; and a source/drain pattern in contact with the channel layers.

In accordance with an embodiment, a semiconductor device is provided. The semiconductor device includes first channel layers stacked along a vertical direction over a substrate, extending along a first lateral direction; second channel layers stacked along the vertical direction over the substrate, extending along the first lateral direction; a dielectric layer disposed over the substrate; first and second gate structures, separately arranged along a second lateral direction by the dielectric layer, and respectively extending along the second lateral direction, the second lateral direction perpendicular to the first lateral direction, wherein the first gate structure wraps around the first channel layers, and the second gate structure wraps around the second channel layers; a first source/drain pattern in contact with the first channel layers; a second source/drain pattern in contact with the second channel layers; and mask structures respectively disposed over and apart from the first channel layers and the second channel layers, and embedded in the first gate structure and the second gate structure.

In accordance with an embodiment, a method for manufacturing a semiconductor device is provided. The method includes forming a fin structure extend along a first direction using a first mask structure as a shadow mask, wherein the fin structure includes first semiconductor layers and second semiconductor layers alternately stacked; forming a sacrificial gate structure extend along a second direction perpendicular to the first direction over the first mask structure; forming gate spacers on the sacrificial gate structure; forming source/drain patterns over source/drain regions of the fin structure; removing the sacrificial gate structure and the first semiconductor layers; forming a gate structure to wrap around the second semiconductor layers; performing a pulling back process to expose a top portion of the first mask structure; forming a first sidewall spacer on sidewalls of the top portion of the first mask structure; forming a contact sacrificial layer surrounding the top portion of the first mask structure; and patterning the contact sacrificial layer using a second mask structure as a shadow mask to form contact sacrificial patterns, wherein the second mask structure extends along the first direction and across the first mask structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:

channel layers stacked vertically apart along a first direction over a substrate;

a mask structure disposed over and apart from the channel layers along the first direction;

a gate structure laterally extending along a second direction perpendicular to the first direction, wherein the gate structure wraps around the channel layers and laterally surround the mask structure; and a source/drain feature in contact with the channel layers, wherein a bottom surface of the mask structure is located at a level higher than a top surface of the source/drain feature.

2. The semiconductor device of claim 1, wherein a top surface of the mask structure is coplanar with a top surface of the gate structure.

3. The semiconductor device of claim 1, further comprising a contact located right above and in contact with the source/drain feature.

4. The semiconductor device of claim 3, wherein the contact is in contact with the top surface of the source/drain feature without being contact with a side surface of the source/drain feature.

5. The semiconductor device of claim 3, wherein a top surface of the mask structure is coplanar with a top surface of the contact.

6. The semiconductor device of claim 1, further comprising a dielectric layer disposed over the substrate and in contact with the gate structure and the source/drain feature.

7. A semiconductor device, comprising:

first channel layers stacked along a vertical direction over a substrate, extending along a first lateral direction;

second channel layers stacked along the vertical direction over the substrate, extending along the first lateral direction;

a dielectric layer disposed over the substrate;

first and second gate structures, separately arranged along a second lateral direction by the dielectric layer, and respectively extending along the second lateral direction, the second lateral direction perpendicular to the first lateral direction, wherein the first gate structure wraps around the first channel layers, and the second gate structure wraps around the second channel layers;

a first source/drain feature in contact with the first channel layers;

a second source/drain feature in contact with the second channel layers;

mask structures respectively disposed over and apart from the first channel layers and the second channel layers, and embedded in the first gate structure and the second gate structure; and an interconnect structure disposed over the dielectric layer and comprising a conductive feature, wherein the conductive feature is in contact with top surfaces of the mask structures.

8. The semiconductor device of claim 7, wherein the first source/drain feature and the second source/drain feature are laterally separated from each other by the dielectric layer.

9. The semiconductor device of claim 7, further comprising contacts respectively located right above and in contact with the first source/drain feature and the second source/drain feature.

10. The semiconductor device of claim 9, wherein the dielectric layer is located between the contacts.

11. The semiconductor device of claim 9, wherein a top surface of the mask structure is coplanar with a top surface of the contact.

12. The semiconductor device of claim 7, wherein the mask structures respectively are separated apart from a topmost first channel layer of the first channel layers and a topmost second channel layer of the second channel layers by the first gate structure and the second gate structure.

13. The semiconductor device of claim 7, wherein top surfaces of the mask structures are coplanar with a top surface of the first gate structure and a top surface of the second gate structure.

14. A semiconductor device, comprising:

channel layers stacked along a first direction;

a mask structure disposed over and apart from the channel layers along the first direction;

a gate structure laterally extending along a second direction perpendicular to the first direction, wherein the gate structure wraps around the channel layers and laterally surround the mask structure; and a source/drain feature adjoining the channel layers along the third direction, wherein the mask structure comprises a first portion in contact with a portion of the gate structure under the mask structure, and a top surface of the first portion is located at a level higher than a top surface of the source/drain feature.

15. The semiconductor device of claim 14, wherein the top surface of the first portion is coplanar with a top surface of the gate structure.

16. The semiconductor device of claim 14, further comprising a contact located right above and in contact with the source/drain feature.

17. The semiconductor device of claim 16, wherein the contact is in contact with the top surface of the source/drain feature without being contact with a side surface of the source/drain feature.

18. The semiconductor device of claim 16, wherein the top surface of the first portion is coplanar with a top surface of the contact.

19. The semiconductor device of claim 14, further comprising a dielectric layer in contact with the gate structure and the source/drain feature.

20. The semiconductor device of claim 19, wherein top surface of the first portion is coplanar with a top surface of the dielectric layer.

* * * * *